(12) United States Patent
Kwok

(10) Patent No.: US 11,095,010 B2
(45) Date of Patent: Aug. 17, 2021

(54) BANDPASS FILTER WITH INDUCED TRANSMISSION ZEROS

(71) Applicant: Teledyne Defense Electronics, LLC, Thousand Oaks, CA (US)

(72) Inventor: Ray Kwok, San Jose, CA (US)

(73) Assignee: TELEDYNE DEFENSE ELECTRONICS, LLC, Thousand Oaks, CA (US)

( * ) Notice: Subject to any disclaimer, the term of this patent is extended or adjusted under 35 U.S.C. 154(b) by 0 days.

(21) Appl. No.: 16/701,777

(22) Filed: Dec. 3, 2019

(65) Prior Publication Data

US 2020/0176843 A1    Jun. 4, 2020

Related U.S. Application Data

(60) Provisional application No. 62/774,607, filed on Dec. 3, 2018.

(51) Int. Cl.
| | | |
|---|---|---|
| *H01P 1/203* | (2006.01) | |
| *H01P 3/08* | (2006.01) | |
| *H03H 7/01* | (2006.01) | |

(52) U.S. Cl.
CPC .......... *H01P 1/20336* (2013.01); *H01P 1/203* (2013.01); *H01P 3/08* (2013.01); *H03H 7/0115* (2013.01); *H03H 7/0161* (2013.01); *H03H 7/1758* (2013.01); *H03H 2007/013* (2013.01)

(58) Field of Classification Search
CPC ........ H01P 1/203; H01P 3/08; H01P 1/20336; H03H 2007/013; H03H 5/003
USPC ................................. 333/175, 203, 204, 205
See application file for complete search history.

(56) References Cited

U.S. PATENT DOCUMENTS

| | | | | |
|---|---|---|---|---|
| 4,795,992 A | * | 1/1989 | Saito ..................... | H01P 1/2053 333/202 |
| 7,499,810 B1 | * | 3/2009 | Walker ................. | G01N 27/023 702/182 |
| 9,515,362 B2 | * | 12/2016 | Tamiazzo ............ | H01P 1/20309 |
| 2005/0068051 A1 | * | 3/2005 | Tesdahl ................ | G01R 31/312 324/754.28 |

* cited by examiner

*Primary Examiner* — Rakesh B Patel
(74) *Attorney, Agent, or Firm* — K&L Gates LLP

(57) ABSTRACT

A filter circuit may include a transmission line, a quarter wave resonator, and an electrical component coupled in series with the quarter wave resonator at a first end and to the transmission line at a second end. The electrical component may be have a frequency dependent impedance. The electrical component may be an inductor, a capacitor, or an inductor in series with a capacitor. In another aspect, a filter circuit may include a transmission line, a first quarter wave resonator coupled to a first electrical component and a second quarter wave resonator coupled to a second electrical component. Each of the first and second electrical components may be coupled to the transmission line in parallel with each other. The first and the second electrical components may have a frequency dependent impedance. The first electrical component may be the same as or different from the second electrical component.

14 Claims, 58 Drawing Sheets

BANDPASS FILTER WITH INDUCED TRANSMISSION ZEROS

CLAIM OF PRIORITY

The present regular application, under 35 U.S.C. § 119(e), claims benefit of and priority to U.S. provisional patent application No. 62/774,607, filed Dec. 3, 2018, which is incorporated herein by reference in its entirety and for all purposes.

TECHNICAL FIELD

The present disclosure relates generally to circuits and techniques for inducing transmission zeros in bandpass filters. In one particular aspect, the present disclosure relates to circuits and techniques for inducing transmission zeros in bandpass filters by adding inductance or capacitance or both to quarter-wave resonators. The disclosed circuits and techniques provide filters with superb performance. Such filters are smaller, lighter, less complex, lower cost, and capable of faster production. Additionally, such filters provide lower insertion loss, higher rejection, and can be realized by a simpler design process.

BACKGROUND

Transmission zeros or elliptical functions are used in advanced filter design to dramatically increase the selectivity (rejection) of the filter function without increasing the size, weight, or the insertion loss of the filter. They are typically achieved by introducing cross-coupling of the non-adjacent resonators. In other words, they operate under the principle of destructive interference of multiple signal paths. The mechanism and the mathematics to achieve this interference can be very complicated in many cases.

SUMMARY

Quarter-wave short stub resonators appear to be open-circuit on one end. Hence, filters made of these stub resonators provide frequency selectivity such as a bandpass filter. Adding inductance or capacitance or both to the stub resonator does not change the open circuit characteristic, thus preserving the passband. Adding inductance or capacitance or both to the stub resonator, however, provides a "short-circuit" characteristic away from the band center, which is captured here as transmission zeros.

In one aspect, a filter circuit may include a transmission line having an input and an output, a quarter wave resonator, and at least one electrical component coupled in series with the quarter wave resonator at a first end and electrically coupled to the transmission line at a second end. The quarter wave resonator may have an electrical length of 90° at a defined frequency $f_0$. The at least one electrical component may be defined by a frequency dependent impedance.

In one aspect, a filter circuit may include a transmission line having an input and an output, and a first quarter wave resonator and a second quarter wave resonator. The filter may further include at least a first electrical component coupled in series with the first quarter wave resonator at a first end and electrically coupled to the transmission line at a second end and at least a second electrical component coupled in series with the second quarter wave resonator at a first end and electrically coupled to the transmission line at a second end. The at least first electrical component may be coupled to the transmission line in parallel to the at least second electrical component. The first quarter wave resonator may have an electrical length of 90° at a defined frequency $f_0$, and the second quarter wave resonator may have an electrical length of 90° at the defined frequency $f_0$. The at least first electrical component may be defined by a first frequency dependent impedance and the at least second electrical component may be defined by a second frequency dependent impedance.

In one aspect, a filter circuit may include a transmission line having an input and an output and a plurality of shunt branches. Each of the plurality of shunt branches may include a quarter wave resonator and at least one electrical component coupled in series with the quarter wave resonator at a first end and electrically coupled to the transmission line at a second end. The plurality of shunt branches may be coupled to the transmission line in a mutually parallel topology. The quarter wave resonator of each of the plurality of shunt branches may have an electrical length of 90° at a defined frequency $f_0$ and the at least one electrical component of each of the plurality of shunt branches may be defined by a frequency dependent impedance.

FIGURES

The features of various aspects are set forth with particularity in the appended claims. The various aspects, however, both as to organization and methods of operation, together with further objects and advantages thereof, may best be understood by reference to the following description, taken in conjunction with the accompanying drawings as follows.

DESCRIPTION

Figure 1:
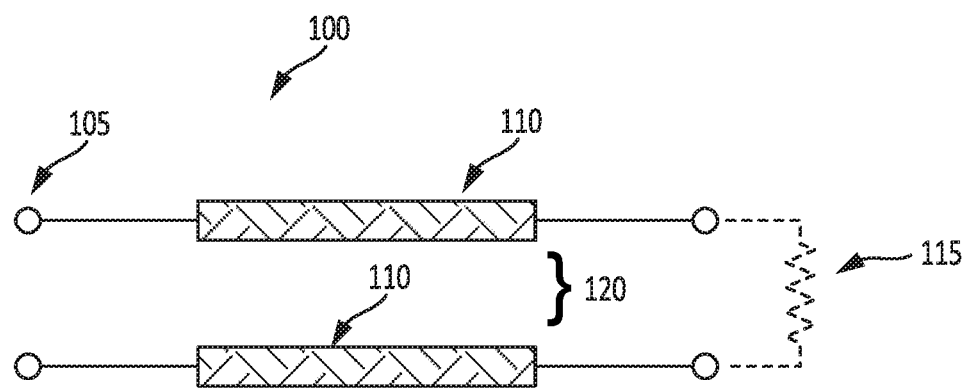
FIG. 1 is a schematic diagram of an ideal transmission line.

Aspects of the present disclosure are directed to circuits and techniques to implement electrical filters. In one aspect, the present disclosure provides bandpass filters that utilize quarter-wave short stub resonators that provide a much easier and more flexible technique to increase the selectivity of the filter. The present bandpass filter operates under the fundamental characteristic of a short stub resonator. Details of the mathematical treatment will be discussed hereinbelow. Each resonator can introduce up to two transmission zeros, without significantly altering the stub resonator characteristic. If additional elliptical response is needed, conventional cross-coupling mechanism can still be applied on top of this new feature.

The disclosed filter circuits and techniques are applicable and provide benefit to any filter utilizing quarter-wave stub resonators. Examples of such quarter-wave stub resonator filters include, without limitation, transverse electromagnetic ceramic filters (TEM resonator), microstrip interdigital filters, and suspended stripline interdigital filters.

The disclosed filter circuits and techniques enables the production of smaller and lighter filters and multiplexers with superb rejection and low insertion loss. This can be applied to integrated microwave assembly, space filter products, and stand-alone high performance filter products. The ceramic filter in particular will generate a lot of interest in commercial applications, such as, for example, cellular telephones, handheld devices, or transceivers, or combinations thereof.

In contrast, conventional filters using cross-coupling techniques without transmission zeros, must be larger in size to achieve near band rejection achievable with the disclosed filters with transmission zeros. In many circumstances conventional filters without transmission zeros may be up to three times larger in size and heavier relative to filters with the present transmission zeros. Conventional filters without transmission zeros with more sections may exhibit three times higher insertion loss (or more), which is not desirable. In addition, conventional filters without transmission zeros using conventional cross-coupling techniques (interstages only) can achieve only a single transmission zero per 3-section filter.

Aspects of the disclosed filter circuits and techniques with induced transmission zeros provide up to six zeros (from 0 to 6 zeros) and provide a far more effective and efficient design and realization compared to the conventional filter technology. Conventional cross-coupling techniques typically alter the characteristic of the resonator and require more complex structures and mathematical calculations. The induced transmission zeros introduced by the disclosed filter circuits and techniques, however, do not significantly change the nature of the resonator and makes it much easier to realize and model the effect of the transmission zeros.

Accordingly, the disclosed filter circuits and techniques with induced transmission zeros provide a novel design with demonstrated and significant improvement in filter performance. In various aspects, for example, adding an inductor, or a capacitor, or a combination thereof, to a quarter-wave resonator, can produce two transmission zeros near the passband for each resonator, e.g., one above and one below band center.

As previously discussed, the type of filters benefited by the disclosed filter circuits and techniques with induced transmission zeros include bandpass filters based on quarter-wave resonator design, including ceramic resonators (TEM), and printed (microstrip or suspended stripline) interdigital filters. The disclosed filter circuits and techniques with induced transmission zeros out-performs all current similar technologies and provide smaller size with fewer resonators needed (lower cost and shorter design schedule), lighter in weight, lower insertion loss, higher rejection near the passband, and the simplicity of the design process.

Various implementations of filter circuits and techniques with induced transmission zeros will now be described. It will be appreciated that such implementations are intended to be illustrative in nature and should not be considered as limiting the scope of the disclosure and claimed subject matter appended hereto.

In one aspect, the present disclosure provides filter circuits and techniques with four transmission zeros design in a 2-pole ceramic filter. Quasi-TEM mode ceramic resonators are widely used as building blocks for bandpass filters in wireless and communication systems.

Improvement in filter performance without increasing the filter size is always desirable. Especially in miniaturized handheld devices, 2-pole filters are often used with limited filtering function. The present disclosure provides a design of introducing up to 4 transmission zeros near the passband of a 2-pole filter in which cross-coupling is not available. These transmission zeros can be placed independently at frequencies of interest. With the 4 zeros nearby, a 2-pole ceramic filter can provide a lot of near-band rejection without increasing the filter size.

In one aspect, the present disclosure provides filter circuits and techniques with 2N-transmission zeros for N-poles planar filters. Planar filter has often been a choice for subsystem designers because of its lower manufacturing cost, low profile and its compatibility in system integration. This type of filter does occupy a good portion of the surface area of the board. With the continuous miniaturization of the communication hardware, a new concept of reducing the filter size without sacrificing the filter rejection is presented herein. This novel design can introduce up to 2N transmission zeros for an N-section filter, where N can be as low as one. The extra zeros also can be applied in additional to the traditional cross-coupling scheme that advance filter designers often use. Disclosed herein is an example of a 3-section interdigital filter realized in microstrip, and another one in suspended stripline. Up to 6 transmission zeros are placed in selected near-band frequencies, without using the traditional non-adjacent cross-coupling. All bandpass filters comprised of quarter-wave short stub resonators can be benefited from this concept.

The disclosure now turns to a description of circuits and techniques with one- and two-resonators transmission zeros. Traditional cross-coupling techniques operate under the destructive interference principle, which requires multiple signal paths for signal cancellation. A minimum of three filter section are required in order to introduce non-adjacent coupling between resonators. The new transmission zeros (and zero-pairs) provided by the disclosed filter circuits and techniques can be applied even to a single resonator filters, or to 2-resonator filters, where cross-coupling is not available. With higher order filters, traditional cross-coupled zeros can still be obtained in addition to the new induced transmission zeros as described herein. For example, with a 3-section filter, traditional cross-coupling can introduce only a single transmission zero (not counting input/output ports coupling). With the disclosed circuits and techniques described herein, up to seven transmission zeros may be achieved, therefore obviating the need for a higher order filter in most applications. The benefits in performance, cost, size, weight, and schedule are readily apparent.

Single Resonator Design And Model

FIG. 1 is a schematic diagram of an ideal transmission line 100. $Z_{in}$, the input impedance 105 of an ideal transmission line is given by:

$$Z_{in} = Z_o\left(\frac{Z_L + jZ_o\tan\beta l}{Z_o + jZ_K\tan\beta l}\right)$$

where $Z_o$ is the characteristic impedance 110 of the transmission line, $Z_L$ is the impedance of the load 115 the transmission line is connected to, $\beta = 2\pi/\lambda$ is the wave number along the line, $\lambda$ is the guided wavelength, and l is the length of the transmission line 120.

Figure 2:
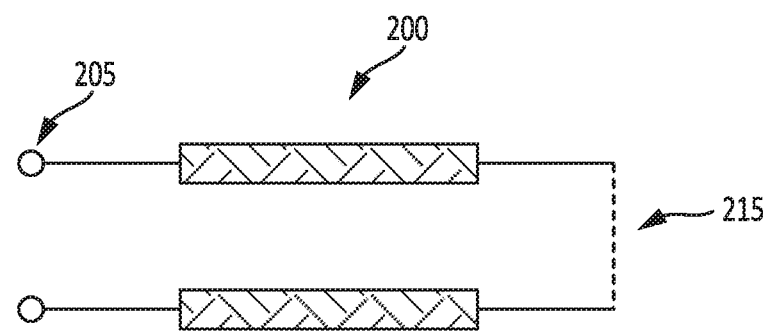
FIG. 2 is a schematic diagram of a short stub resonator.

The transmission line becomes a short stub resonator 200 when the load impedance 215 $Z_L$ equals 0, or short circuit as shown in FIG. 2. The impedance 205 ($Z_{sh}$) of the short stub resonator 200 is now given by:

$$Z_{sh} = jZ_o \tan \beta l$$

where $Z_o$ and $\beta l$ are the same as in FIG. 1.

Figure 3:
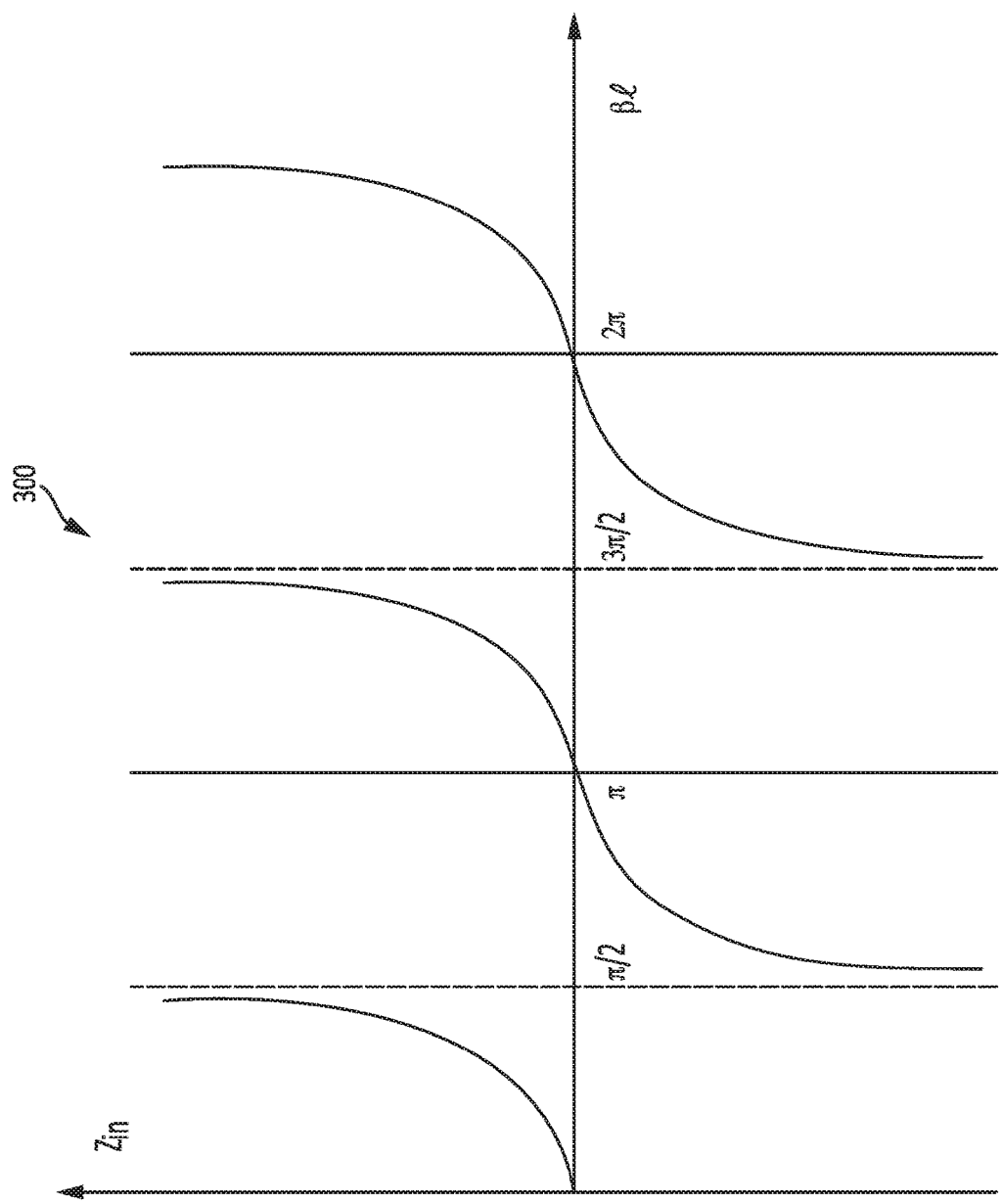
FIG. 3 is a graphical depiction of the magnitude of the impedance of the short stub resonator as a function of βl.

FIG. 3 is a graphical depiction 300 of the magnitude of the impedance 205 ($Z_{sh}$) of the short stub resonator 200 as a function of $\beta l$. As shown in FIG. 3, the magnitude of the impedance 205 ($Z_{sh}$) of the short stub resonator is a tangent function, with a period of $\pi$, or half of a wavelength $\lambda$.

Figure 4:
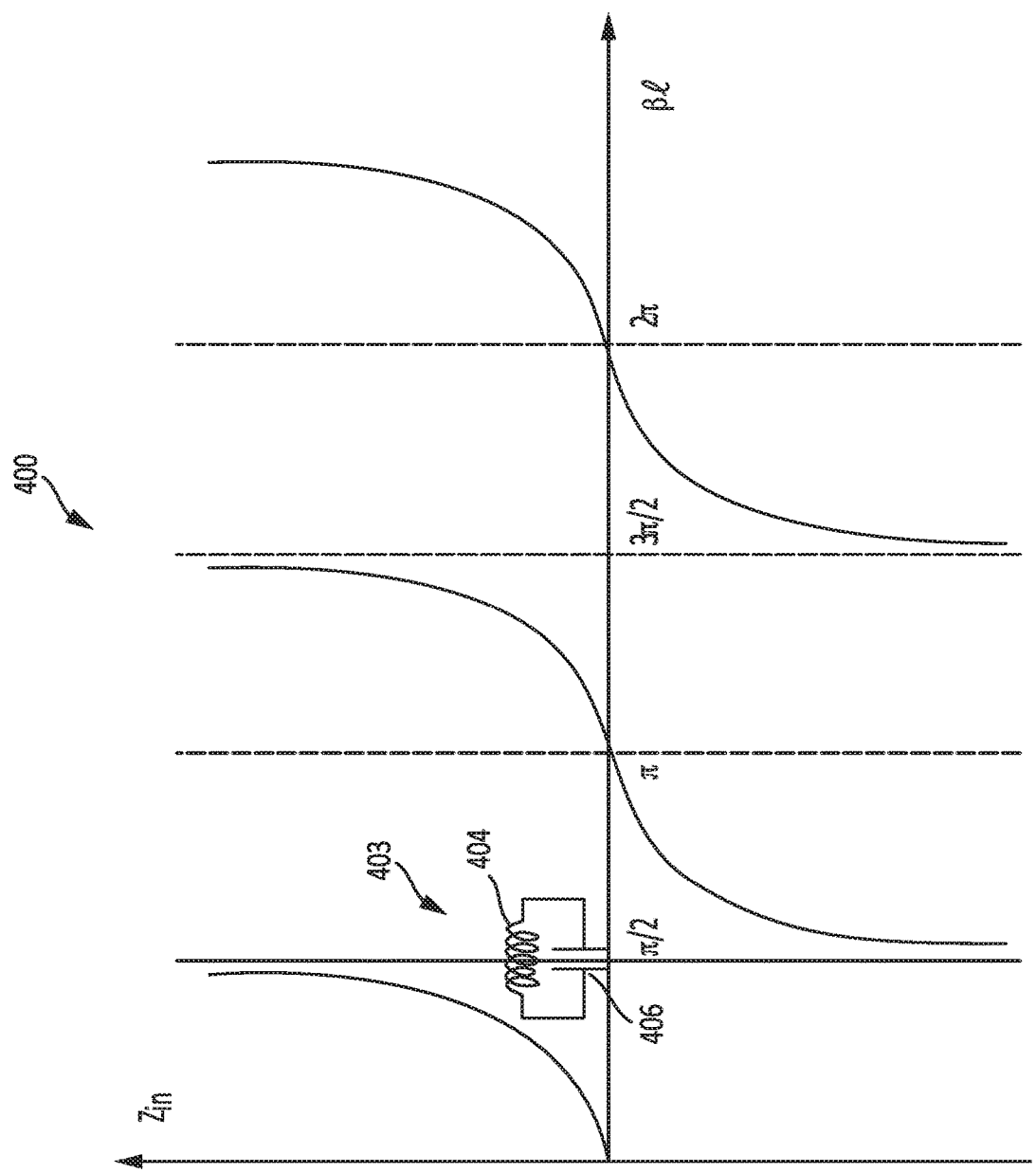
FIG. 4 is a graphical depiction of the magnitude of the impedance of the short stub resonator as a function of βl.

FIG. 4 is a graphical depiction 400 of the magnitude of the impedance of the short stub resonator as a function of $\beta l$, where $$l = \frac{\lambda}{4}$$

(quarter-wave). At $$l = \frac{\lambda}{4}$$

(quarter-wave), $$\beta l = \frac{\pi}{2} = 90°$$

electrical length where $\tan \beta l$ is undefined, or behaves like a shunt tank resonator 403. The tank resonator 403 is equivalent to an LC circuit in which the inductor L 404 and capacitor C 406 are connected in parallel, as depicted. The impedance $Z_{pres}$ is given by:

$$Z_{pres} = \frac{1}{j\omega C\left(1 - \frac{1}{\omega^2 LC}\right)}$$

$$|Z_{pres}| \to \pm\infty$$

$$@\omega_o = \frac{1}{\sqrt{LC}}$$

Figure 5:
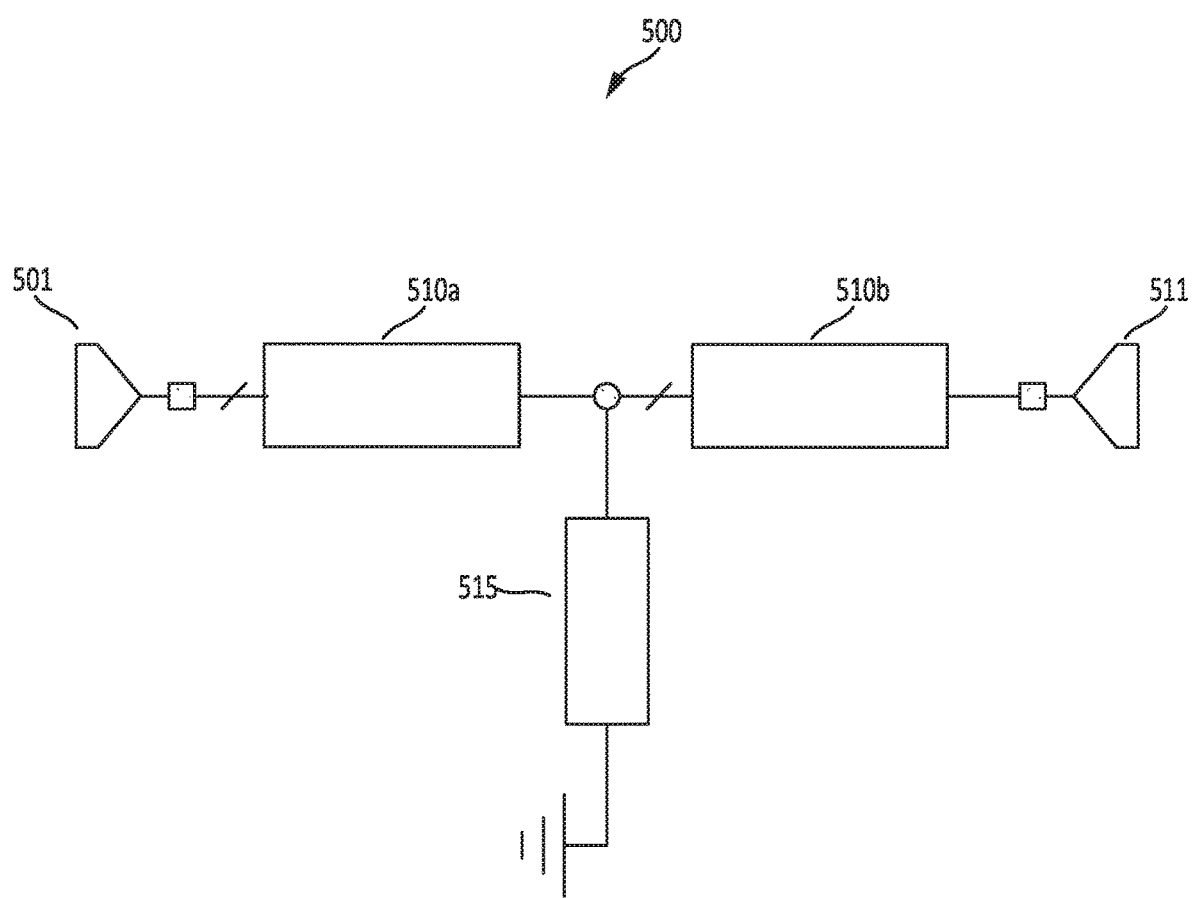
FIG. 5 is a schematic diagram of a single resonator 1-section bandpass filter.

FIG. 5 is a schematic diagram of a single resonator 1-section bandpass filter 500. The quarter-wave stub 515 has an electrical length of 90° at a resonance frequency $f_0$. The single resonator 1-section bandpass filter 500 has an input port 501 and an output port 511. The input port 501 may be coupled via an input coupling 510a to the quarter-wave stub 515, and the output port 511 may also be coupled via an output coupling 510b to the quarter wave stub 515. In some aspects, a characteristic impedance of the input coupling 510a and the output coupling 510b may be the same. In other aspects, the quarter wave stub 515 may have a characteristic impedance that may be the same as or matched to that of the input coupling 510a and of the output coupling 510b. The input coupling 510a and the output coupling 510b can be realized by using printed or lumped inductors or capacitors or a combination thereof. At the frequency $f_0$ at which the stub resonator electrical length is equal to the quarter-wavelength of the frequency $f_0$, the impedance of the stub resonator 515 is large and the stub resonator 515 appears to be an open circuit to ground at the junction with the input coupling 510a and the output coupling 510b. At $f_0$, the total input signal power is thus transmitted from an input port 501 and an output port 511. At frequencies not equal to $f_0$, some or most of the input signal is reflected at input port 501 due to the low impedance effectively created by of the quarter wave stub 515 operating out of resonance.

Figure 6:
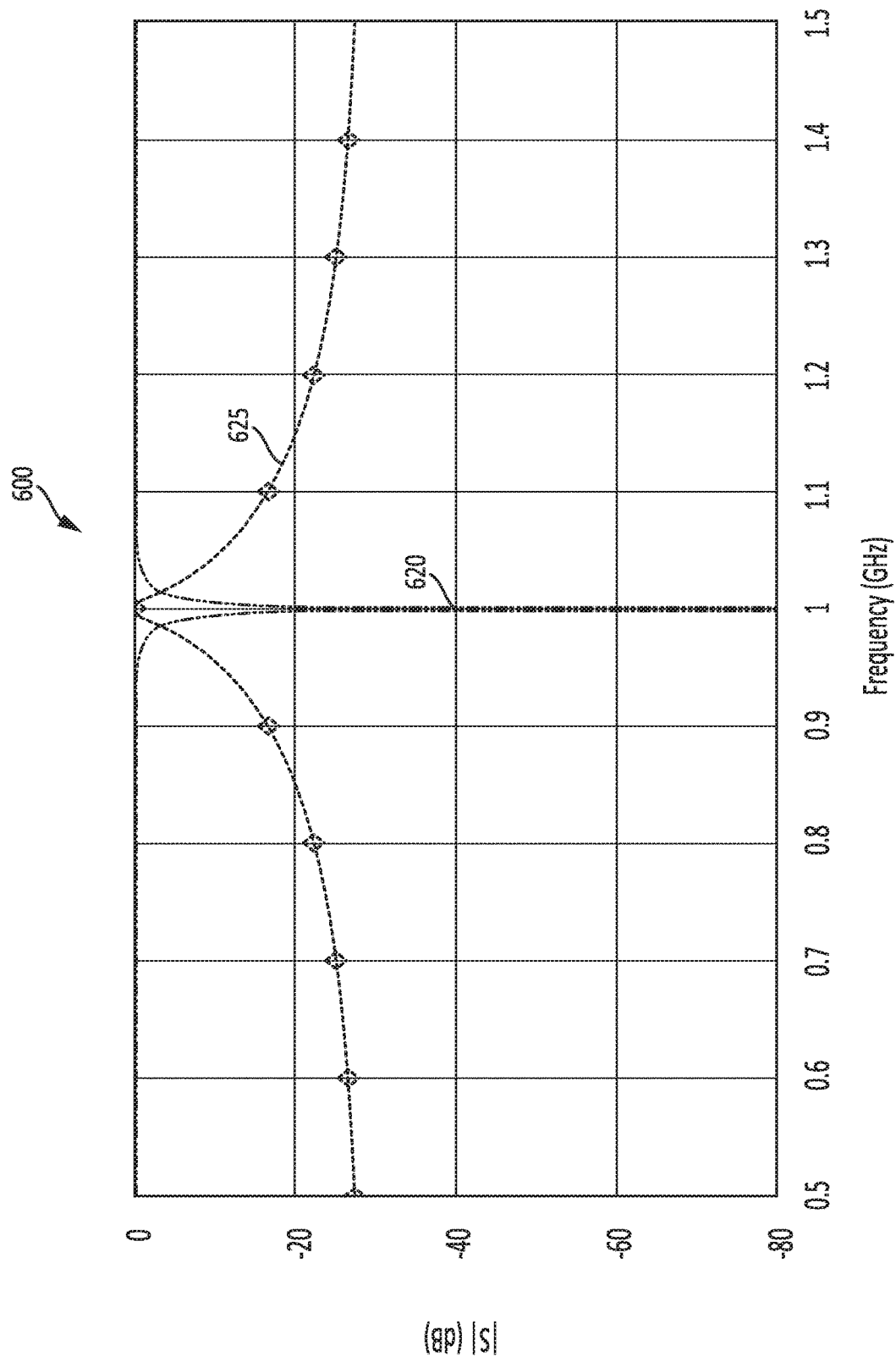
FIG. 6 is a frequency response of the quarter-wave shunt stub resonator plain 1-section filter shown in FIG. 5.

FIG. 6 is a frequency response 600 of the quarter-wave shunt stub resonator plain 1-section filter 500 depicted in FIG. 5. Throughout this disclosure, the 2-port S-parameters of a filter S(1,1) is the input port voltage reflection coefficient (shown as curve 620 in FIG. 6) and S(2,1) is the forward voltage gain (shown as curve 625 in FIG. 6). The performance of the quarter-wave resonator plain 1-section filter illustrated in FIG. 6 is shown for a center or resonant frequency $f_0$=1 GHz.

Figure 7:
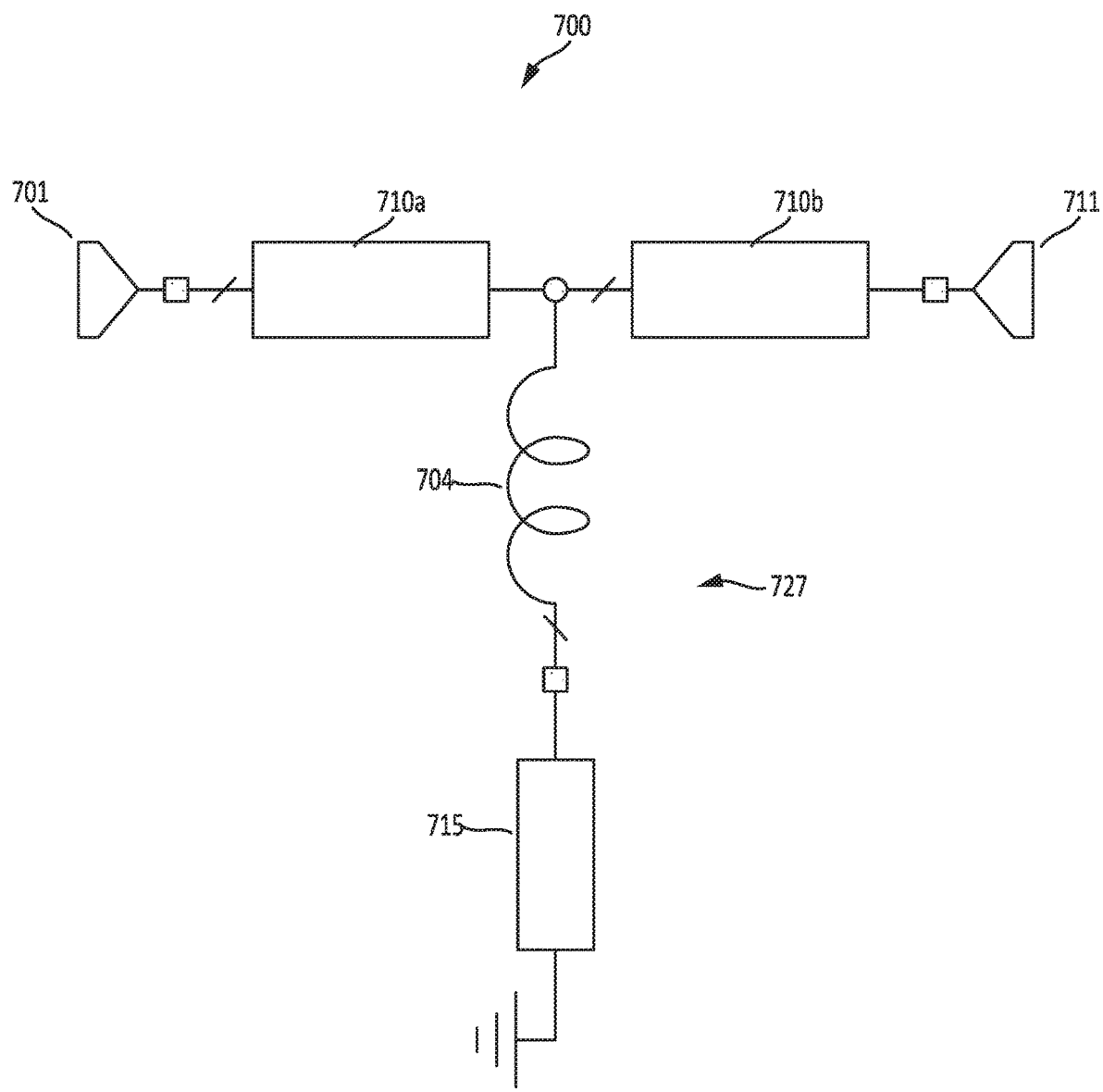
FIG. 7 is a schematic diagram of a single resonator 1-section bandpass filter with an inductor $L_1$ added to the quarter-wave resonator as shown, according to at least one aspect of the present disclosure.

FIG. 7 is a schematic diagram of a second single resonator 1-section bandpass filter 700. The second bandpass filter 700 has an input port 701 and an output port 711. In one aspect, the input port 701 may be coupled via an input coupling 710a to the quarter-wave stub 715 through inductor 704 ($L_1$), and the output port 711 may also be coupled via an output coupling 710b to the quarter wave stub 715 via the inductor 704 ($L_1$). The input coupling 710a and the output coupling 710b can be realized by using printed or lumped inductors or capacitors or a combination thereof. A shunt branch 727 may be defined as the combination of the inductor 704 ($L_1$) coupled in series with the quarter-wave stub 715. At the quarter wave stub resonance frequency, $f_0$, when the stub of the resonator 700 has a quarter-wave electrical length, the shunt branch 727 still appears to be an open circuit and therefore the passband feature is preserved at $f_0$. Since the tangent function is negative above $\pi/2$, there exists a frequency ω above the passband where the total shunt impedance is zero:

$$Z=jZ_o \tan \beta l+j\omega L_1=0$$

At that frequency ω, the shunt branch 727 appears to be a short circuit, and therefore no signal can go through. Thus, a transmission zero is achieved. Note that the passband frequency $f_0$ has not been disturbed.

Figure 8:
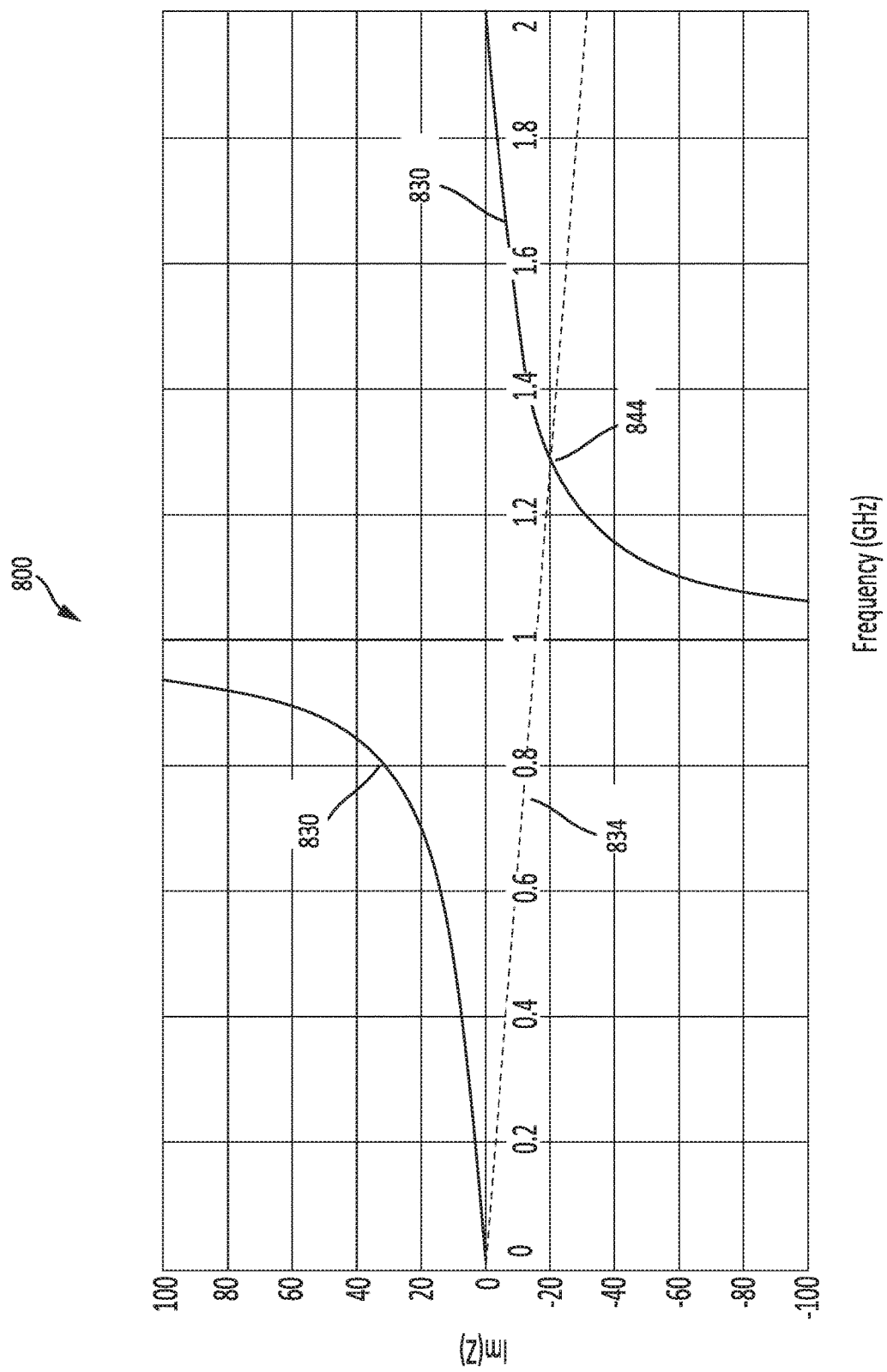
FIG. 8 is a graphical representation depicting a technique for locating the transmission zero of the single resonator 1-section bandpass filter with an inductor $L_1$ added to the quarter-wave resonator shown in FIG. 7, according to at least one aspect of the present disclosure.

FIG. 8 depicts a graphical representation 800 depicting a technique for locating the transmission zero of the single resonator 1-section bandpass filter with an inductor $L_1$ added to the quarter-wave resonator shown in FIG. 7, according to at least one aspect of the present disclosure. Graphical representation 800 present graphs of the imaginary component of the impedance, Im(Z) versus frequency in GHz. For the purpose of illustration only, the simulation parameters of the results depicted in graphical representation 800 include a stub electrical length of 90° at $f_0$=1 GHz, and inductor $L_1$ has a value of 2.5 nH. The transmission zero may be located by solving the impedance equation:

$$Z=jZ_o \tan \beta l+j\omega L_1=0$$

or, graphically, by locating the intersection of the curves $Z_o \tan \beta l=-\omega L_1$, as illustrated in FIG. 8.

Thus, in the graphical representation 800, curve 830 represents the imaginary component of the impedance of the quarter wave stub, and curve 834 presents the imaginary component of the impedance of inductor $L_1$. The transmission zero may be found at the intersection 844 of the two curves.

Figure 9:
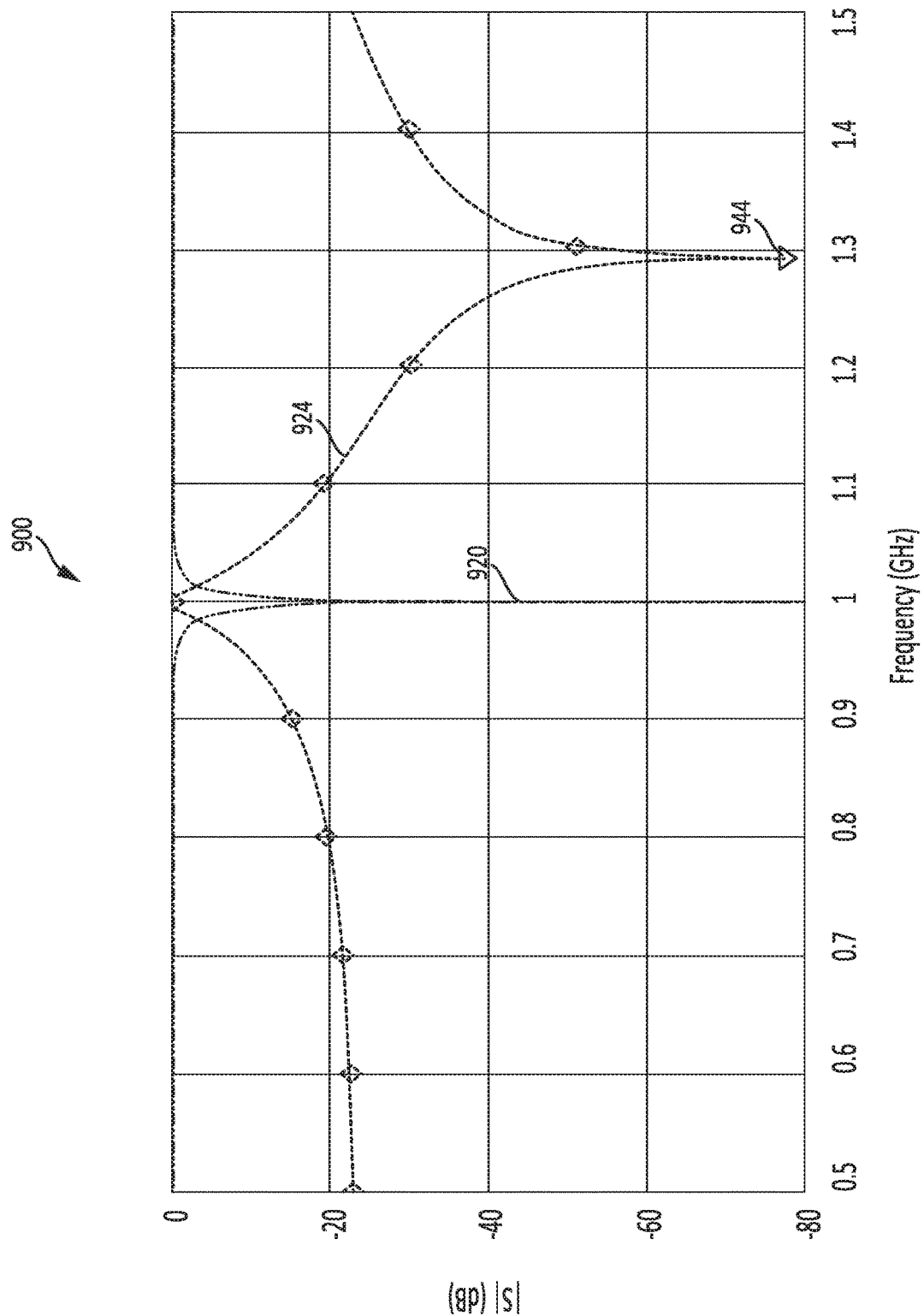
FIG. 9 is a frequency response of the single resonator 1-section bandpass filter with an inductor $L_1$ added to the quarter-wave resonator shown in FIG. 7, according to at least one aspect of the present disclosure.

FIG. 9 is simulation 900 of a frequency response of the single resonator 1-section bandpass filter with an inductor $L_1$ added to the quarter-wave resonator (700) shown in FIG. 7, according to at least one aspect of the present disclosure. The S(1,1) input port voltage reflection coefficient is depicted as curve 920 and the S(2,1) forward voltage gain is depicted as curve 924. As depicted in FIG. 9, a transmission zero 944, having a forward voltage gain of −77.5 dB, is induced at 1.289 GHz, above the passband (1 GHz).

Figure 10:
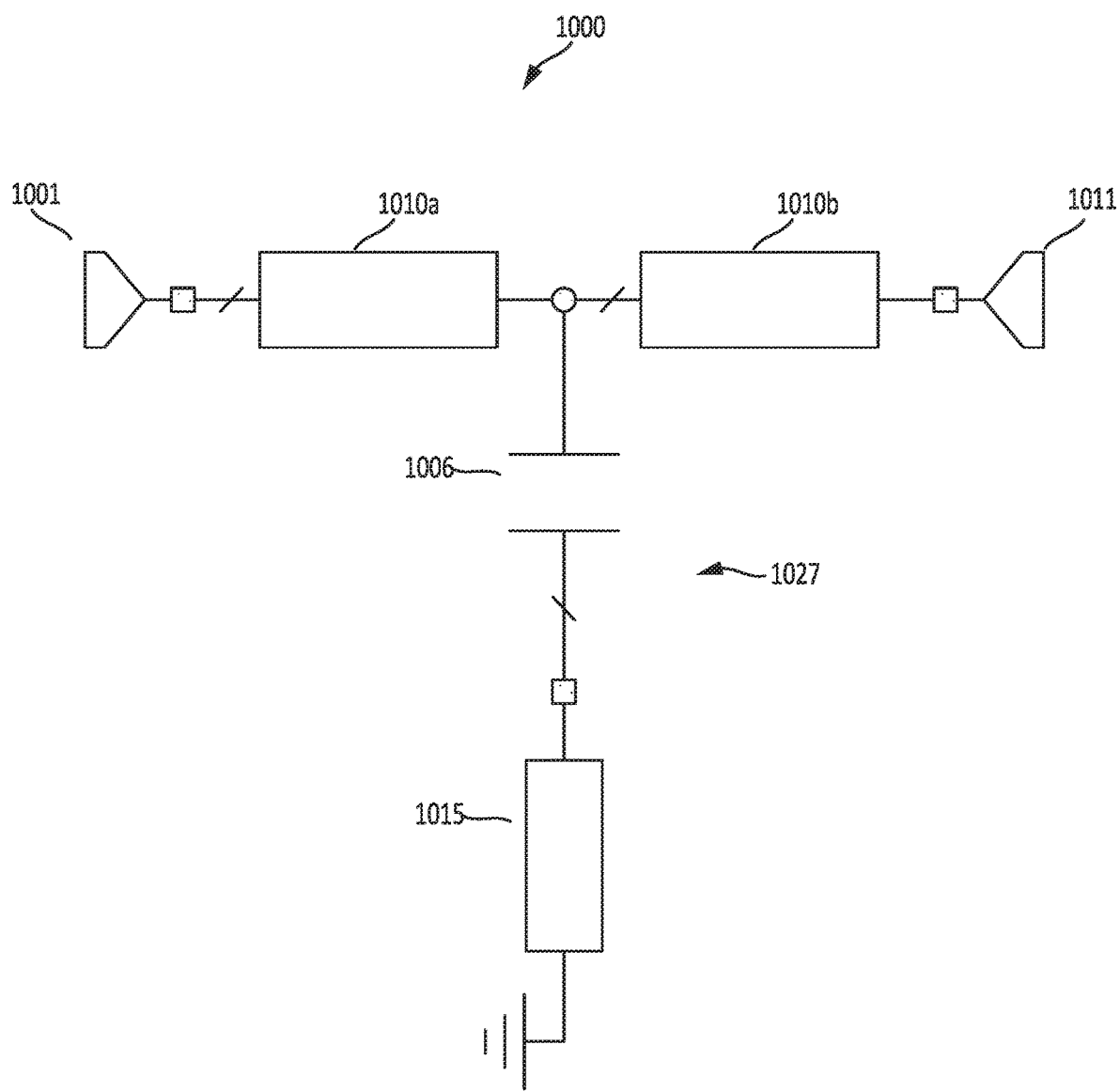
FIG. 10 is a schematic diagram of a single resonator 1-section bandpass filter configured with a capacitor $C_1$ added to the quarter-wave resonator as shown, according to at least one aspect of the present disclosure.

FIG. 10 is a schematic diagram of a third single resonator 1-section bandpass filter 1000. The third bandpass filter 1000 has an input port 1001 and an output port 1011. In one aspect, the input port 1001 may be coupled via an input coupling 1010a to the quarter-wave stub 1015 through capacitor 1006 ($C_1$), and the output port 1011 may also be coupled via an output coupling 101b to the quarter wave stub 1015 via the capacitor 1006 ($C_1$). The input coupling 1010a and the output coupling 1010b can be realized by using printed or lumped inductors or capacitors or a combination thereof. A shunt branch 1027 may be defined as the combination of the capacitor 1006 ($C_1$) coupled in series with the quarter-wave stub 1015. The reactance of a capacitor is negative and the tangent function is positive below $\pi/2$. Therefore, there exists a frequency, w, below the passband where the total shunt impedance is zero:

$$Z = jZ_o \tan \beta l - \frac{j}{\omega C_1} = 0$$

At that frequency, ω, the shunt branch 1027 appears to be a short circuit, and therefore no signal can go through. Thus, a transmission zero is achieved. Note that the passband frequency $f_0$ has not been disturbed.

Figure 11:
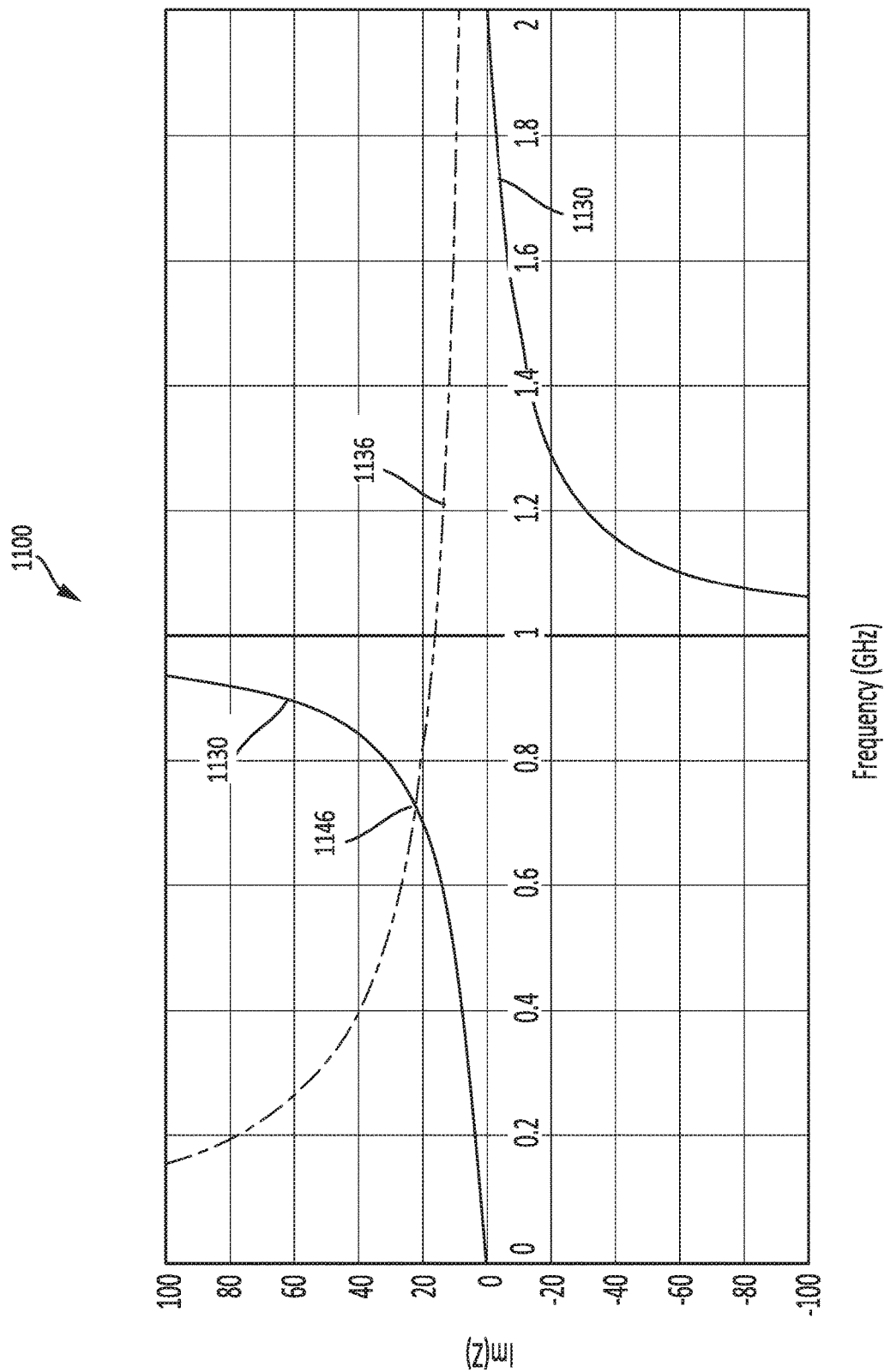
FIG. 11 is a graphical representation depicting a technique for locating the transmission zero of the single resonator 1-section bandpass filter with a capacitor $C_1$ added to the short stub resonator shown in FIG. 10, according to at least one aspect of the present disclosure.

FIG. 11 depicts a graphical representation 1100 depicting a technique for locating the transmission zero of the single resonator 1-section bandpass filter 1000 with the capacitor 1006 ($C_1$) added to the short stub resonator 1015 shown in FIG. 10, according to at least one aspect of the present disclosure. Graphical representation 1100 present graphs of the imaginary component of the impedance, Im(Z) versus frequency in GHz. For the purpose of illustration only, the simulation parameters of the results depicted in graphical representation 1100 include a stub electrical length of 90° at $f_0=1$ GHz, and capacitor $C_1$ has a value of 10 pF. The transmission zero may be located by solving the impedance equation:

$$Z = jZ_o \tan\beta l - \frac{j}{\omega C_1} = 0$$

or graphically, by locating the intersection of the curves $Z_o$ tan $$\beta l = \frac{1}{\omega C_1},$$

as illustrated in FIG. 11.

Thus, in the graphical representation 1100, curve 1130 represents the imaginary component of the impedance of the quarter wave stub, and curve 1136 presents the imaginary component of the impedance of the capacitor $C_1$. The transmission zero may be found at the intersection 1146 of the two curves.

Figure 12:
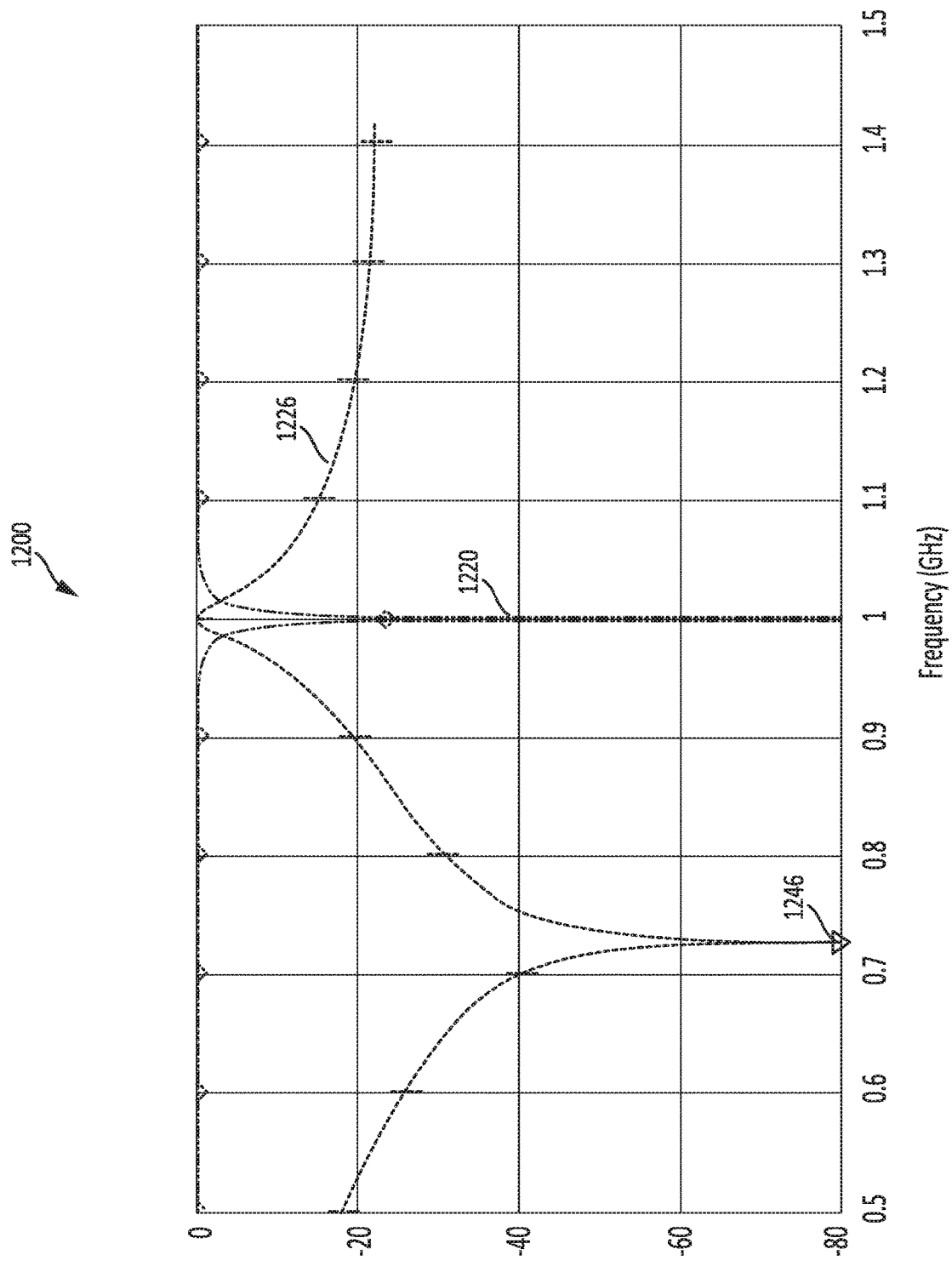
FIG. 12 is a frequency response of the single resonator 1-section bandpass filter configured with a capacitor $C_1$ added to the quarter-wave resonator shown in FIG. 10, according to at least one aspect of the present disclosure.

FIG. 12 is simulation 1200 of a frequency response of the single resonator 1-section bandpass filter with a capacitor $C_1$ added to the quarter-wave resonator (1015) shown in FIG. 10, according to at least one aspect of the present disclosure. The S(1,1) input port voltage reflection coefficient is depicted as curve 1220 and the S(2,1) forward voltage gain is depicted as curve 1226 As depicted in FIG. 12, a transmission zero 1246, having a forward voltage gain of −79.7 dB, is induced at 0.73 GHz, below the passband (1 GHz).

Figure 13:
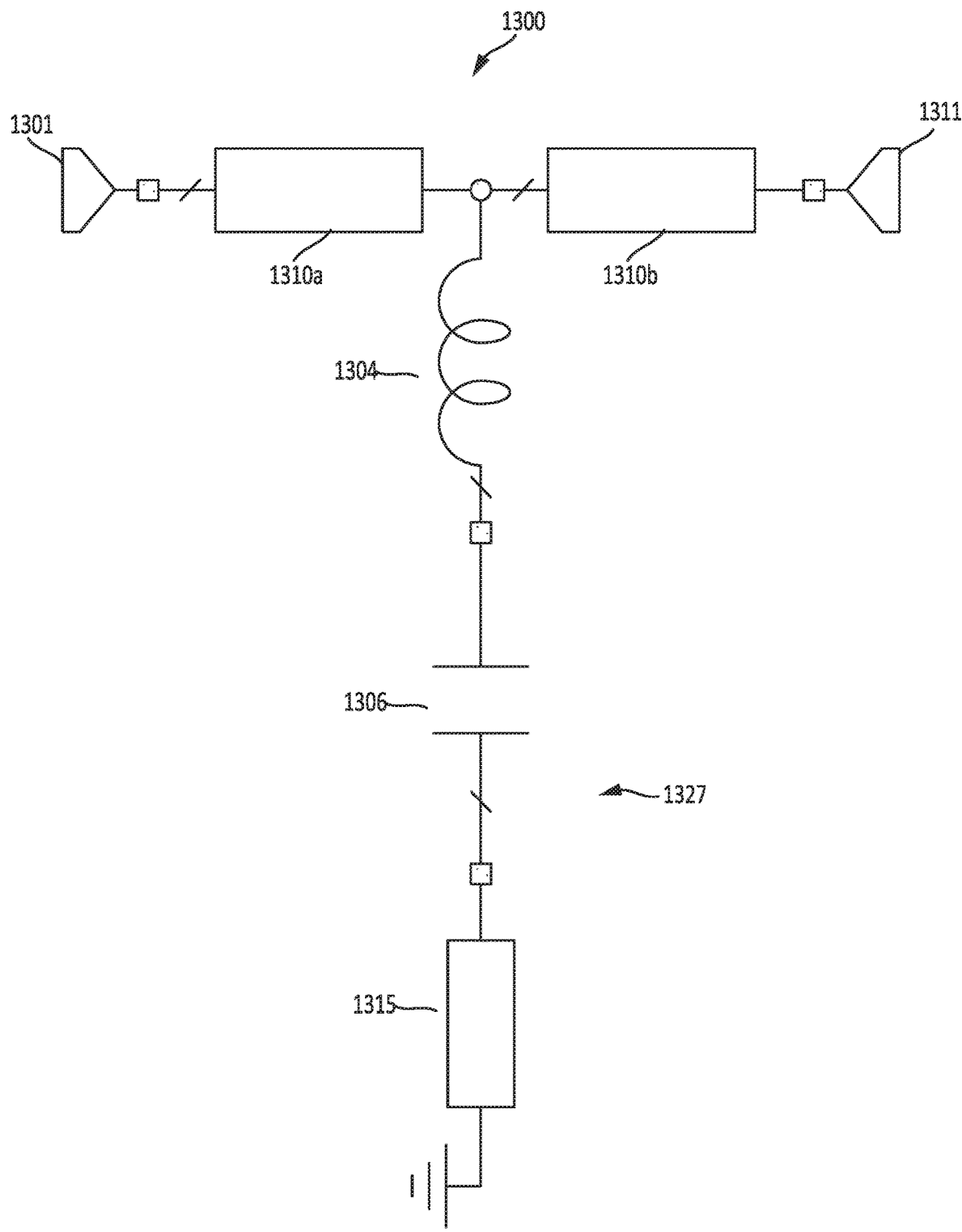
FIG. 13 is a schematic diagram of a single resonator 1-section bandpass filter configured with an inductor $L_1$ and a capacitor $C_1$ added to the quarter-wave resonator as shown, according to at least one aspect of the present disclosure.

FIG. 13 is a schematic diagram of a fourth single resonator 1-section bandpass filter 1300. The fourth bandpass filter 1300 has an input port 1301 and an output port 1311. In one aspect, the input port 1301 may be coupled via an input coupling 1310a to the quarter-wave stub 1315 through inductor 1304 ($L_1$) in series with capacitor 1306 ($C_1$). The output port 1311 may also be coupled via an output coupling 1310b to the quarter wave stub 1315 through inductor 1304 ($L_1$) in series with capacitor 1306 ($C_1$). The input coupling 1310a and the output coupling 1310b can be realized by using printed or lumped inductors or capacitors or a combination thereof. A shunt branch 1327 may be defined as the combination of the inductor 1304 ($L_1$) coupled in series with capacitor 1306 ($C_1$) which, in turn, is coupled in series with the quarter-wave stub 1315. The reactance of a capacitor 1306 ($C_1$) in series with an inductor 1304 ($L_1$) and the quarter-wave resonator 1315 will produce two zeros, one above and one below the passband, at the frequencies given by:

$$Z = jZ_o \tan\beta l + j\omega L_1 - \frac{j}{\omega C_1} = 0$$

Figure 14:
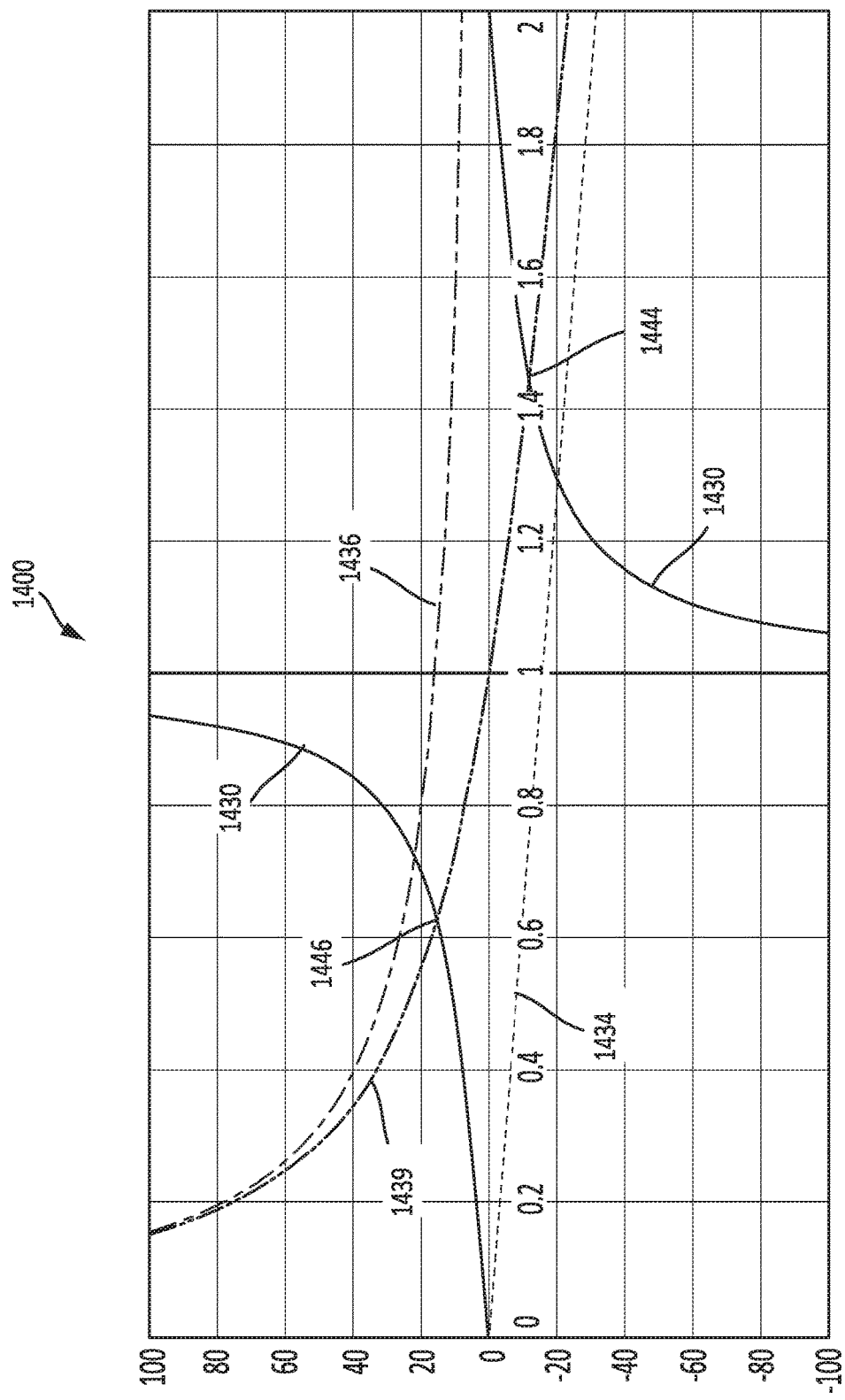
FIG. 14 is a graphical representation depicting a technique for locating the transmission zero of the single resonator 1-section bandpass filter with an inductor $L_1$ and a capacitor $C_1$ added to the quarter-wave resonator shown in FIG. 13, according to at least one aspect of the present disclosure.

FIG. 14 depicts a graphical representation 1400 depicting a technique for locating the transmission zero of the single resonator 1-section bandpass filter 1300 with the inductor 1304 ($L_1$) in series with the capacitor 1306 ($C_1$) and further in series with the short stub resonator 1315 shown in FIG. 13, according to at least one aspect of the present disclosure. Graphical representation 1300 present graphs of the imaginary component of the impedance, Im(Z) versus frequency in GHz. For the purpose of illustration only, the simulation parameters of the results depicted in graphical representation 1300 include a stub electrical length of 90° at $f_0=1$ GHz, the inductor I1 has a value of 2.5 nH, and capacitor $C_1$ has a value of 10 pF. i The transmission zero may be located by solving the impedance equation:

$$Z = jZ_o \tan\beta l + j\omega L_1 - \frac{j}{\omega C_1} = 0$$

or graphically, by locating the intersection of the curves $Z_o$ tan $$\beta l = -\omega L_1 + \frac{1}{\omega C_1},$$

as illustrate din FIG. 14. Thus, in the graphical representation 1400, curve 1430 represents the imaginary component of the impedance of the quarter wave stub, curve 1434 presents the imaginary component of the impedance of inductor $L_1$, curve 1436 presents the imaginary component of the impedance of capacitor $C_1$, and curve 1439 presents the sum of the imaginary component of the impedance of curves 1434 and 1436. The transmission zeros may be found at the intersections 1444 and 1446 of curves 1430 and 1439.

Figure 15:
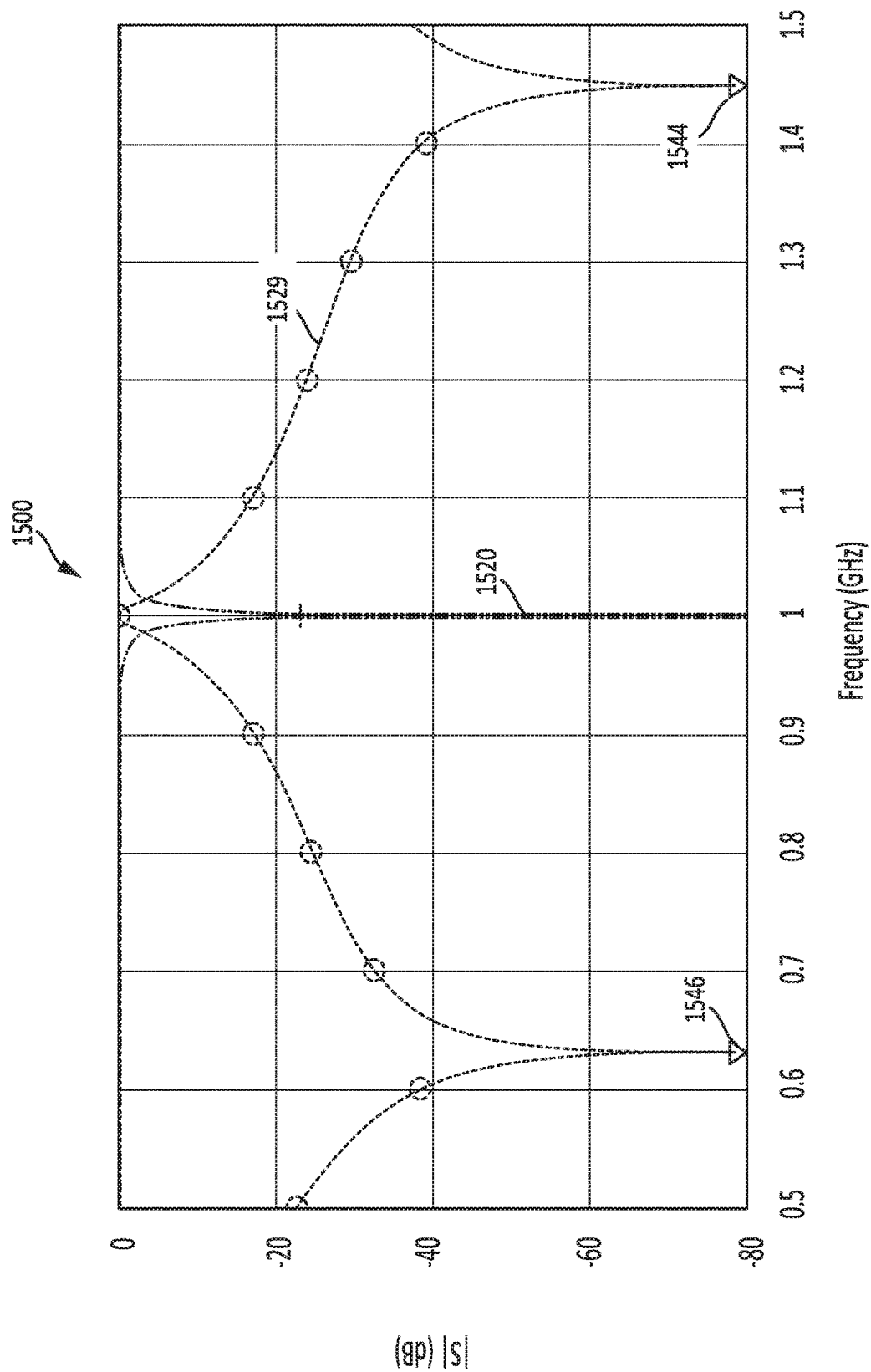
FIG. 15 is a frequency response of the single resonator 1-section bandpass filter configured with an inductor $L_1$ and a capacitor $C_1$ added to the quarter-wave resonator shown in FIG. 13, according to at least one aspect of the present disclosure.
Figure 19:
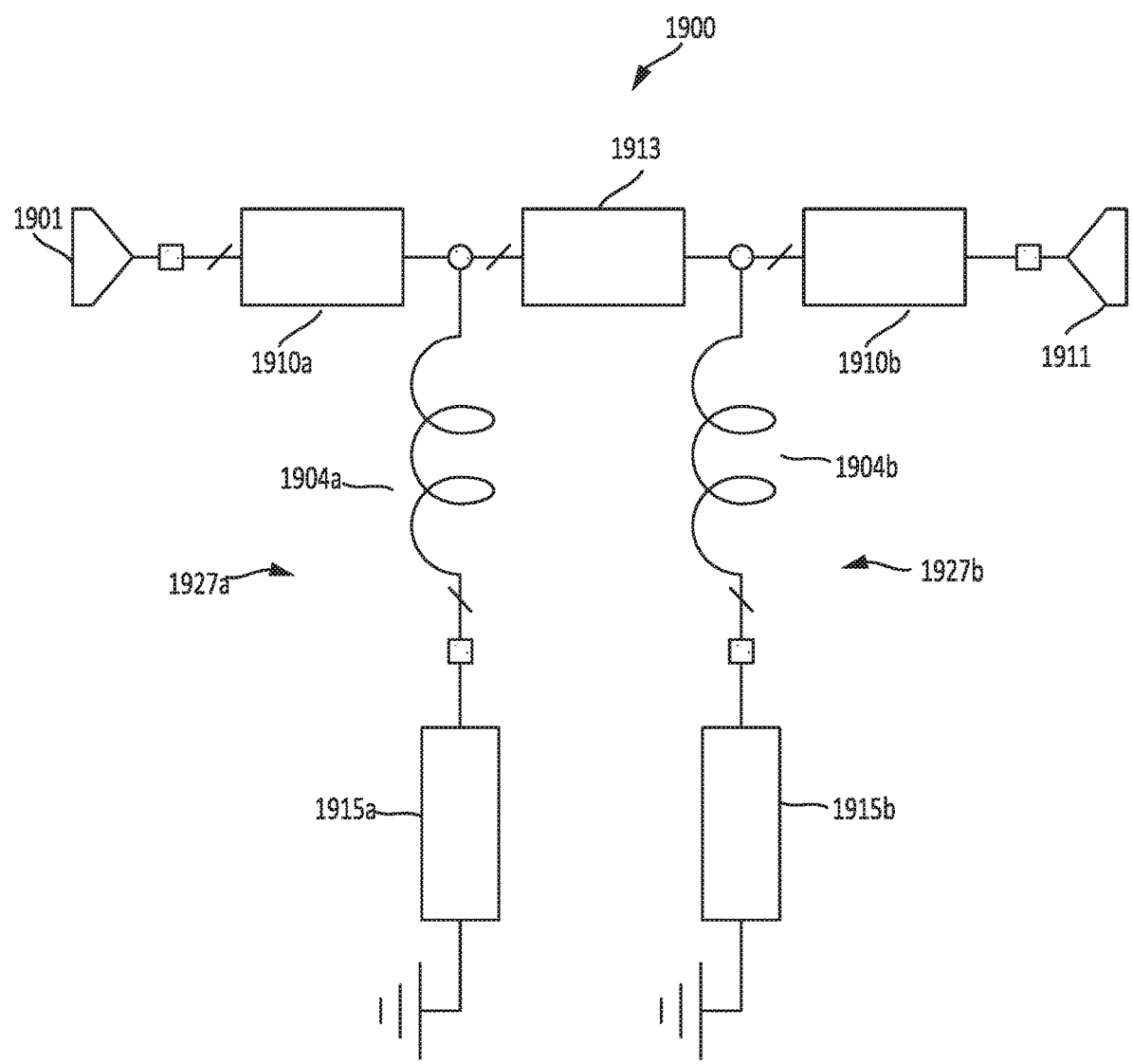
FIG. 19 is a schematic diagram of a 2-pole bandpass filter configured with two inductors $L_1$ and $L_2$ added to the quarter-wave resonators as shown, according to at least one aspect of the present disclosure.

FIG. 15 is simulation 1500 of a frequency response of the single resonator 1-section bandpass filter with an inductor $L_1$ added in series to capacitor $C_1$ which is further added in series to the quarter-wave resonator (1315) shown in FIG. 13, according to at least one aspect of the present disclosure. The S(1,1) input port voltage reflection coefficient is depicted as curve 1520 and the S(2,1) forward voltage gain is depicted as curve 1529 As depicted in FIG. 19, a transmission zero 1546, having a forward voltage gain of −78.3 dB, is induced at 0.63 GHz, below the passband (1 GHz) and a transmission zero 1544, having a forward voltage gain of −78.3 dB is induced at 1.45 GHz, above the passband (1 GHz).

Figure 16:
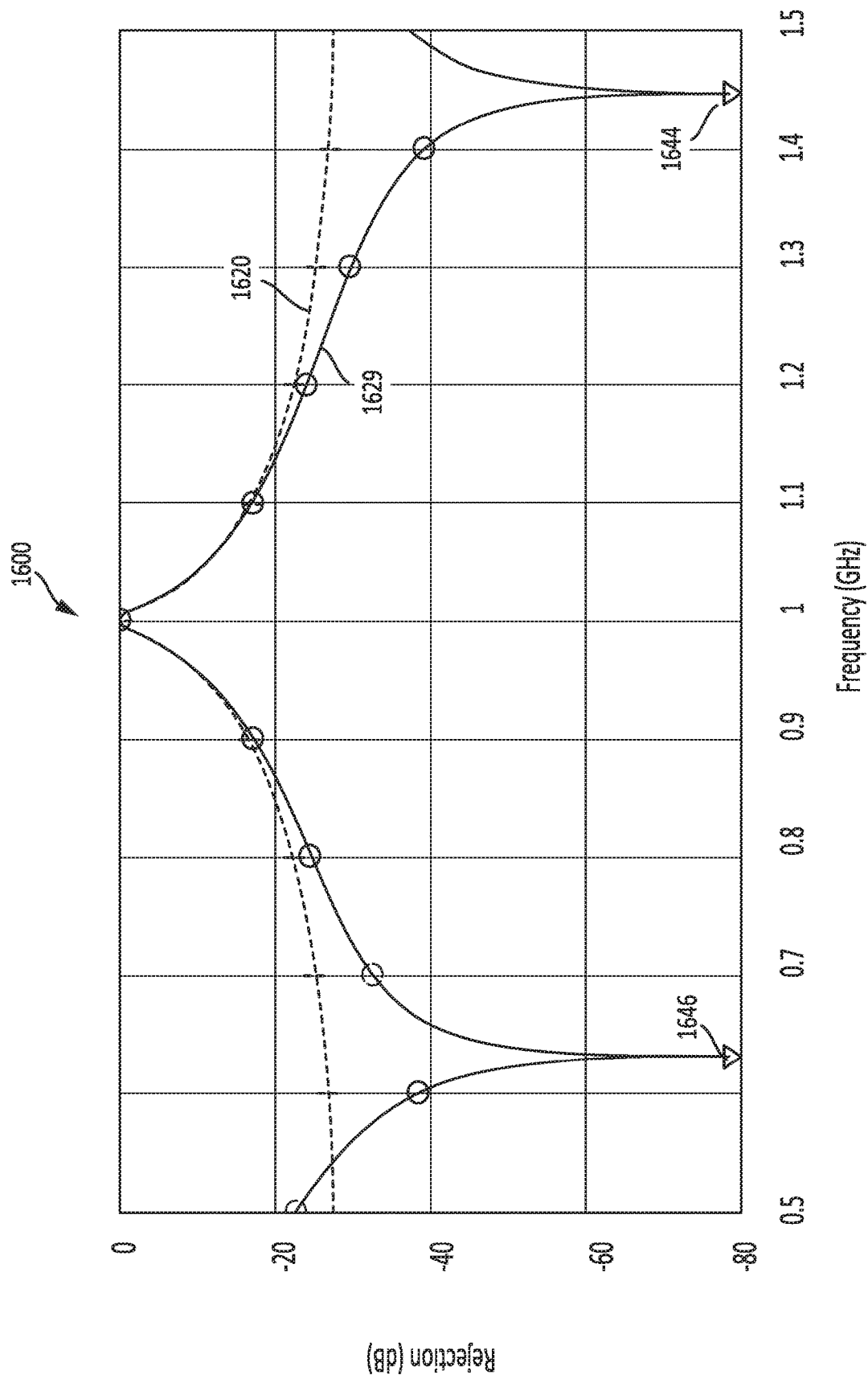
FIG. 16 is a comparison of the frequency responses of the single resonator 1-section bandpass filter shown in FIG. 5 and the single resonator 1-section bandpass filter configured with an inductor $L_1$ and a capacitor $C_1$ added to the quarter-wave resonator shown in FIG. 13, according to at least one aspect of the present disclosure.

FIG. 16 is a comparison of the frequency responses of the single resonator 1-section bandpass filter 500 shown in FIG. 5 and the single resonator 1-section bandpass filter configured with an inductor $L_1$ and a capacitor $C_1$ added to the quarter-wave resonator 1300 shown in FIG. 13, according to at least one aspect of the present disclosure. Curve 1620 depicts the signal rejection induced by the bandpass filter 500 and curve 1629 depicts the signal rejection induced by the bandpass filter 1300. Transmission zeros 1646 and 1644 are depicted in curve 1629. It may be observed that significant additional signal rejection may be obtained in the regions close to the transmission zeros 1646 and 1644 by the addition of the inductor and capacitor in series with the quarter-wave stub.

In summary, transmission zeros (1 or 2) can be introduced easily with a single resonator. Frequencies of the zeros can be independently selected by choosing the appropriate inductor L and capacitor C values, using simple equations or visually on a graph. The passband frequency is simply defined by the quarter-wave stub resonator, and is unaffected by the induced transmission zeros.

2-Pole Filter

With the additional four transmission zeros nearband, the 2-pole filter is a very attractive miniaturized filter with superior performance for most wireless handset applications. The following 2-pole filters illustrates the usefulness of the new transmission zeros concept. This filter performs better than any known 2-pole or 3-pole filter used in most wireless handset applications.

Figure 17:
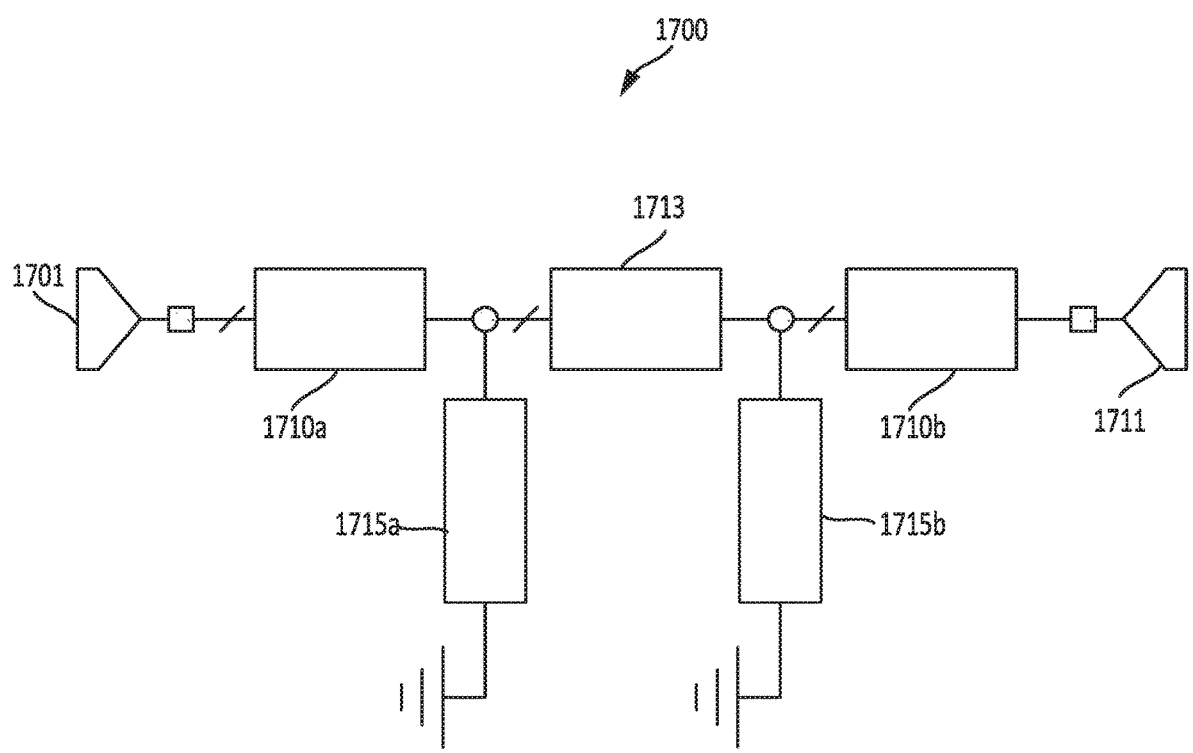
FIG. 17 is a schematic diagram of a basic 2-pole bandpass filter. B1 and B2 represent the quarter-wave resonators.

FIG. 17 is a schematic diagram of a basic 2-pole bandpass filter 1700. Two quarter-wave stubs 1715a and 1715b are provided, each having an electrical length of 90° at a resonance frequency $f_0$. The basic 2-pole bandpass filter 1700 has an input port 1701 and an output port 1711. The input port 1701 may be coupled via an input coupling 1710a to a first quarter-wave stub 1715a, and the output port 1711 may be coupled via an output coupling 1710b to the second quarter wave stub 1715b. The input coupling 1710a and the output coupling 1710b may be further coupled together by a median coupling 1713. It may be recognized that the quarter wave stubs 1715a,b are connected in parallel with each other to a transmission line defined by input coupling 1710a, median coupling 1713, and output coupling 1710b. In some aspects, a characteristic impedance of the input coupling 1710a and a characteristic impedance of the output coupling 1710b may be the same. Additionally, the median coupling 1713 may have a characteristic impedance that is the same as the input coupling 1710a and the output coupling 1710b. In other aspects, the first quarter wave stub 1715a may have a characteristic impedance and the second quarter wave stub 1715b may have a characteristic impedance. The characteristic impedances of first quarter wave stub 1715a and second quarter wave stub 1715b may be the same. Further, the characteristic impedances of first quarter wave stub 1715a and second quarter wave stub 1715b may be the same as or matched to that of one or more of the input coupling 1710a, the output coupling 1710b, or the median coupling 1713. The couplings 1710a, 1710b, and 1713 can all be realized by using printed or lumped inductors and/or capacitors or a combination thereof, individually and independently. At the frequency $f_0$ at which the stub resonators' 1715a and 1715b electrical length is equal to the quarter-wavelength of the frequency $f_0$, the impedance of the stub resonators 1715a and 1715b are large and the stub resonators 1715a and 1715b appear to be an open circuit to ground at the junction with the input coupling 1710a and median coupling 1713 (for stub resonator 1715a) and the output coupling 1710b and median coupling 1713 (for stub resonator 1715b). At $f_0$, the total input signal power is thus transmitted from an input port 1701 to an output port 1711. At frequencies not equal to $f_0$, some or most of the input signal is reflected at input port 1701 due to the low impedance effectively created by of the quarter wave stubs 1715a and 1715b operating out of resonance.

Figure 18:
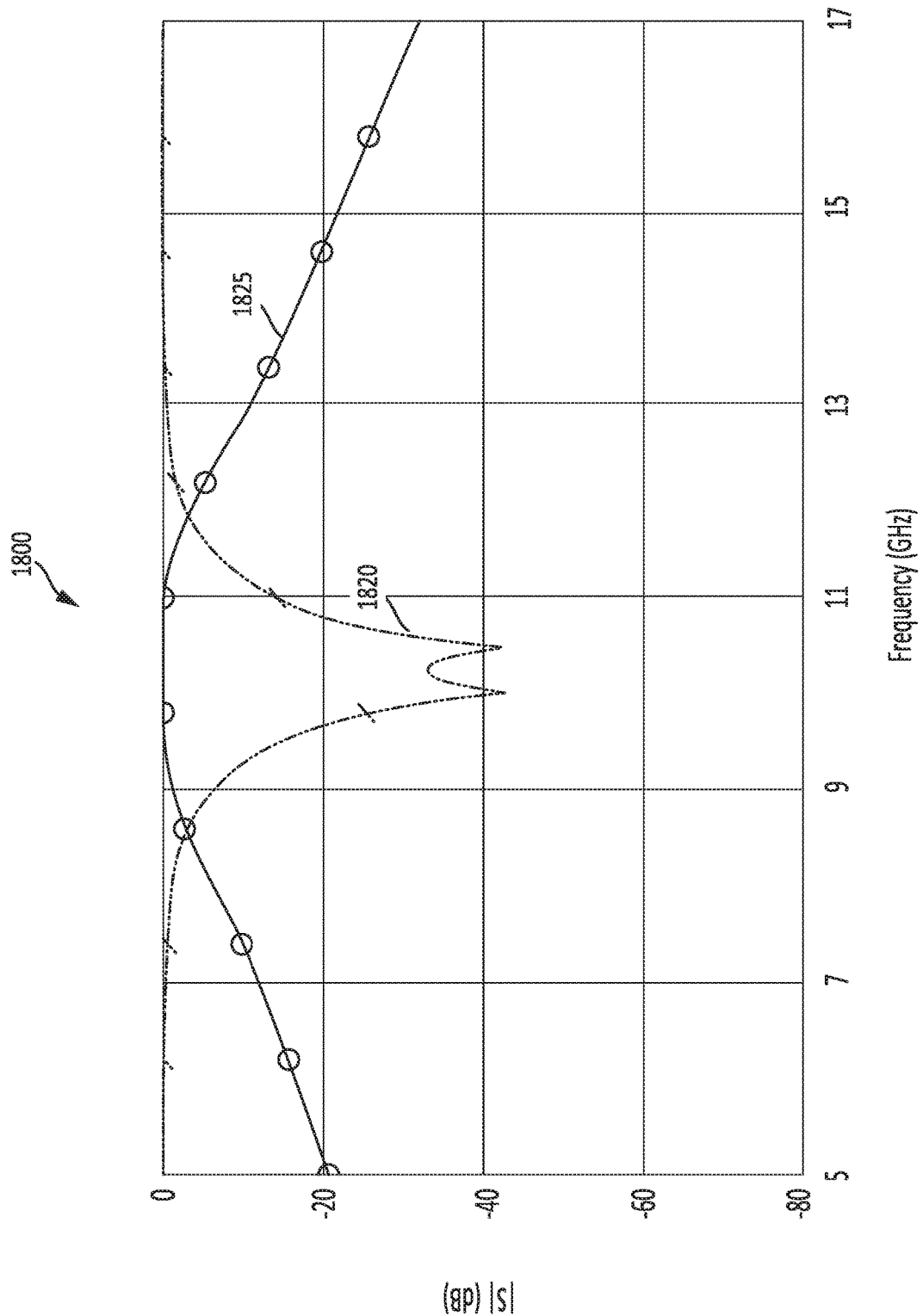
FIG. 18 is a frequency response of the basic 2-pole bandpass filter shown in FIG. 17.

FIG. 18 depicts a frequency response of the basic 2-pole bandpass filter 1700 shown in FIG. 17. The 2-port S-parameters of a filter S(1,1) is the input port voltage reflection coefficient (shown as curve 1820 in FIG. 18) and S(2,1) is the forward voltage gain (shown as curve 1825 in FIG. 18). In FIG. 18 the center or resonant frequency $f_0 \approx 10$ GHz.

FIG. 19 is a schematic diagram of a 2-pole bandpass filter 1900 configured with two inductors. The bandpass filter 1900 has an input port 1901 and an output port 1911. In one aspect, the input port 1901 may be coupled via an input coupling 1910a to a first quarter-wave stub 1915a through a first inductor 1904a ($L_1$). The output port 1911 may be coupled via an output coupling 1911b to a second quarter-wave stub 1915b through a second inductor 1904b ($L_2$). Median coupling 1913 couples together the input coupling 1910a and output coupling 1910b. The couplings 1910a, 1910b, and 1913 can all be realized by using printed or lumped inductors and/or capacitors or a combination thereof, individually and independently. A first shunt branch 1927a may be defined as the combination of the first inductor 1904a ($L_1$) coupled in series with the first quarter-wave stub 1915a. A second shunt branch 1927b may be defined as the combination of the second inductor 1904b ($L_2$) coupled in series with the second quarter-wave stub 1915b. It may be recognized that the shunt branches 1927a,b are connected in parallel with each other to a transmission line defined by input coupling 1910a, median coupling 1913, and output coupling 1910b. At the resonance frequency, $f_0$, when the two stubs of the resonator 1900 have a quarter-wave electrical length, the shunt branches 1927a and 1927b still appears to be open circuits.

Figure 20:
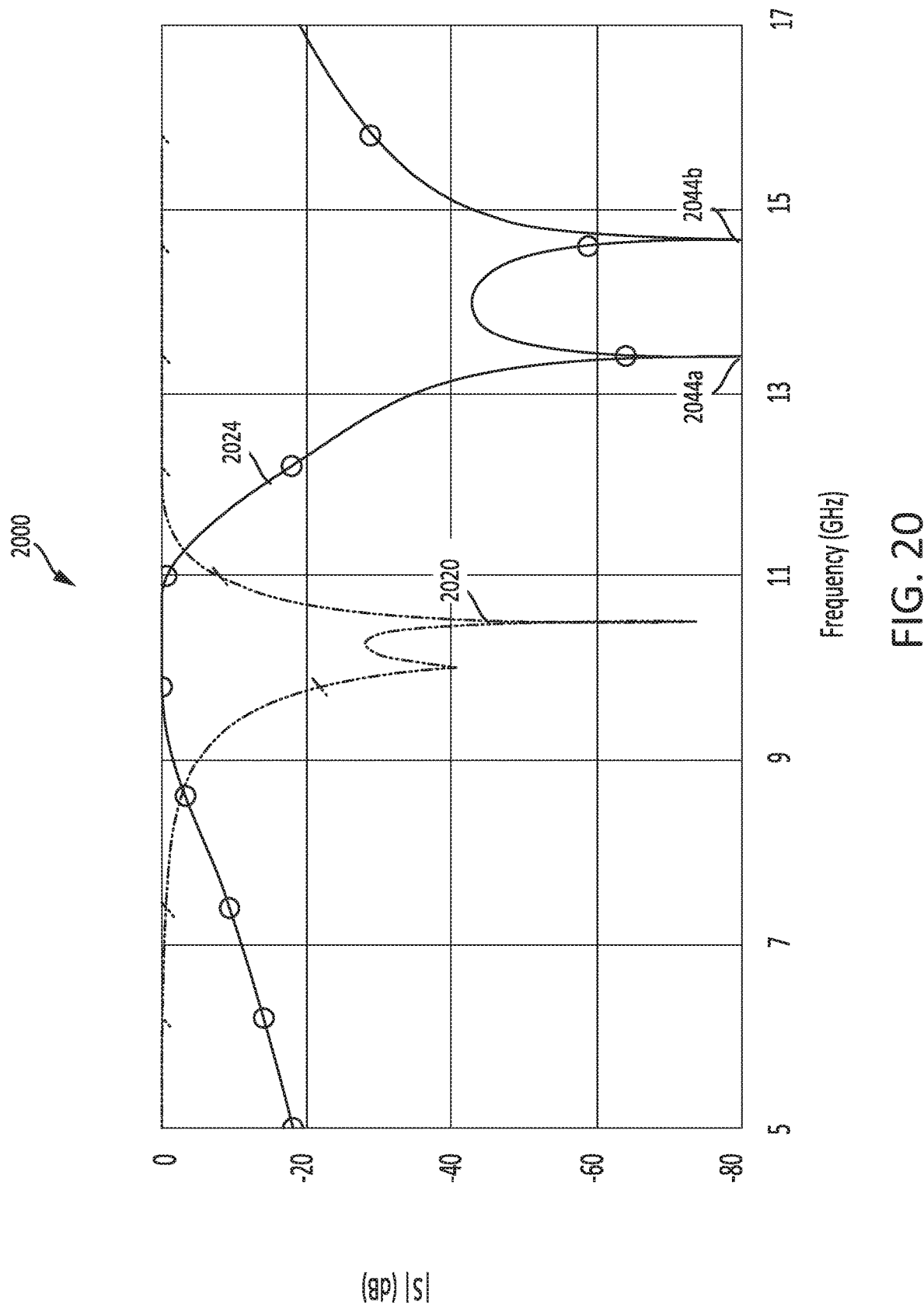
FIG. 20 is a frequency response of the 2-pole bandpass filter configured with two inductors $L_1$ and $L_2$ added to the quarter-wave resonators shown in FIG. 19, according to at least one aspect of the present disclosure.

FIG. 20 is simulation 2000 of a frequency response of the 2-pole bandpass filter 1900 configured with two inductors $L_1$ and $L_2$ added to the quarter-wave resonators as depicted in FIG. 19. The S(1,1) input port voltage reflection coefficient is depicted as curve 2020 and the S(2,1) forward voltage gain is depicted as curve 2024. As depicted in FIG. 20, two transmission zeros 2044a and 2044b are illustrated. The two transmission zeros 2044a and 2044b each has a forward voltage gain of around −80 dB. Transmission zero 2044a is induced at around 13.5 GHz, above the passband (10 GHz) and transmission zero 2044b is induced at around 14.5 GHz, above the passband (10 GHz).

Figure 21:
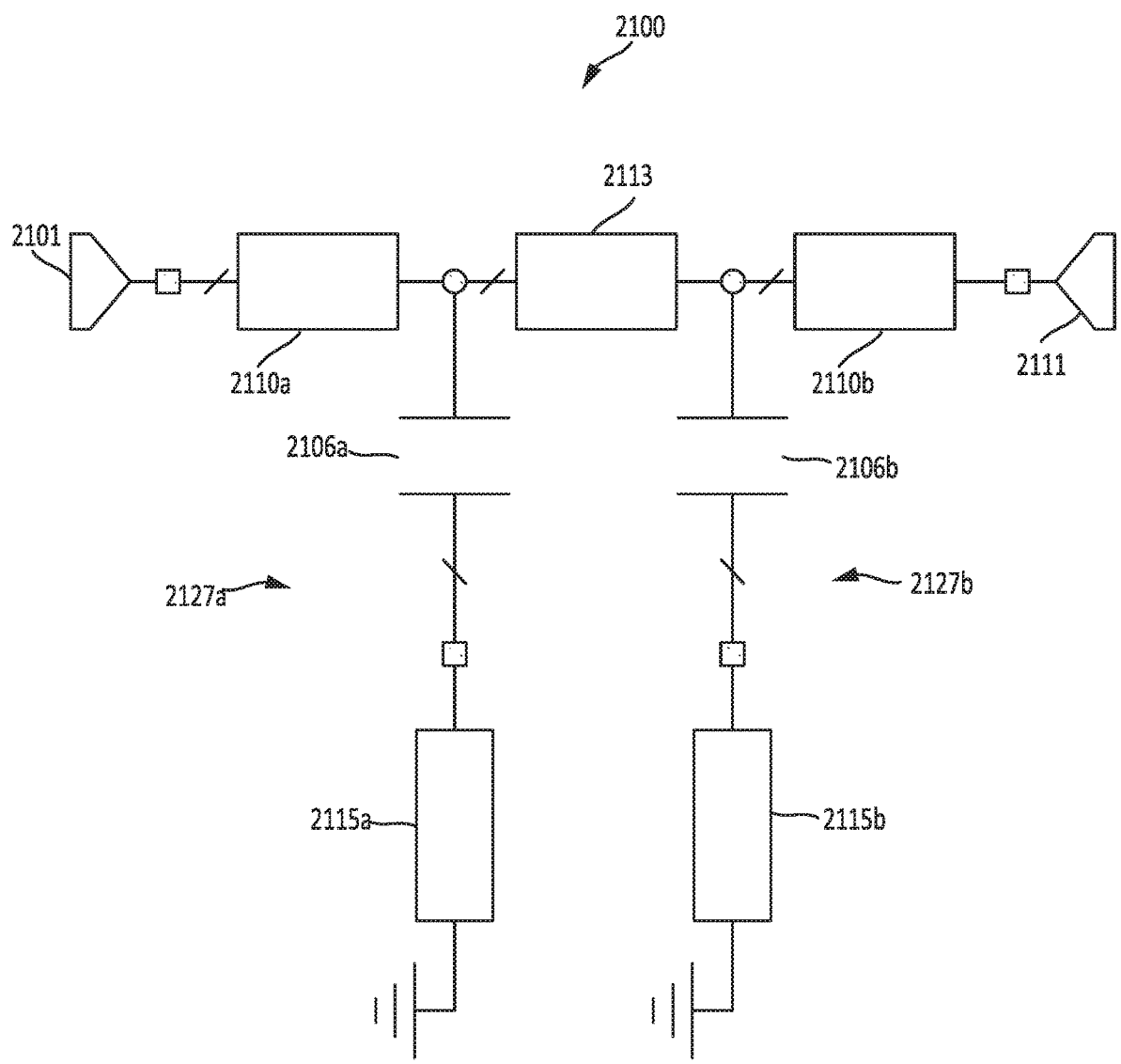
FIG. 21 is a schematic diagram of a 2-pole bandpass filter configured with two capacitors $C_1$ and $C_2$ added to the quarter-wave resonators as shown, according to at least one aspect of the present disclosure.

FIG. 21 is a schematic diagram of a 2-pole bandpass filter 2100 configured with two capacitors. The bandpass filter 2100 has an input port 2101 and an output port 2111. In one aspect, the input port 2101 may be coupled via an input coupling 2110a to a first quarter-wave stub 2115a through a first capacitor 2106a ($C_1$). The output port 2111 may be coupled via an output coupling 2111b to a second quarter-wave stub 2115b through a second capacitor 1906b ($C_2$). Median coupling 2113 couples together the input coupling 2110a and output coupling 2110b. The couplings 2110a, 2110b, and 2113 can all be realized by using printed or lumped inductors and/or capacitors or a combination thereof, individually and independently. A first shunt branch 2127a may be defined as the combination of the first capacitor 2106a ($C_1$) coupled in series with the first quarter-wave stub 2115a. A second shunt branch 2127b may be defined as the combination of the second capacitor 2106b ($C_2$) coupled in series with the second quarter-wave stub 2115b. It may be recognized that the shunt branches 2127a,b are connected in parallel with each other to a transmission line defined by input coupling 2110a, median coupling 2113, and output coupling 2110b. At the resonance frequency, $f_0$, when the two stubs of the resonator 2100 have a quarter-wave electrical length, the shunt branches 2127a and 2127b still appears to be open circuits.

Figure 22:
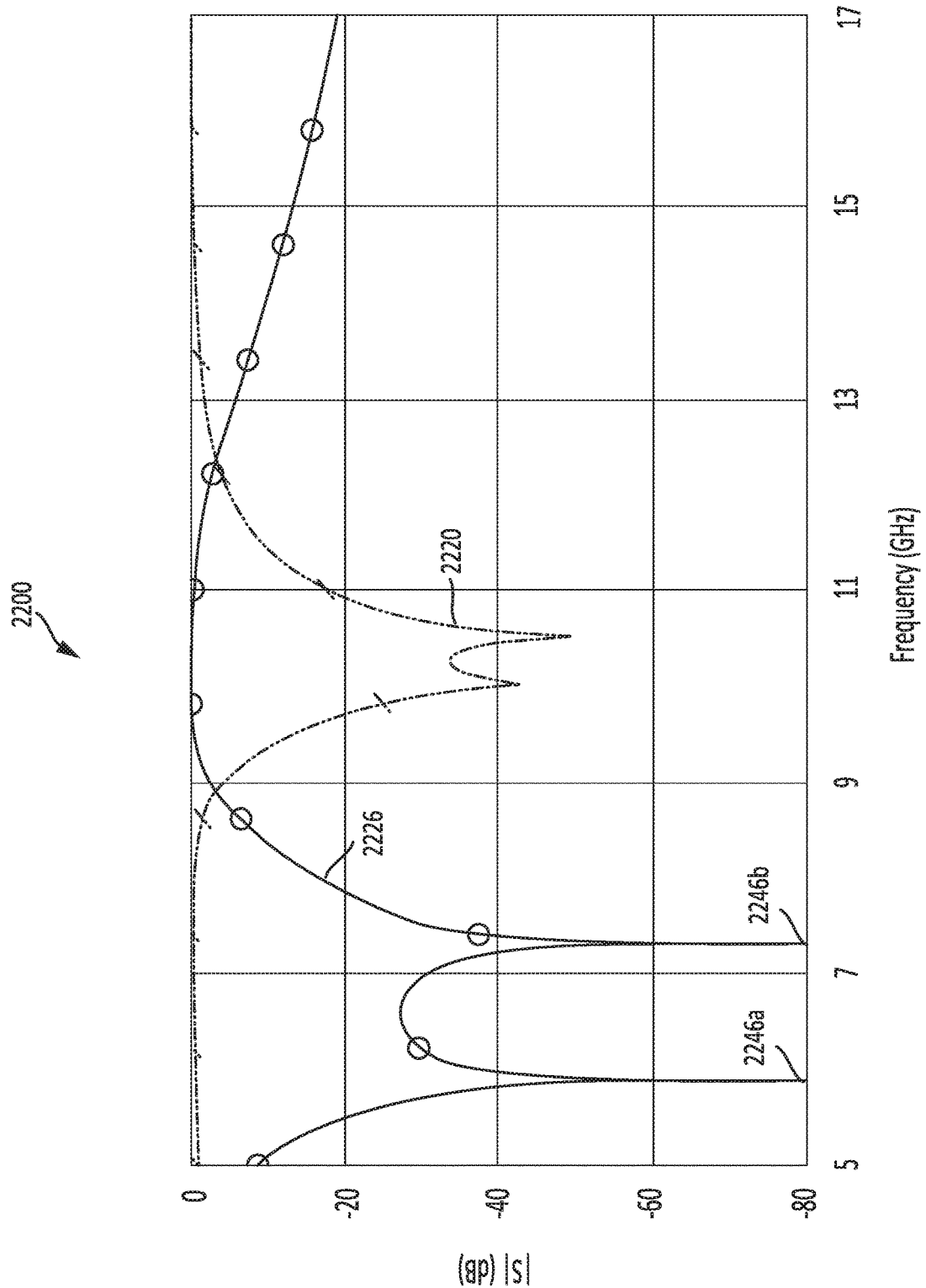
FIG. 22 is a frequency response of the 2-pole bandpass filter configured with two capacitors $C_1$ and $C_2$ added to the quarter-wave resonators shown in FIG. 21, according to at least one aspect of the present disclosure.

FIG. 22 is simulation 2200 of a frequency response of the 2-pole bandpass filter 2100 configured with two capacitors $C_1$ and $C_2$ added to the quarter-wave resonators as depicted in FIG. 21. The S(1,1) input port voltage reflection coefficient is depicted as curve 2220 and the S(2,1) forward voltage gain is depicted as curve 2226. As depicted in FIG. 22, two transmission zeros 2246a and 2246b are illustrated. The two transmission zeros 2246a and 2246b each has a forward voltage gain of around −80 dB. Transmission zero 2246a is induced at around 5.9 GHz, below the passband (10 GHz) and transmission zero 2246b is induced at around 7.2 GHz, below the passband (10 GHz).

Figure 23:
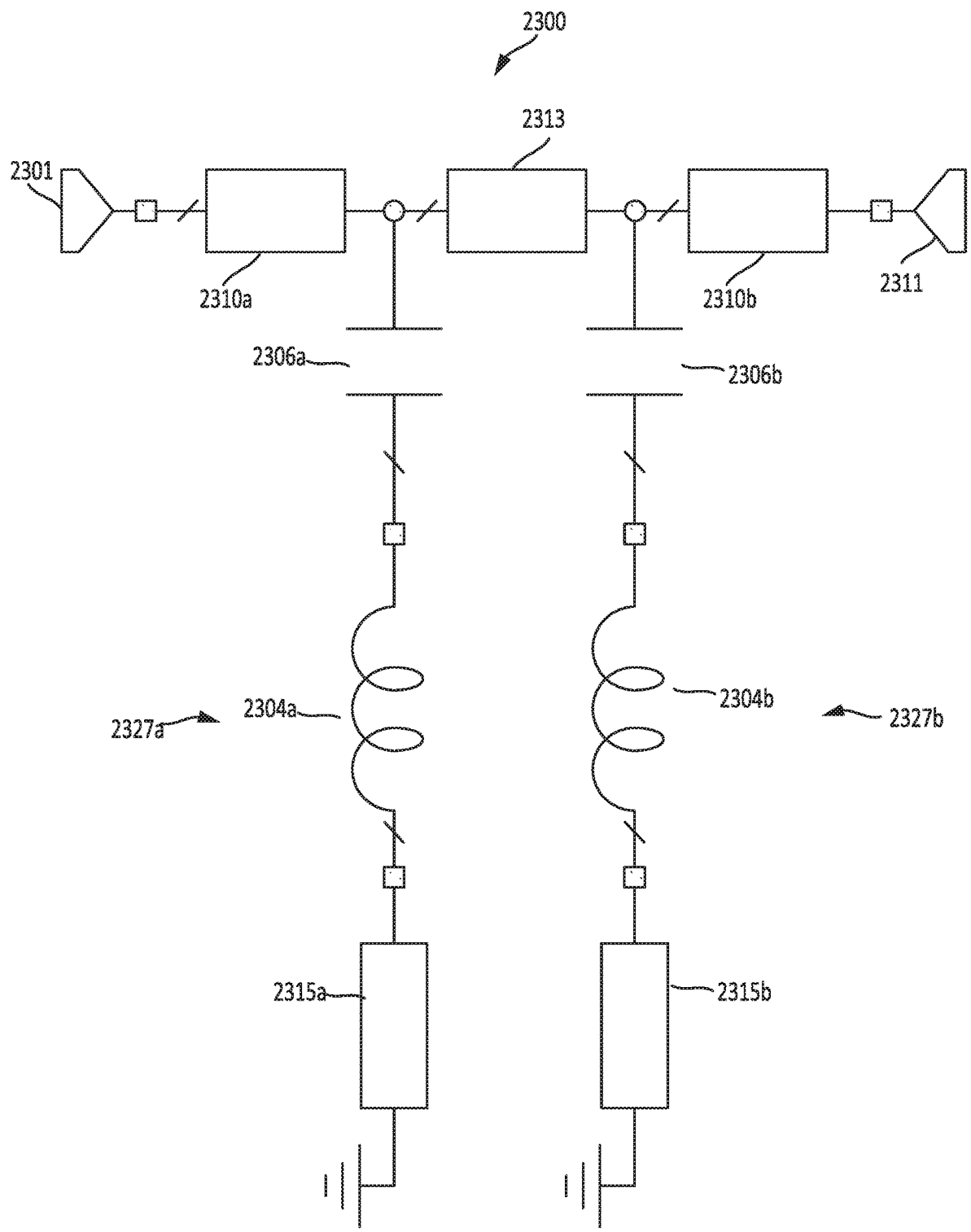
FIG. 23 is a schematic diagram of a 2-pole bandpass filter configured with two inductors $L_1$ and $L_2$ and two capacitors $C_1$ and $C_2$ and added to the quarter-wave resonators as shown, according to at least one aspect of the present disclosure.

FIG. 23 is a schematic diagram of a 2-pole bandpass filter 2300 configured with two inductors and two capacitors. The bandpass filter 2300 has an input port 2301 and an output port 2311. In one aspect, the input port 2301 may be coupled via an input coupling 2310a through a first inductor 2304a ($L_1$) in series with a first capacitor 2306a ($C_1$) to a first quarter-wave stub 2315a. The output port 2111 may be coupled via an output coupling 2310b through a second inductor 2304b ($L_2$) in series with a second capacitor 2306b ($C_2$) to a second quarter-wave stub 2315b. Median coupling 2313 couples together the input coupling 2310a and output coupling 2310b. The couplings 2310a, 2310b, and 2313 can all be realized by using printed or lumped inductors and/or capacitors or a combination thereof, individually and independently. A first shunt branch 2327a may be defined as the combination of the first inductor 2304a ($L_1$) coupled in series with first capacitor 2306a ($C_1$) which, in turn, is coupled in series with the first quarter-wave stub 2315a. A second shunt branch 2127b may be defined as the combination of the second inductor 2304b ($L_2$) coupled in series with second capacitor 2306b ($C_2$) which, in turn, is coupled in series with the second quarter-wave stub 2315b. It may be recognized that the shunt branches 2327a,b are connected in parallel with each other to a transmission line defined by input coupling 2310a, median coupling 2313, and output coupling 2310b. At the resonance frequency, $f_0$, when the two stubs of the resonator 2300 have a quarter-wave electrical length, the shunt branches 2327a and 2327b still appears to be open circuits.

Figure 24:
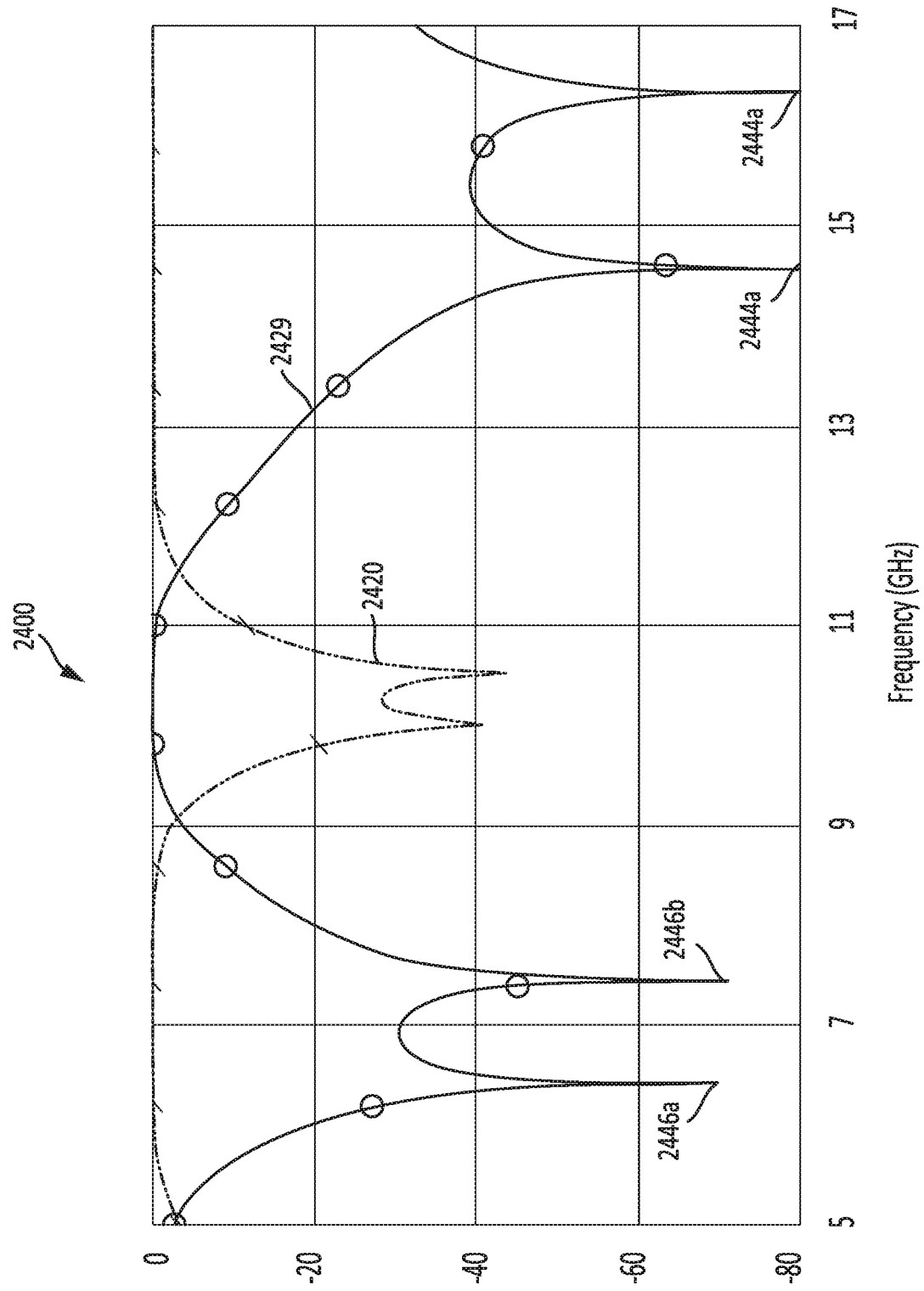
FIG. 24 is a frequency response of the 2-pole bandpass filter configured with two inductors $L_1$ and $L_2$ and two capacitors $C_1$ and $C_2$ added to the quarter-wave resonators shown in FIG. 23, according to at least one aspect of the present disclosure.

FIG. 24 is simulation 2400 of a frequency response of the 2-pole bandpass filter 2300 configured with two inductors $L_1$ and $L_2$ and two capacitors $C_1$ and $C_2$ added to the quarter-wave resonators as depicted in FIG. 23. The S(1,1) input port voltage reflection coefficient is depicted as curve 2420 and the S(2,1) forward voltage gain is depicted as curve 2429. As depicted in FIG. 24, two inductive transmission zeros 2444a and 2444b and two capacitive transmission zeros 2446a and 2446b are illustrated. The two inductive transmission zeros 2444a and 2444b, each above the passband (10 GHz), has a forward voltage gain of around −80 dB. The two capacitive transmission zeros 2446a and 2446b, each below the passband (10 GHz), has a forward voltage gain of around −70 dB.

Figure 25:
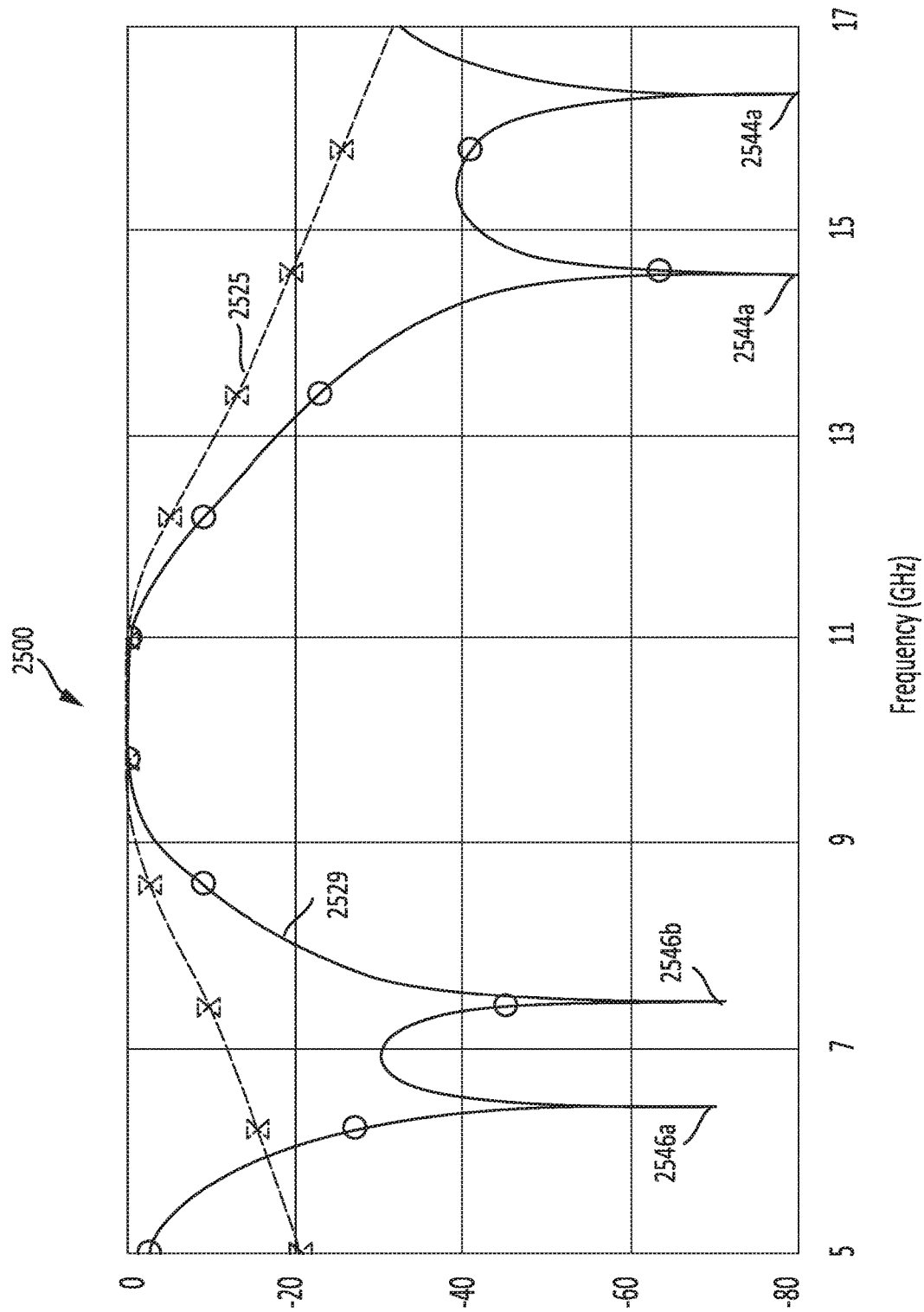
FIG. 25 is a comparison of the frequency responses of the 2-pole bandpass filter shown in FIG. 17 and the 2-pole bandpass filter configured with two inductors $L_1$ and $L_2$ and two capacitors $C_1$ and $C_2$ added to the quarter-wave resonators shown in FIG. 23, according to at least one aspect of the present disclosure.

FIG. 25 is a comparison 2500 of the frequency responses of the 2-pole bandpass filter 1700 shown in FIG. 17 and the 2-pole bandpass filter 2300 configured with two inductors $L_1$ and $L_2$ and two capacitors $C_1$ and $C_2$ added to the quarter-wave resonators shown in FIG. 23, according to at least one aspect of the present disclosure. The frequency response of the 2-pole bandpass filter 1700 is depicted as curve 2525 and the frequency response of the 2-pole bandpass filter 2300 configured with two inductors $L_1$ and $L_2$ and two capacitors $C_1$ and $C_2$ is depicted in curve 2529. It may readily be observed that the bandpass region is well defined by the two pairs of transmission zeros 2546a,b and 2544a,b. The response of the In other words, it is a comparison of the frequency response of a 2-pole bandpass filter with and without induced transmission zeros.

Figure 26:
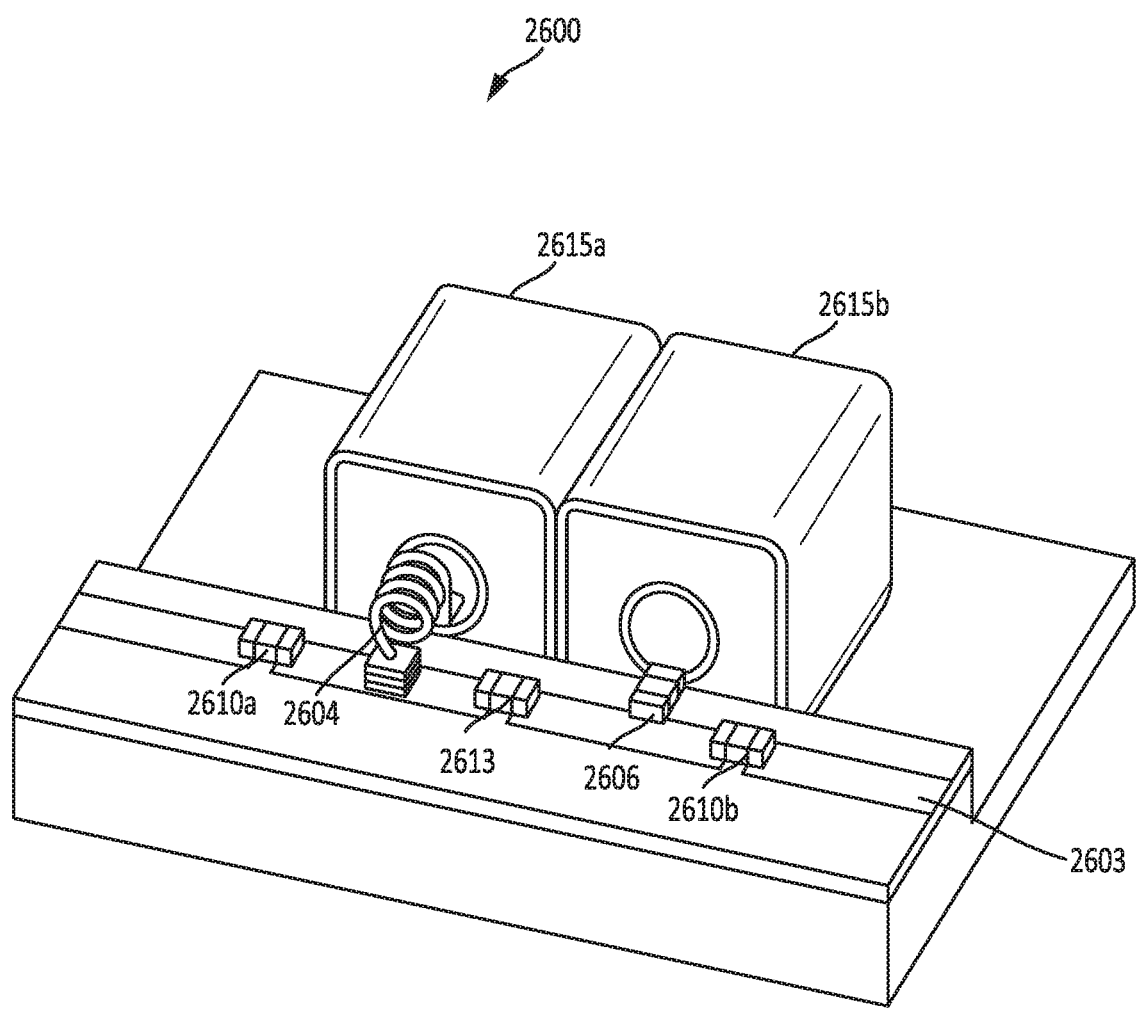
FIG. 26 is a perspective view of one configuration of a 2-pole ceramic resonator filter. The 2-pole ceramic filter tested to demonstrate the feasibility of the design, according to at least one aspect of the present disclosure.

FIG. 26 is a perspective view of one configuration of a 2-pole ceramic resonator filter 2600. The 2-pole ceramic filter was tested to demonstrate the feasibility of the design. The resonator filter 2600 comprises a microstrip 2603 with input coupling capacitor 2610a output coupling capacitor 2610b, and median coupling capacitor 2613. Two quarter-wave ceramic resonators 2615a,b are depicted, the first coupled to the microstrip 2603 via inductor $L_1$ 2604, and the second coupled to the microstrip 2603 via capacitor $C_1$ 2606. The 2-pole ceramic filter 2600 was tested to demonstrate the feasibility of the design, according to at least one aspect of the present disclosure. Experimental data for several configurations of 2-pole ceramic resonator filters is presented hereinbelow.

Figure 27A:
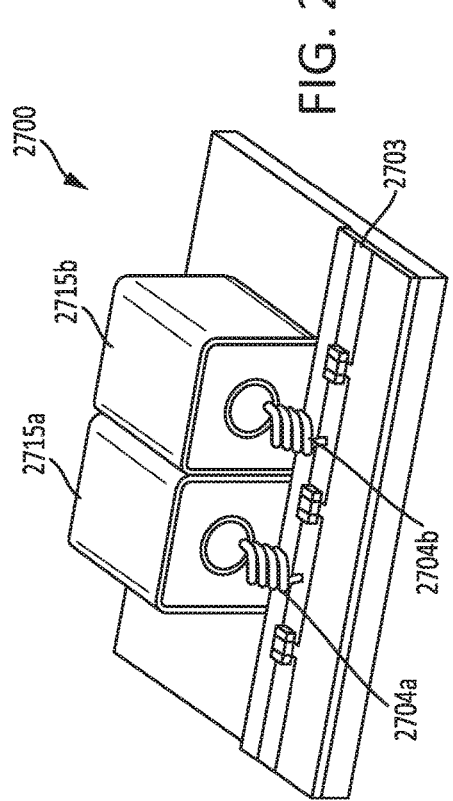
FIG. 27A is a perspective view of one configuration of a 2-pole ceramic resonator filter having a pair of inductors.
Figure 27B:
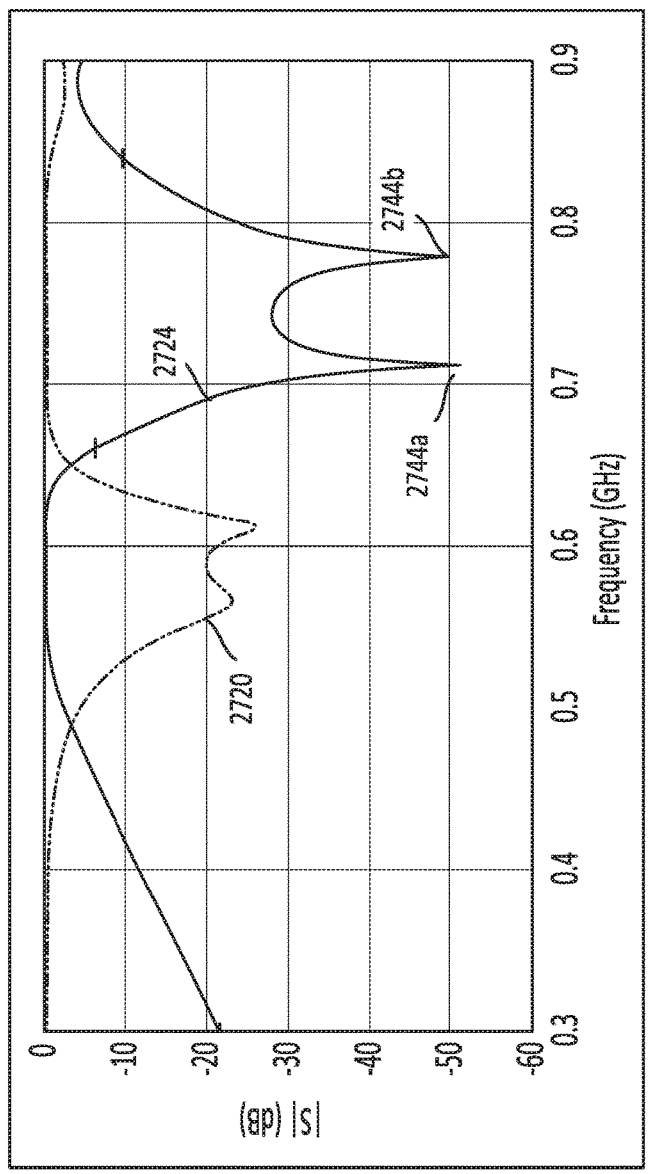
FIG. 27B is a frequency response of a 2-pole ceramic resonator filter configured with two inductors $L_1$ and $L_2$ added to the quarter-wave ceramic resonators as shown, according to at least one aspect of the present disclosure.

FIG. 27A is a perspective view of one configuration of a 2-pole ceramic resonator filter 2700. The resonator filter 2700 comprises a microstrip 2703. Two quarter-wave ceramic resonators 2715a,b are depicted, the first coupled to the microstrip 2703 via inductor $L_1$ 2704a, and the second coupled to the microstrip 2703 via inductor $L_2$ 2704b. FIG. 27B depicts the S(1,1) input port voltage reflection coefficient as curve 2720. The forward voltage gain depicted in curve 2724 is for a 2-pole ceramic resonator filter configured with the two inductors $L_1$ 2704a and $L_2$ 2704b added to the quarter-wave ceramic resonators 2715a,b as shown, according to at least one aspect of the present disclosure. The addition of the two inductors $L_1$ and $L_2$ creates two transmission zeros 2744a,b above the passband.

Figure 28A:
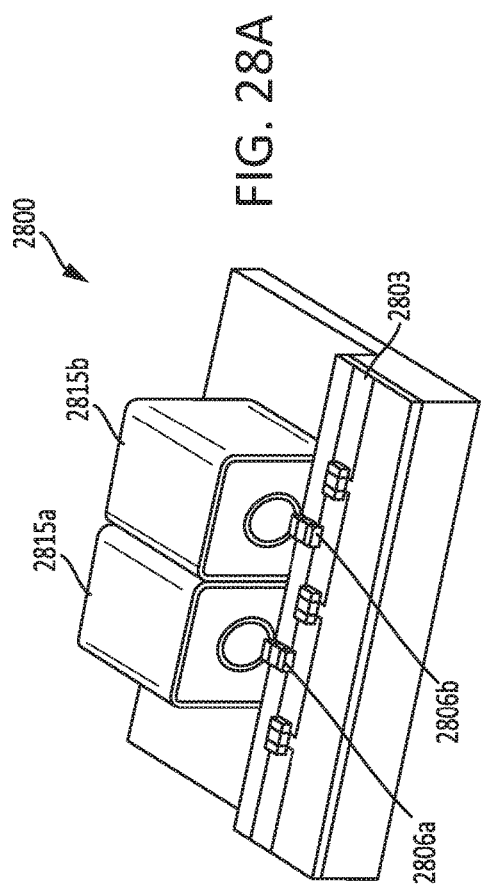
FIG. 28A is a perspective view of one configuration of a 2-pole ceramic resonator filter having a pair of capacitors.
Figure 28B:
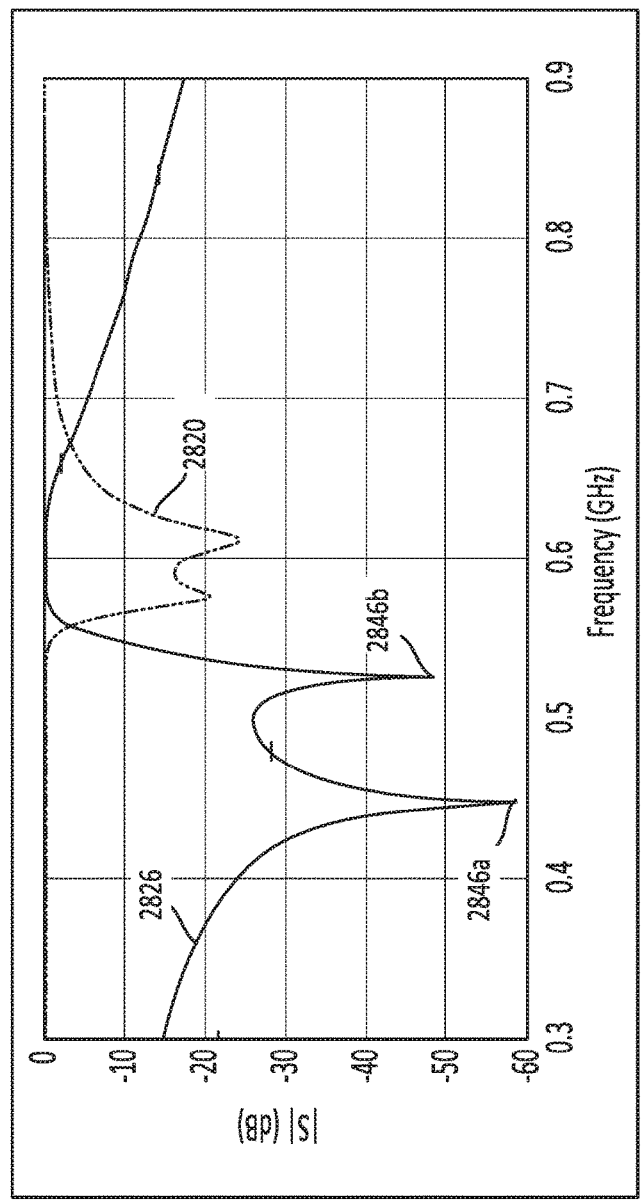
FIG. 28B is a frequency response of a 2-pole ceramic resonator filter configured with two capacitors $C_1$ and $C_2$ added to the quarter-wave ceramic resonators as shown in FIG. 27, according to at least one aspect of the present disclosure.

FIG. 28A is a perspective view of one configuration of a 2-pole ceramic resonator filter 2800. The resonator filter 2800 comprises a microstrip 2803. Two quarter-wave ceramic resonators 2815a,b are depicted, the first coupled to the microstrip 2803 via capacitor $C_1$ 2806a, and the second coupled to the microstrip 2803 via capacitor $C_2$ 2806b. FIG. 28B depicts the S(1,1) input port voltage reflection coefficient is depicted as curve 2820. The forward voltage gain depicted in curve 2826 is for a 2-pole ceramic resonator filter configured with the two capacitors $C_1$ 2806a and $C_2$ 2806b added to the quarter-wave ceramic resonators 2815a,b as shown The addition of the two capacitors $C_1$ and $C_2$ creates two transmission zeros 2846a,b below the passband.

Figure 29A:
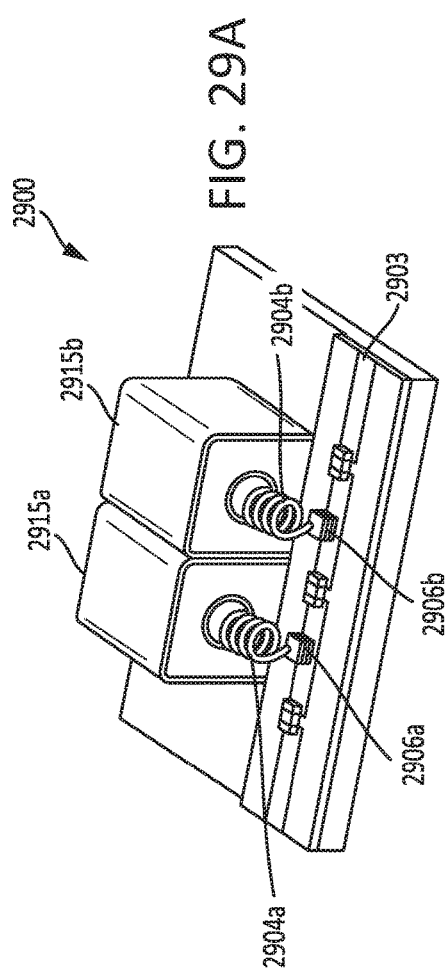
FIG. 29A is a perspective view of one configuration of a 2-pole ceramic resonator filter each resonator having an inductor in series with a capacitor.
Figure 29B:
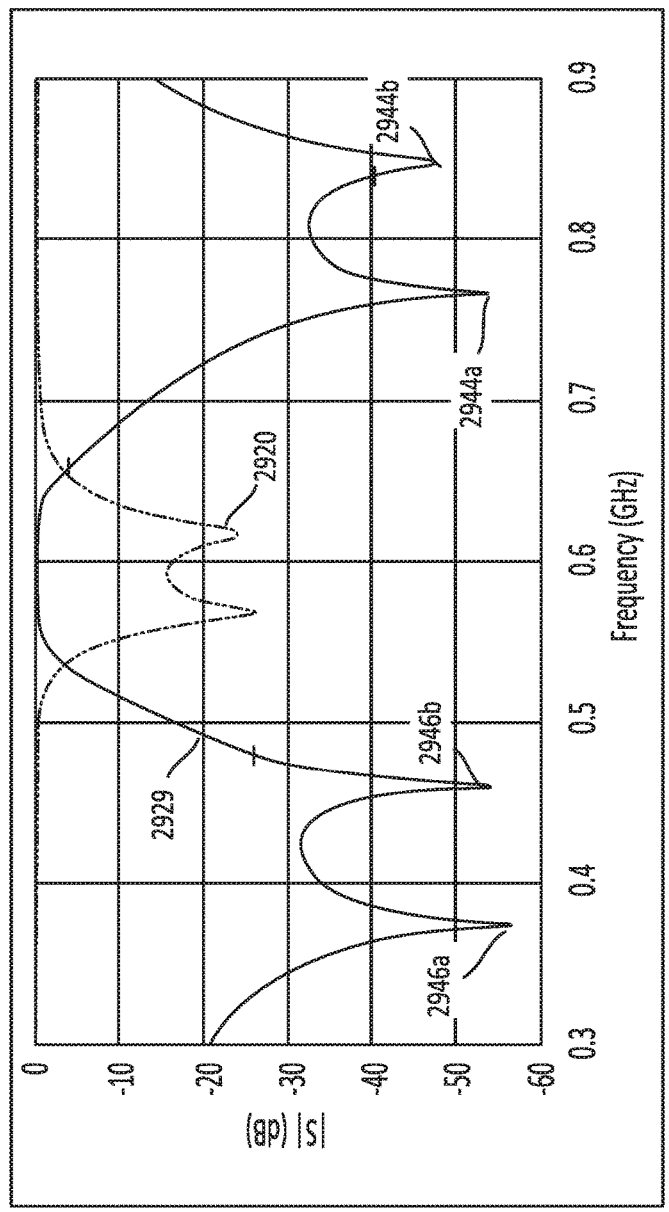
FIG. 29B is a frequency response of a 2-pole ceramic resonator filter configured with two inductors $L_1$ and $L_2$ and two capacitors $C_1$ and $C_2$ added to the quarter-wave ceramic resonators as shown, according to at least one aspect of the present disclosure.

FIG. 29A is a perspective view of one configuration of a 2-pole ceramic resonator filter 2900. The resonator filter 2900 comprises a microstrip 2903. Two quarter-wave ceramic resonators 2915a,b are depicted, the first coupled to the microstrip 2903 via inductor $L_1$ 29064a in series with capacitor $C_1$ 2906a, and the second coupled to the microstrip 2903 via inductor $L_2$ 29064b in series capacitor $C_2$ 2906b. FIG. 28B depicts the S(1,1) input port voltage reflection coefficient as curve 2920. The forward voltage gain depicted in curve 2929 is for a 2-pole ceramic resonator filter configured with inductor $L_1$ 29064a in series with capacitor $C_1$ 2906a and inductor $L_2$ 29064b in series capacitor $C_2$ 2906b added to the quarter-wave ceramic resonators as shown. The addition of the two inductors $L_1$ and $L_2$ create two transmission zeros 2944a,b above the passband, and the two capacitors $C_1$ and $C_2$ create two transmission zeros 2946a,b below the passband.

3-Pole Filter

Figure 30:
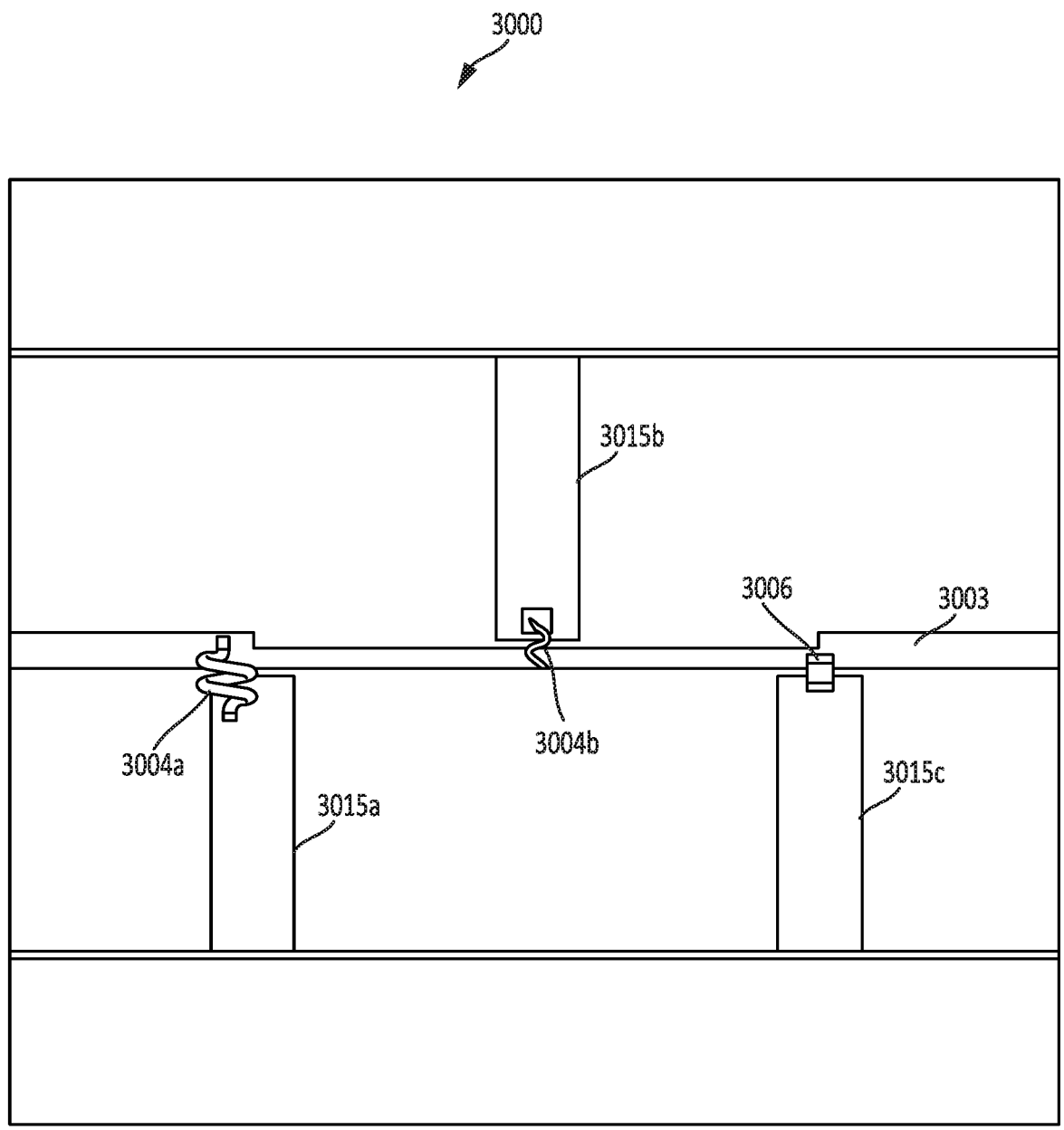
FIG. 30 is a diagram of one configuration of a 3-pole printed microstrip filter. The 2-pole ceramic filter tested to demonstrate the feasibility of the design.

FIG. 30 is a diagram of one configuration of a 3-pole printed microstrip filter 3000. The 3-pole printed microstrip filter 3000 shown in FIG. 30 includes two inductors 3004a and 3004b and one capacitor 3006 added to the printed microstrip 3003. Inductor 3004a couples quarter-wave stub 3015a to the microstrip 3003. Inductor 3004b couples quarter-wave stub 3015b to the microstrip 3003. Capacitor 3006 couples quarter-wave stub 3015c to the microstrip 3003. Experimental data for several configurations of 3-pole printed microstrip filters is presented hereinbelow.

Figure 31:
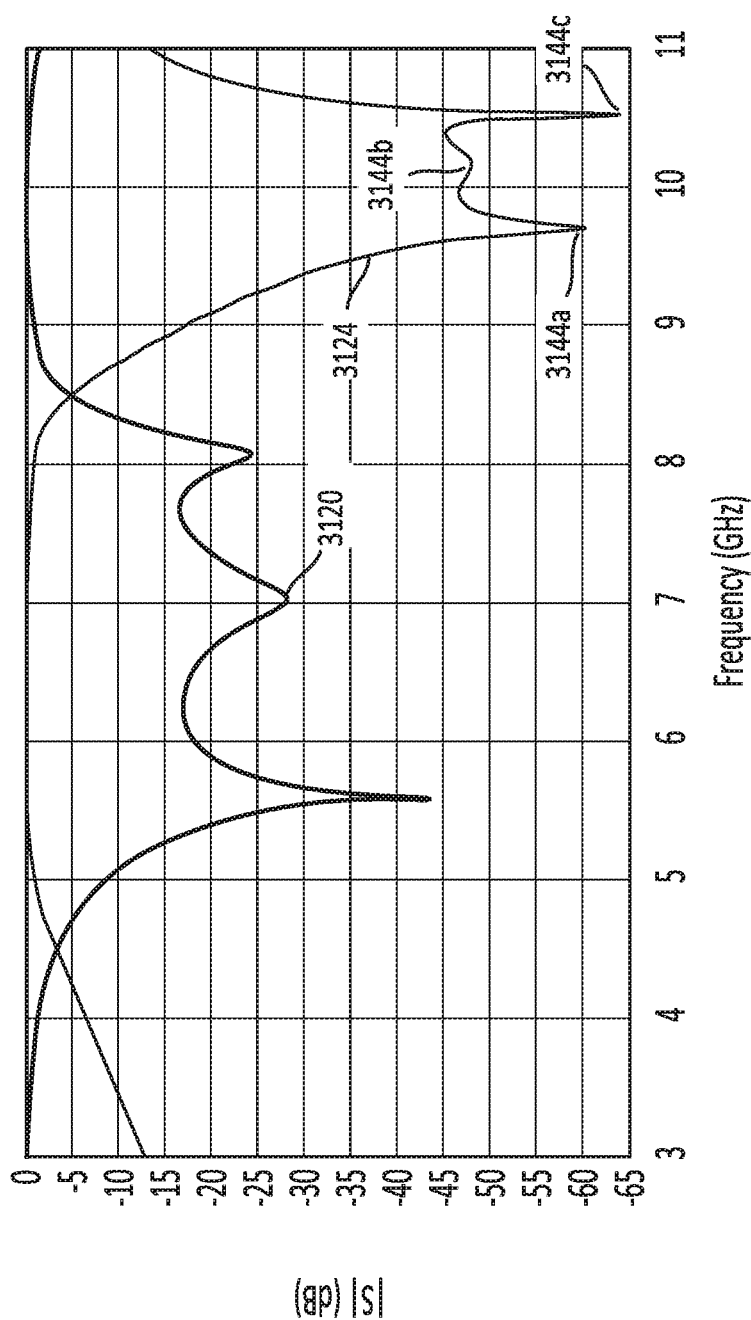
FIG. 31 depicts experimental results of a frequency response of a 3-pole printed microstrip filter configured with three inductors $L_1$, $L_2$, and $L_3$ added to the 3-pole printed microstrip filter as shown, according to at least one aspect of the present disclosure.

FIG. 31 depicts experimental results of a frequency response 3124 of a 3-pole printed microstrip filter 3000 configured with three inductors $L_1$, $L_2$, and $L_3$ added to the 3-pole printed microstrip filter (instead of two inductors and a capacitor as depicted in FIG. 30), according to at least one aspect of the present disclosure. The S(1,1) input port voltage reflection coefficient is depicted as curve 3120 The addition of the three inductors $L_1$, $L_2$, and $L_3$ creates three transmission zeros 3144a,b,c above the passband.

Figure 32:
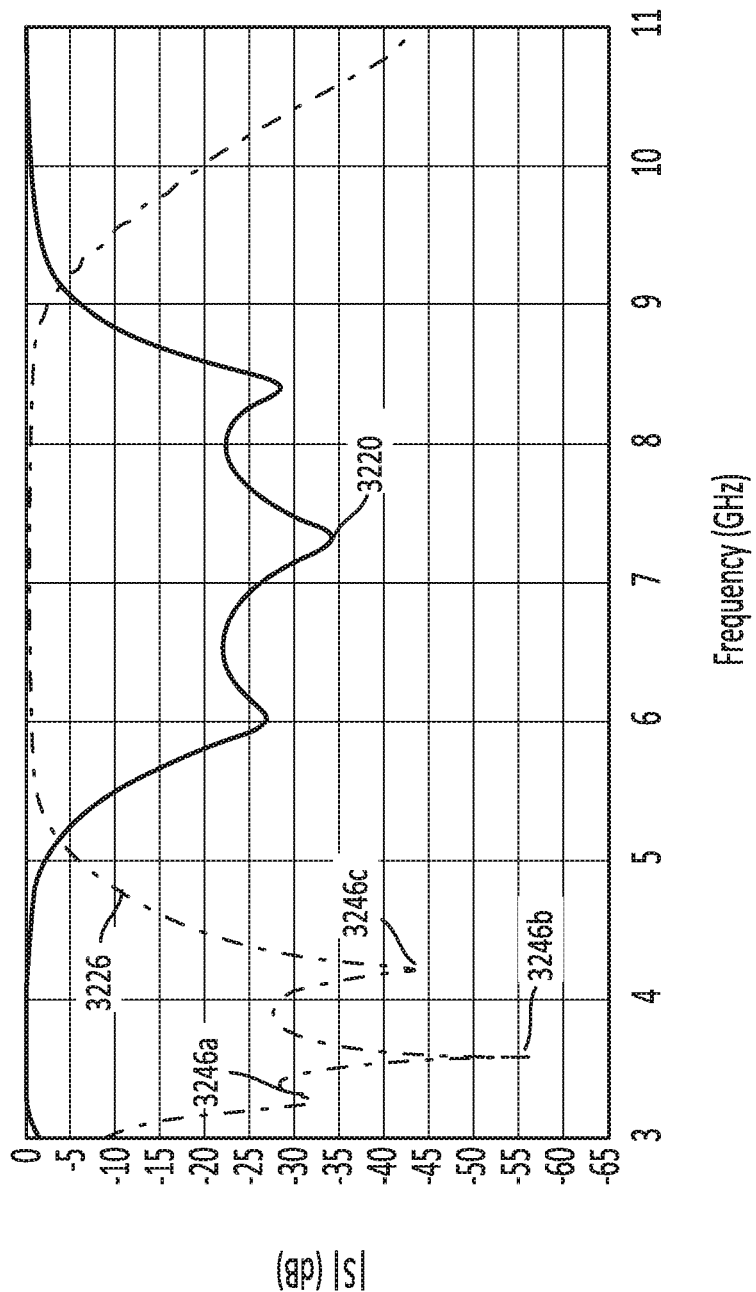
FIG. 32 depicts experimental results of a frequency response of a 3-pole printed microstrip filter configured with three capacitors $C_1$, $C_2$, and $C_3$ added to the 3-pole printed microstrip filter as shown, according to at least one aspect of the present disclosure.

FIG. 32 depicts experimental results of a frequency response 3226 of a 3-pole printed microstrip filter 3000 configured with three capacitors $C_1$, $C_2$, and $C_3$ added to the 3-pole printed microstrip filter (instead of two inductors and a capacitor as depicted in FIG. 30), according to at least one aspect of the present disclosure. The S(1,1) input port voltage reflection coefficient is depicted as curve 3220. The addition of the three capacitors $C_1$, $C_2$, and $C_3$ creates three transmission zeros 3246a,b,c below the passband.

Figure 33:
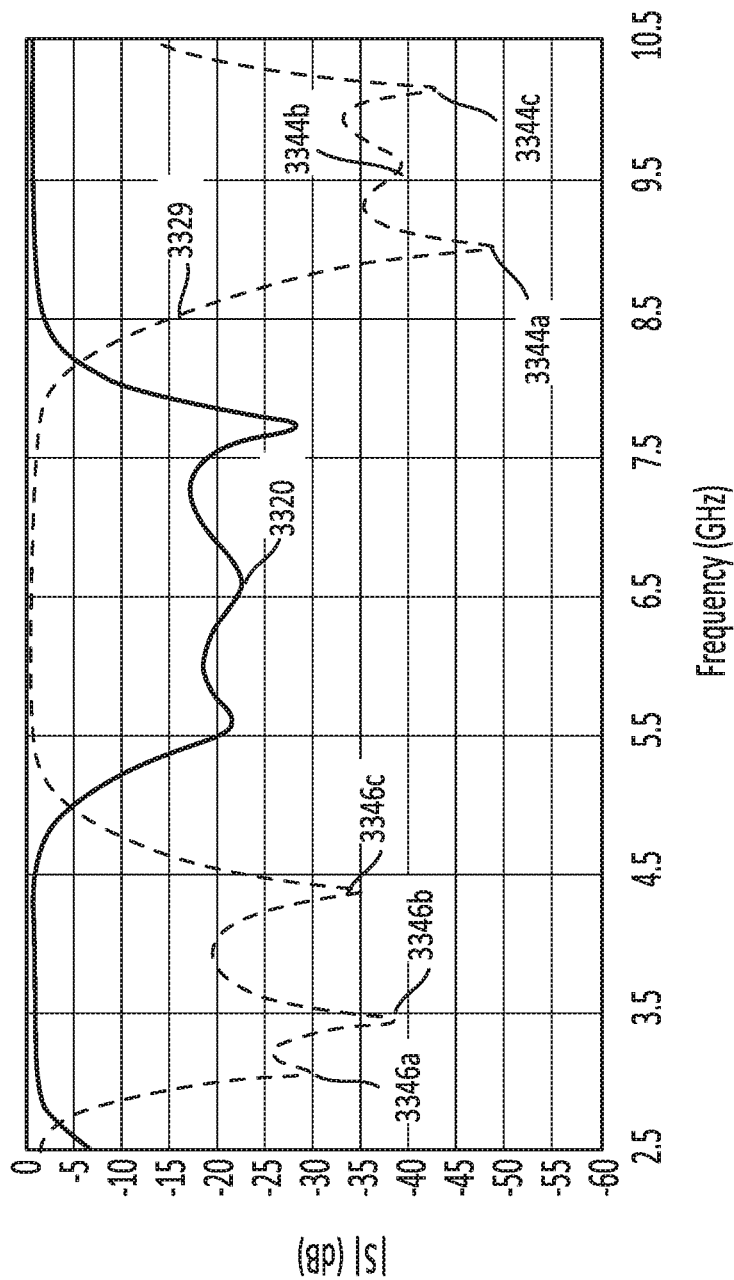
FIG. 33 depicts experimental results of a frequency response of a 3-pole printed microstrip filter configured with three inductors $L_1$, $L_2$, and $L_3$ and three capacitors $C_1$, $C_2$, and $C_3$ added to the 3-pole printed microstrip filter as shown, according to at least one aspect of the present disclosure.

FIG. 33 depicts experimental results of a frequency response 3329 of a 3-pole printed microstrip filter 3000 configured with three inductors $L_1$, $L_2$, and $L_3$ and $C_1$, $C_2$, and $C_3$ added to the 3-pole printed microstrip filter in series: $L_1$ in series with $C_1$, $L_2$ in series with $C_2$ and $L_3$ in series with $C_3$ (instead of two inductors and a capacitor as depicted in FIG. 30), according to at least one aspect of the present disclosure. The S(1,1) input port voltage reflection coefficient is depicted as curve 3320. The addition of the three inductors $L_1$, $L_2$, and $L_3$ introduces three transmission zeros above the passband 3344a,b,c and the addition of the three capacitors $C_1$, $C_2$, and $C_3$ introduces three transmission zeros below the passband 3346a,b,c for a total of six transmission zeros.

3-section Bandpass Filters

Figure 34:
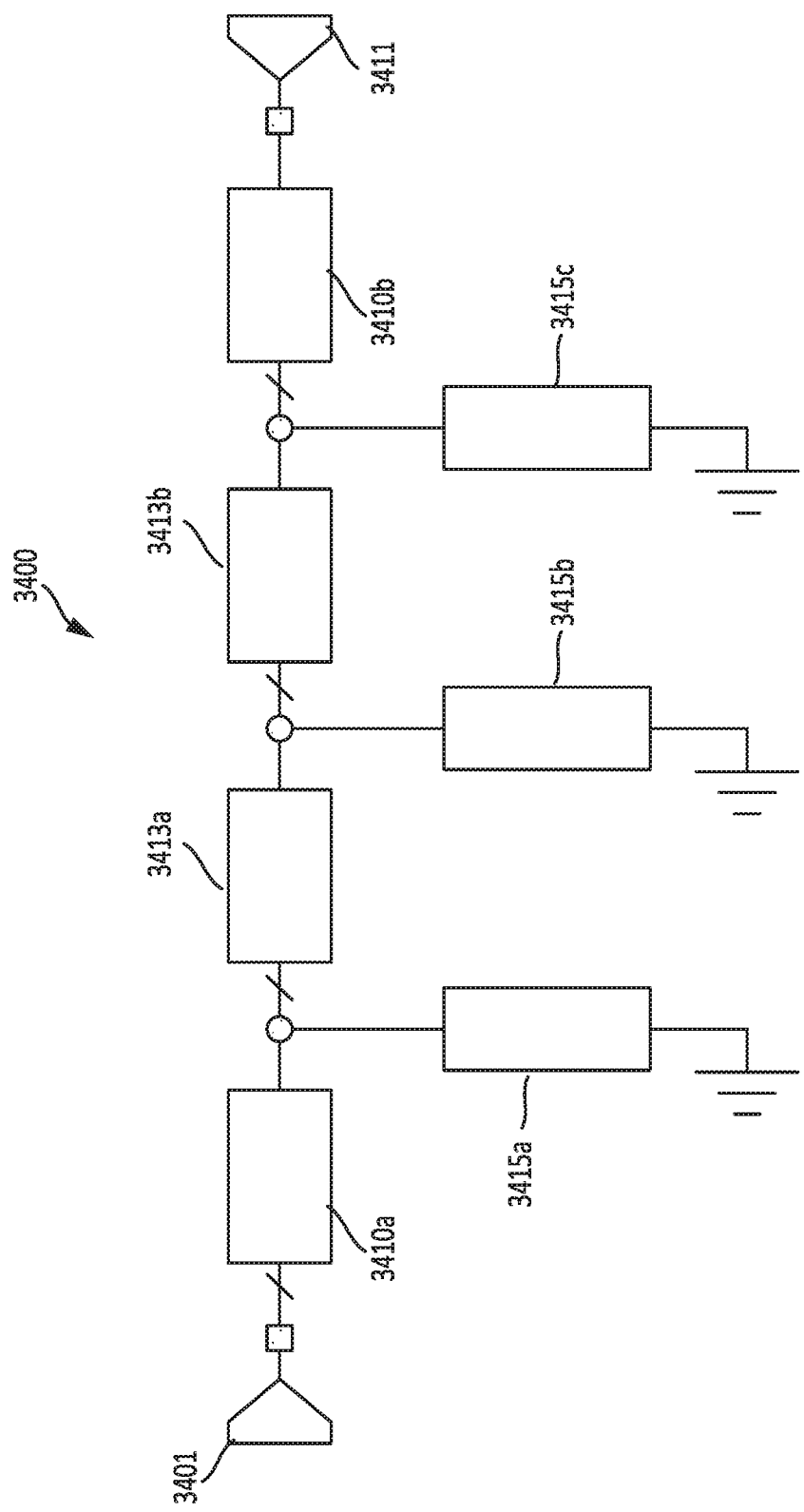
FIG. 34 is a schematic diagram of a 3-section quarter-wave bandpass filter. B1, B2, and B3 represent the 3 quarter-wave resonators.

FIG. 34 is a schematic diagram of a basic 3-pole bandpass filter 3400. Three quarter-wave stubs 3415a,b,c are provided, each having an electrical length of 90° at a resonance frequency $f_0$. The basic 3-pole bandpass filter 3400 has an input port 3401 and an output port 3411. The input port 3401 may be coupled via an input coupling 3410a to a first quarter-wave stub 3415a, and the output port 3411 may be coupled via an output coupling 3410b to the third quarter wave stub 1715c. The input coupling 3410a and the output coupling 3410b may be further coupled together by two median couplings 3413a,b in series. The second quarter-wave stub 3415b may be coupled between the two medial couplings 3413a,b. It may be recognized that the quarter-wave stubs 3415a,b,c are mutually connected in parallel with each other to a transmission line defined by input coupling 3410a, median couplings 3413a,b, and output coupling 3410b. In some aspects, the characteristic impedance of input coupling 3410a and the characteristic impedance of output coupling 3410b may be the same. Additionally, the two median couplings 3413a,b may each have a characteristic impedance and the characteristic impedances of the two median couplings 3413a,b be the same as the input coupling 3410a and the output coupling 3410b. In other aspects, the first quarter wave stub 3415a may have a characteristic impedance, the second quarter wave stub 3415b may have a characteristic impedance, and the third quarter wave stub 3415c may have a characteristic impedance. The characteristic impedances of the three quarter wave stub 3415a,b,c may all be the same. Further, the characteristic impedances of the three quarter wave stub 3415a,b,c may be the same as or matched to that of one or more of the input coupling 3410a, the output coupling 3410b, or to one or more of the two median coupling 3413a,b. The couplings 3410a,b and 3413a,b can all be realized by using printed or lumped inductors and/or capacitors or a combination thereof, individually and independently. At the frequency $f_0$ at which the stub resonators' 3415a,b,c electrical length is equal to the quarter-wavelength of the frequency $f_0$, the impedance of the stub resonators 3415a,b,b are large and the stub resonators 3415a,b,c appear to be an open circuit to ground at the junction with the input coupling 3410a and median coupling 3413a (for stub resonator 3415a), median coupling 3413a and median coupling 3413b (for stub resonator 3415b), and the output coupling 3410b and median coupling 3413b (for stub resonator 3415c). At $f_0$, the total input signal power is thus transmitted from an input port 3401 to an output port 3411. At frequencies not equal to $f_0$, some or most of the input signal is reflected at input port 3401 due to the low impedance effectively created by of the quarter wave stubs 1715a,b,c operating out of resonance.

Figure 35:
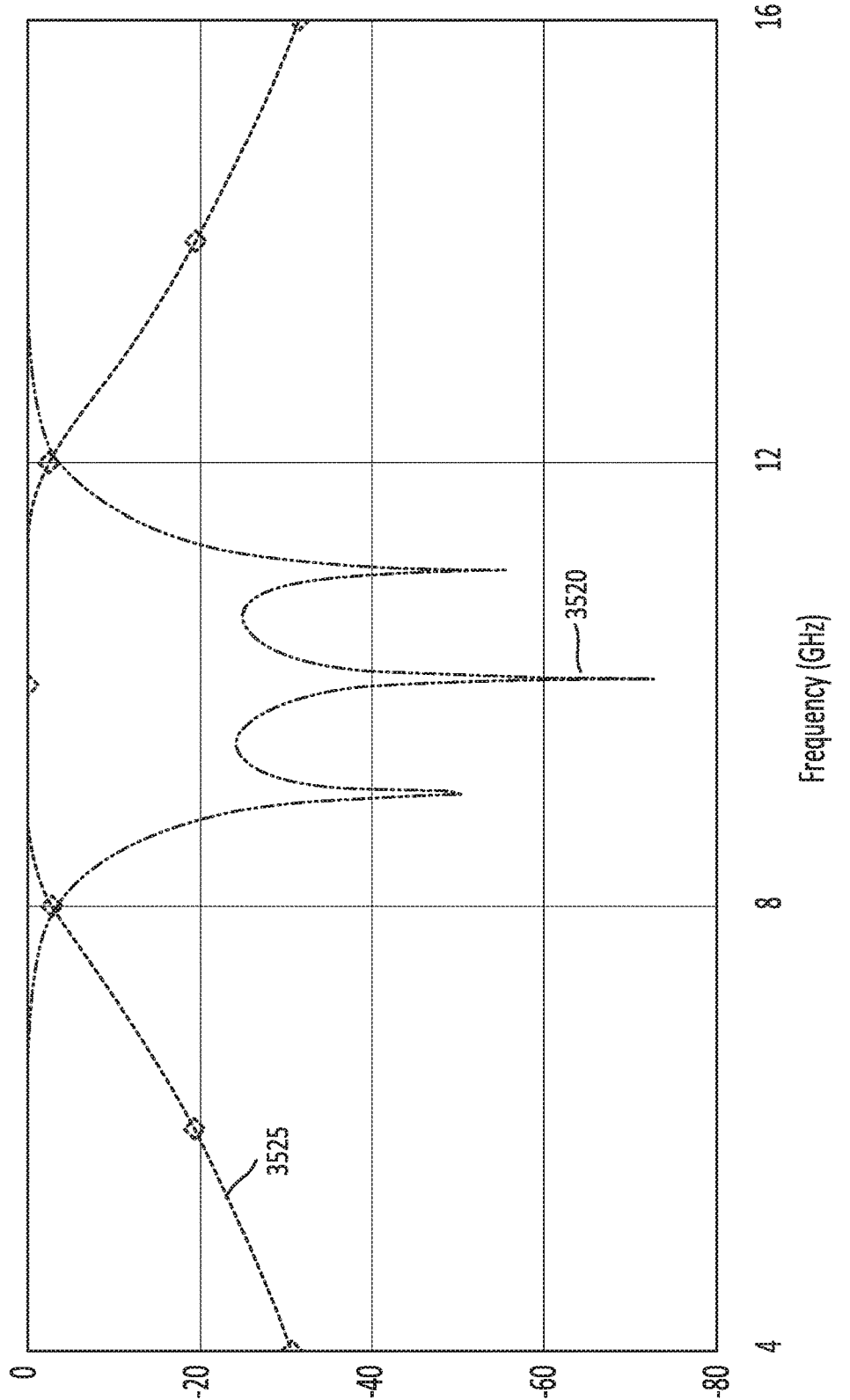
FIG. 35 is a frequency response of the 3-section quarter-wave bandpass filter shown in FIG. 34.

FIG. 35 depicts a frequency response of the basic 3-pole bandpass filter 3400 shown in FIG. 34. The 3-port S-parameters of a filter S(1,1) is the input port voltage reflection coefficient (shown as curve 3520 in FIG. 35) and S(2,1) is the forward voltage gain (shown as curve 3525 in FIG. 35). In FIG. 35 the center or resonant frequency $f_0 \approx 10$ GHz.

Figure 36:
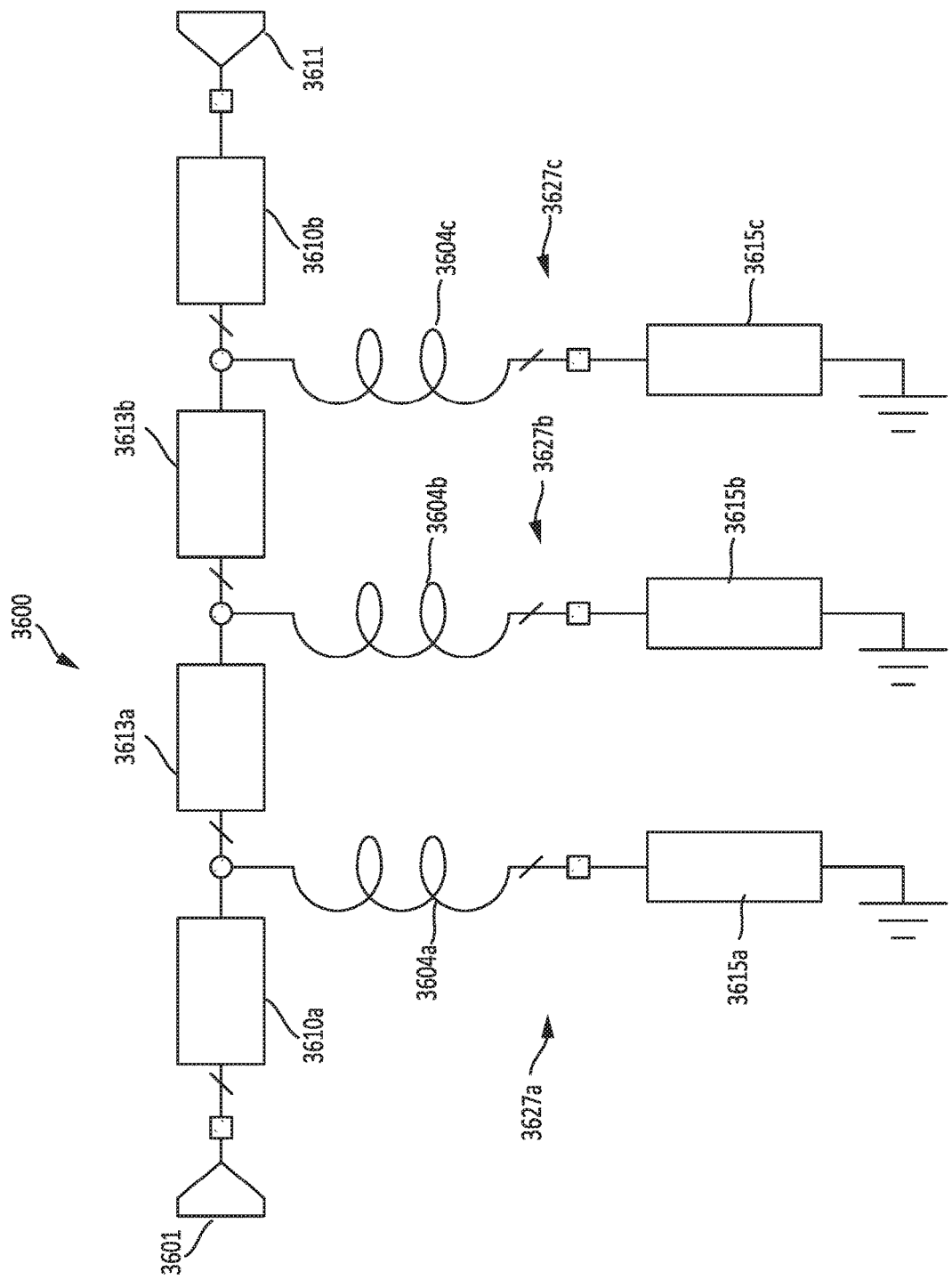
FIG. 36 is a schematic diagram of a 3-section quarter-wave bandpass filter configured with three inductors $L_1$, $L_2$, and $L_3$ added to the 3-section quarter-wave resonators as shown, according to at least one aspect of the present disclosure.

FIG. 36 is a schematic diagram of a 3-pole bandpass filter 3600 configured with three inductors 3604a,b,c. The bandpass filter 3600 has an input port 3601 and an output port 3611. In one aspect, the input port 3601 may be coupled via an input coupling 3610a to a first quarter-wave stub 3615a through a first inductor 3604a ($L_1$), and the output port 3611 may be coupled via an output coupling 3610b to a third quarter-wave stub 3615c through a third inductor 3604c ($L_3$). The input coupling 3610a and the output coupling 3610b may be further coupled together by two median couplings 3613a,b in series. The second quarter-wave stub 3615b may be coupled between the two medial couplings 3613a,b through a second inductor 3604b ($L_2$). In some aspects, the input coupling 3610a and the output coupling 3610b may be the same. Additionally, the two median couplings 3613a,b may be the same as the input coupling 3610a and the output coupling 3610b. The couplings 3610a,b and 3613a,b can all be realized by using printed or lumped inductors and/or capacitors or a combination thereof, individually and independently. A first shunt branch 3627a may be defined as the combination of the first inductor 3604a ($L_1$) coupled in series with the first quarter-wave stub 3615a. A second shunt branch 3627b may be defined as the combination of the second inductor 3604b ($L_2$) coupled in series with the second quarter-wave stub 3615b. A third shunt branch 3627c may be defined as the combination of the third inductor 3604c ($L_3$) coupled in series with the third quarter-wave stub 3615c. It may be recognized that the shunt branches 3627a,b,c are mutually connected in parallel with each other to a transmission line defined by input coupling 3610a, median couplings 3613a,b, and output coupling 3610b. At the resonance frequency, $f_0$, when the three stubs of the resonator 3600 have a quarter-wave electrical length, the shunt branches 3627a,b,c still appears to be open circuits. It may be recognized that the inductors 3604a,b,c do not have to have the same value. Each inductance value produces a finite transmission zero above the passband at a frequency of choice. In various aspects, the filter may be configured with 0, 1, 2, or all 3 inductors depending on the filter specifications.

Figure 37:
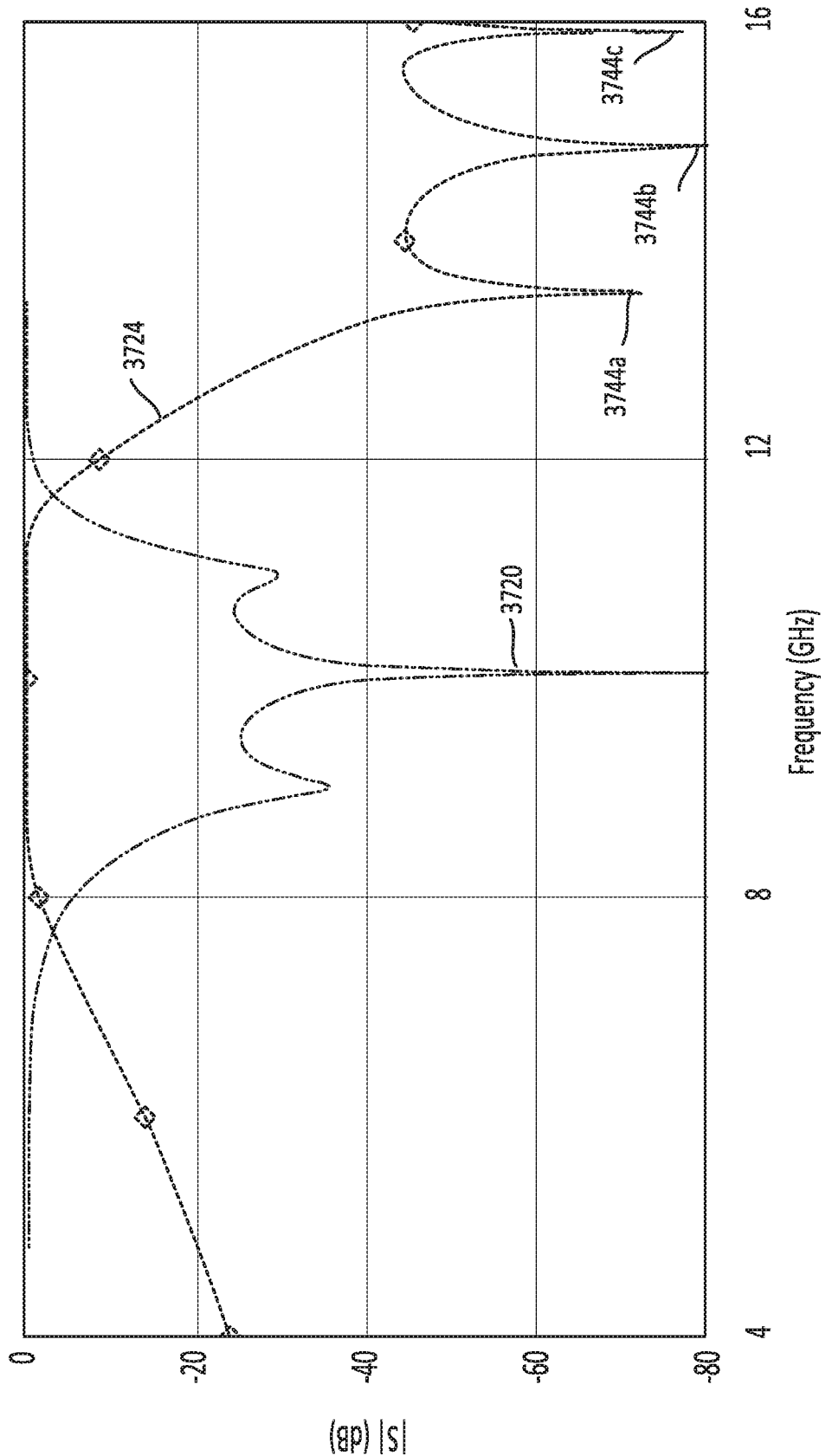
FIG. 37 is a frequency response of the 3-section quarter-wave bandpass filter configured with three inductors $L_1$, $L_2$, and $L_3$ added to the 3-section quarter-wave resonators as shown in FIG. 36, according to at least one aspect of the present disclosure.

FIG. 37 is simulation 3700 of a frequency response of the 3-pole bandpass filter 3600 configured with three inductors $L_1$, $L_2$, and $L_3$ added to the quarter-wave resonators as depicted in FIG. 36. The S(1,1) input port voltage reflection coefficient is depicted as curve 3620 and the S(2,1) forward voltage gain is depicted as curve 3624. As depicted in FIG. 37, three transmission zeros 3744a,b,c above the passband are illustrated.

Figure 38:
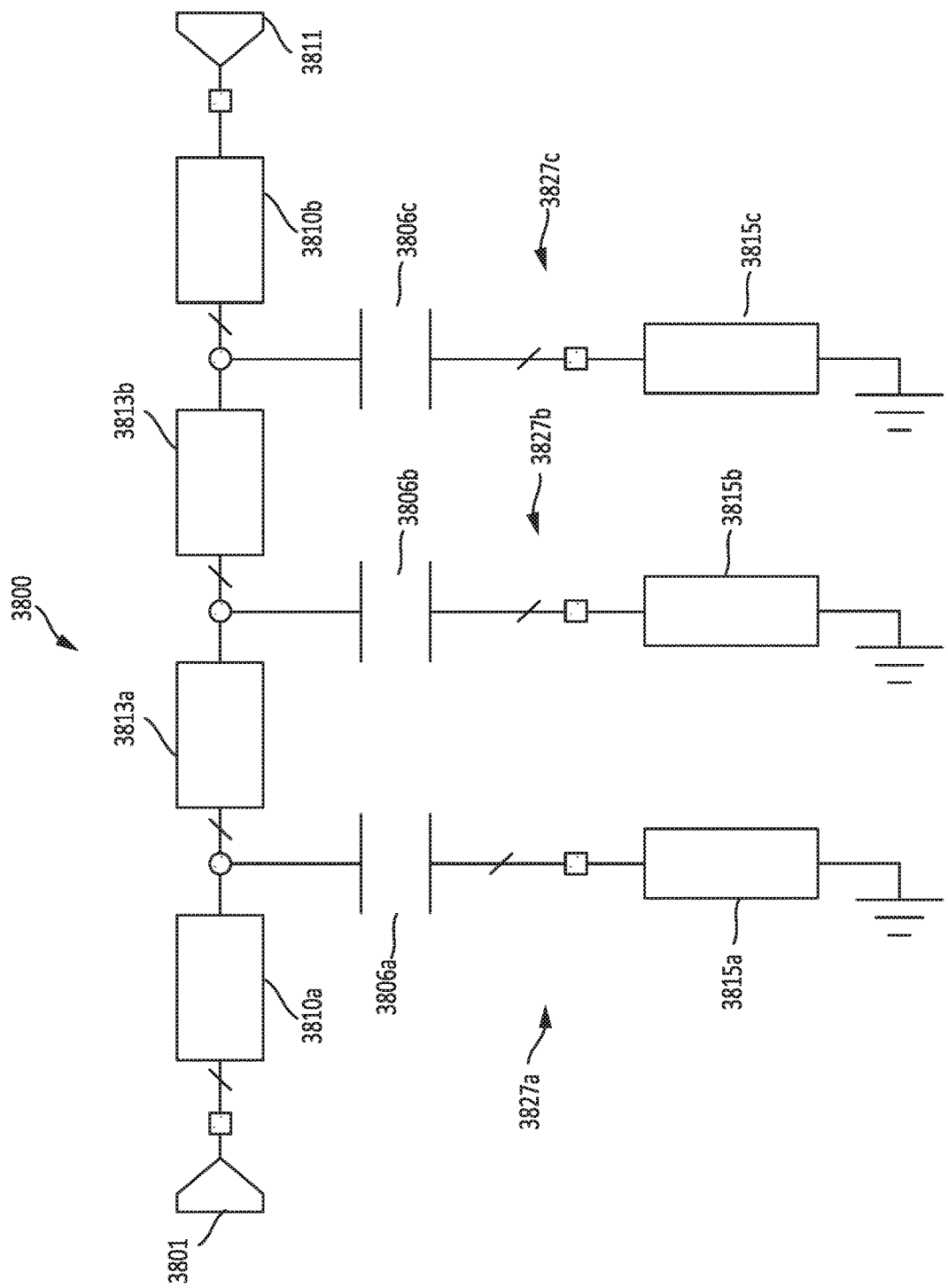
FIG. 38 is a schematic diagram of a 3-section quarter-wave bandpass filter configured with three capacitors $C_1$, $C_2$, and $C_3$ added to the 3-section quarter-wave resonators as shown, according to at least one aspect of the present disclosure.

FIG. 38 is a schematic diagram of a 3-pole bandpass filter 3800 configured with three capacitors 3806a,b,c. The bandpass filter 3800 has an input port 3801 and an output port

3811. In one aspect, the input port 3801 may be coupled via an input coupling 3810a to a first quarter-wave stub 3815a through a first capacitor 3806a ($C_1$), and the output port 3811 may be coupled via an output coupling 3810b to a third quarter-wave stub 3815c through a third capacitor 3804c ($C_3$). The input coupling 3810a and the output coupling 3810b may be further coupled together by two median couplings 3813a,b in series. The second quarter-wave stub 3815b may be coupled between the two medial couplings 3813a,b through a second capacitor 3806b ($C_2$). In some aspects, the input coupling 3810a and the output coupling 3810b may be the same. Additionally, the two median couplings 3813a,b may be the same as the input coupling 3810a and the output coupling 3810b. The couplings 3810a,b and 3813a,b can all be realized by using printed or lumped inductors and/or capacitors or a combination thereof, individually and independently. A first shunt branch 3827a may be defined as the combination of the first capacitor 3806a ($C_1$) coupled in series with the first quarter-wave stub 3815a. A second shunt branch 3827b may be defined as the combination of the second capacitor 3806b ($C_2$) coupled in series with the second quarter-wave stub 3815b. A third shunt branch 3827c may be defined as the combination of the third capacitor 3806c ($C_3$) coupled in series with the third quarter-wave stub 3815c. It may be recognized that the shunt branches 3827a,b,c are mutually connected in parallel with each other to a transmission line defined by input coupling 3810a, median couplings 3813a,b, and output coupling 3810b. At the resonance frequency, $f_o$, when the three stubs of the resonator 3800 have a quarter-wave electrical length, the shunt branches 3827a,b,c still appears to be open circuits. It may be recognized that the capacitors 3806a,b,c do not have to have the same value. Each capacitive value produces a finite transmission zero below the passband at a frequency of choice. In various aspects, the filter may be configured with 0, 1, 2, or all 3 capacitors depending on the filter specifications.

Figure 39:
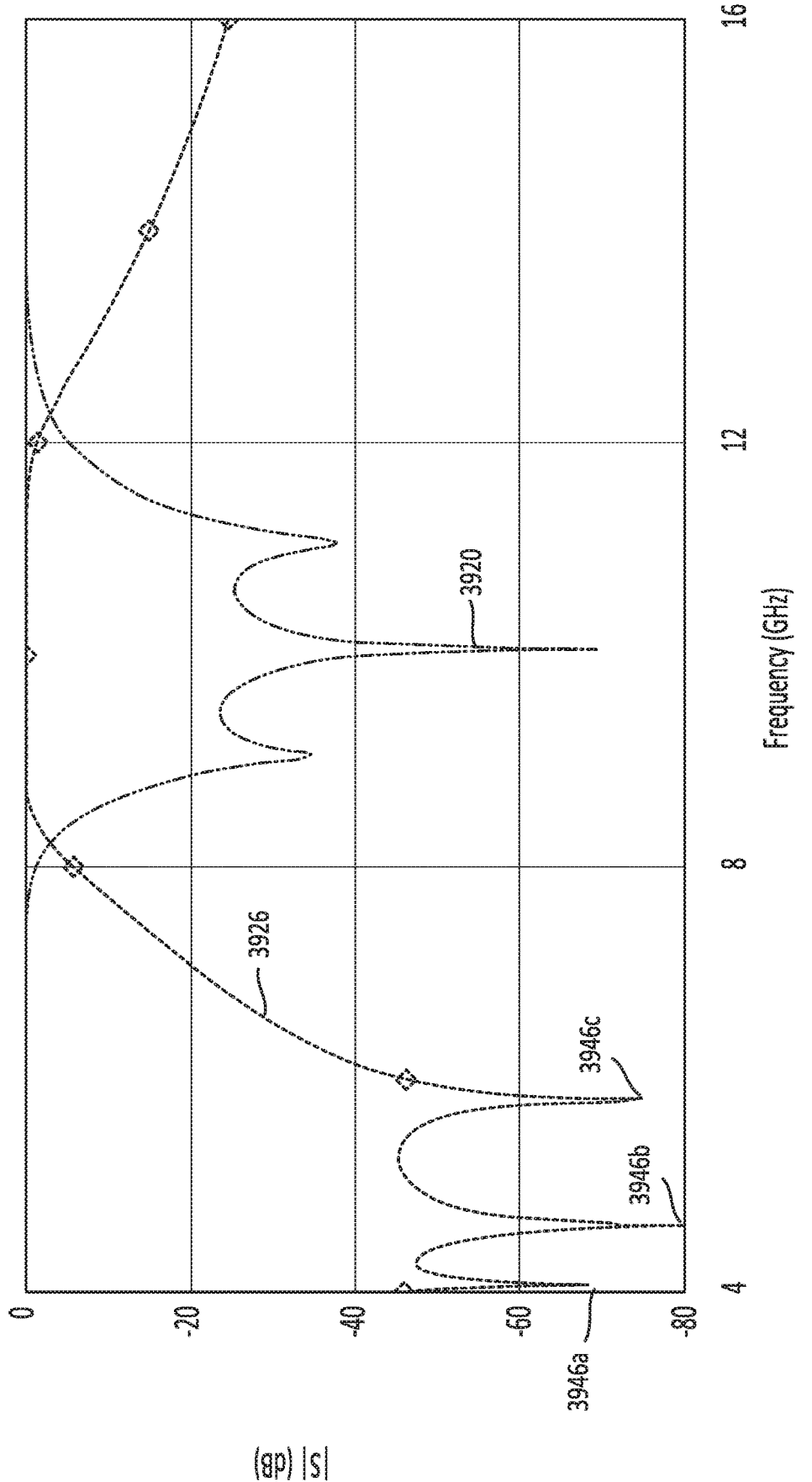
FIG. 39 is a frequency response of the 3-section quarter-wave bandpass filter configured with three capacitors $C_1$, $C_2$, and $C_3$ added to the 3-section quarter-wave resonators as shown in FIG. 38, according to at least one aspect of the present disclosure.

FIG. 39 is simulation 3900 of a frequency response of the 3-pole bandpass filter 3800 configured with three capacitors $C_1$, $C_2$, and $C_3$ added to the quarter-wave resonators as depicted in FIG. 38. The S(1,1) input port voltage reflection coefficient is depicted as curve 3820 and the S(2,1) forward voltage gain is depicted as curve 3826. As depicted in FIG. 39, three transmission zeros 3946a,b,c below the passband are illustrated.

Figure 40:
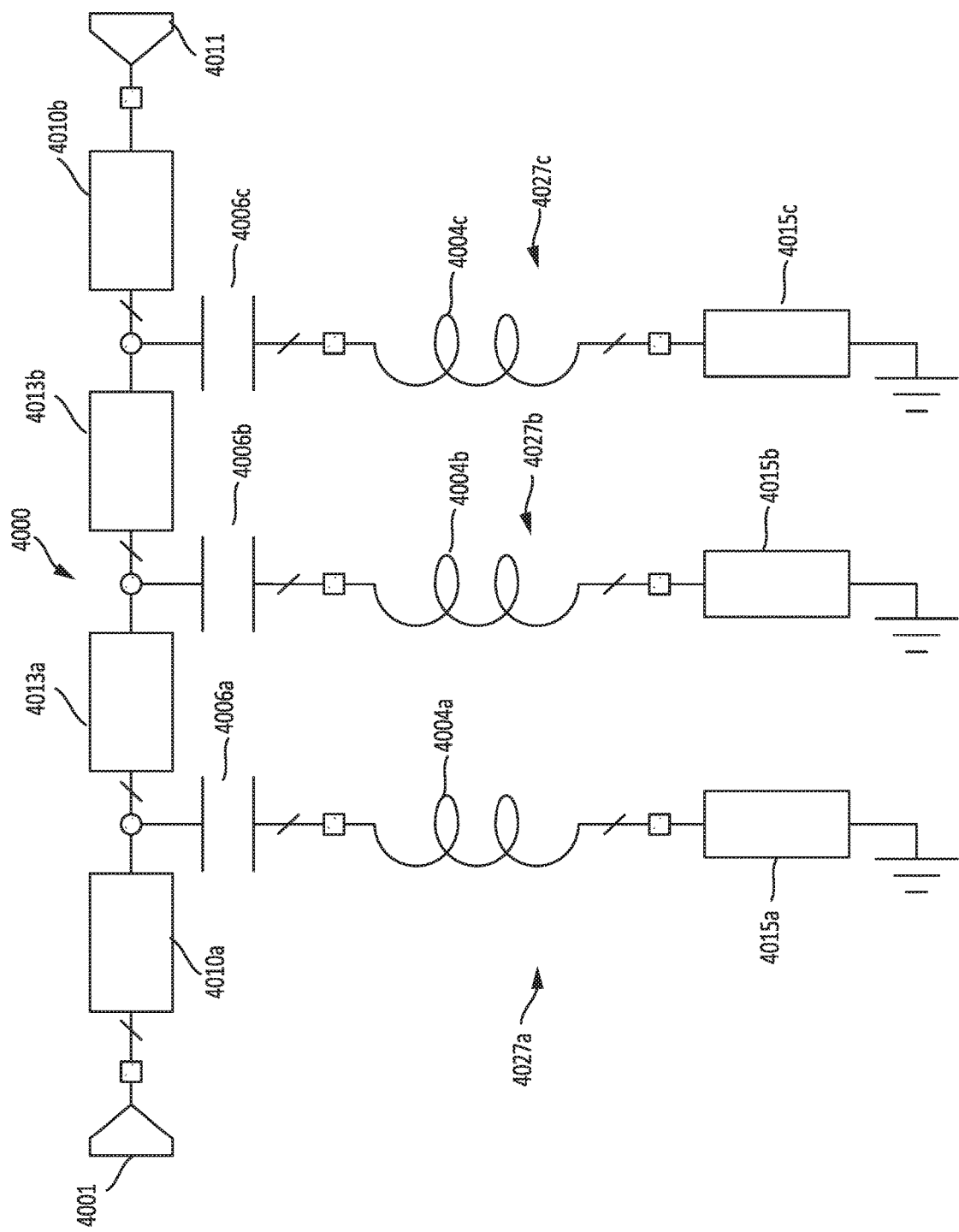
FIG. 40 is a schematic diagram of a 3-section quarter-wave bandpass filter configured with three inductors $L_1$, $L_2$, and $L_3$ and three capacitors $C_1$, $C_2$, and $C_3$ added to the 3-section quarter-wave resonators as shown, according to at least one aspect of the present disclosure.

FIG. 40 is a schematic diagram of a 3-pole bandpass filter 4000 configured with three inductors 4004a,b,c and three capacitors 3806a,b,c. The bandpass filter 4000 has an input port 4001 and an output port 4011. In one aspect, the input port 4001 may be coupled via an input coupling 4010a to a first quarter-wave stub 4015a through a first capacitor 4006a ($C_1$) in series with a first inductor 4004a ($L_1$), and the output port 4011 may be coupled via an output coupling 4010b to a third quarter-wave stub 4015c through a third capacitor 3804c ($C_3$) in series with a third inductor 4004c ($L_3$). The input coupling 4010a and the output coupling 4010b may be further coupled together by two median couplings 4013a,b in series. The second quarter-wave stub 4015b may be coupled between the two medial couplings 4013a,b through a second capacitor 3806b ($C_2$) in series with a second inductor 4004b ($L_2$). In some aspects, the input coupling 4010a and the output coupling 4010b may be the same. Additionally, the two median couplings 4013a,b may be the same as the input coupling 4010a and the output coupling 4010b. The couplings 4010a,b and 4013a,b can all be realized by using printed or lumped inductors and/or capacitors or a combination thereof, individually and independently. A first shunt branch 4027a may be defined as the combination of the first capacitor 4006a ($C_1$) coupled in series with the first inductor 4004a ($L_1$) and in series with the first quarter-wave stub 4015a. A second shunt branch 4027b may be defined as the combination of the second capacitor 3806b ($C_2$) coupled in series with the second inductor 4004b ($L_2$) and in series with the second quarter-wave stub 4015b. A third shunt branch 4027c may be defined as the combination of the third capacitor 4006c ($C_3$) coupled in series with the third inductor 4004c ($L_3$) and coupled in series with the third quarter-wave stub 4015c. It may be recognized that the shunt branches 4027a,b,c are mutually connected in parallel with each other to a transmission line defined by input coupling 4010a, median couplings 4013a,b, and output coupling 4010b. At the resonance frequency, $f_o$, when the three stubs of the resonator 4000 have a quarter-wave electrical length, the shunt branches 4027a,b,c still appears to be open circuits. It may be recognized that the inductors 4004a,b,c do not have to have the same value. Each inductive value produces a finite transmission zero above the passband at a frequency of choice. In various aspects, the filter may be configured with 0, 1, 2, or all 3 inductors depending on the filter specifications. It may be further recognized that the capacitors 4006a,b,c do not have to have the same value. Each capacitive value produces a finite transmission zero below the passband at a frequency of choice. In various aspects, the filter may be configured with 0, 1, 2, or all 3 capacitors depending on the filter specifications. In various aspects, the filter may be configured with 0 to 6 transmission zeros, three above and three below the passband, depending on the filter specifications.

Figure 41:
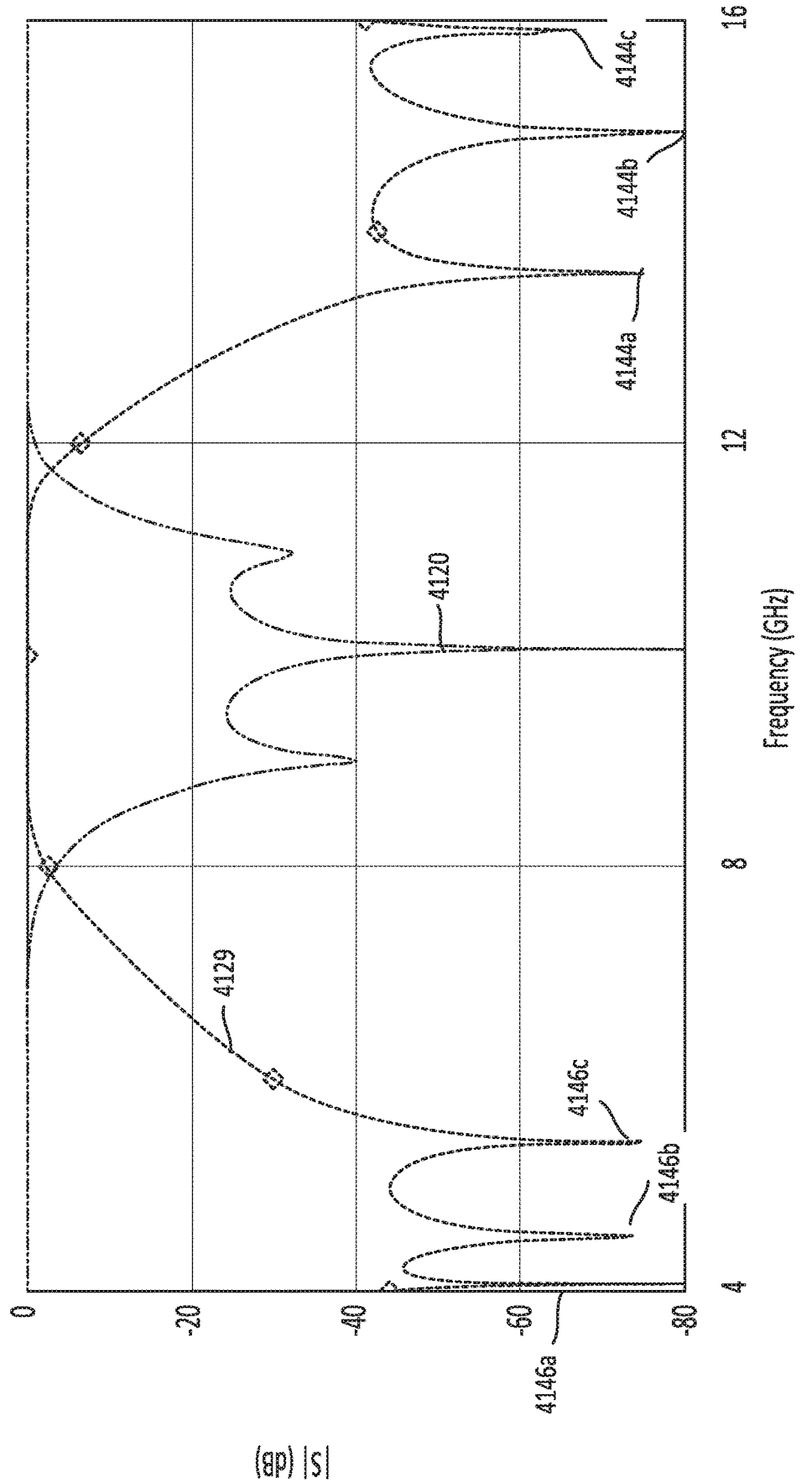
FIG. 41 is a frequency response of the 3-section quarter-wave bandpass filter configured with three inductors $L_1$, $L_2$, and $L_3$ and three capacitors $C_1$, $C_2$, and $C_3$ added to a 3-section quarter-wave bandpass filter as shown in FIG. 40, according to at least one aspect of the present disclosure.

FIG. 41 is simulation 4100 of a frequency response of the 3-pole bandpass filter 4000 with three inductors 4004a,b,c and three capacitors 4006a,b,c added to a 3-section quarter-wave bandpass filter as shown in FIG. 40, according to at least one aspect of the present disclosure. The S(1,1) input port voltage reflection coefficient is depicted as curve 4120 and the S(2,1) forward voltage gain is depicted as curve 4129. As depicted in FIG. 41, three transmission zeros 4144a,b,c above the passband (due to the three inductors 4004a,b,c) and three transmission zeros 4146a,b,c below the passband (due to the three capacitors 4006a,b,c) are illustrated for a total of six transmission zeros.

Figure 42:
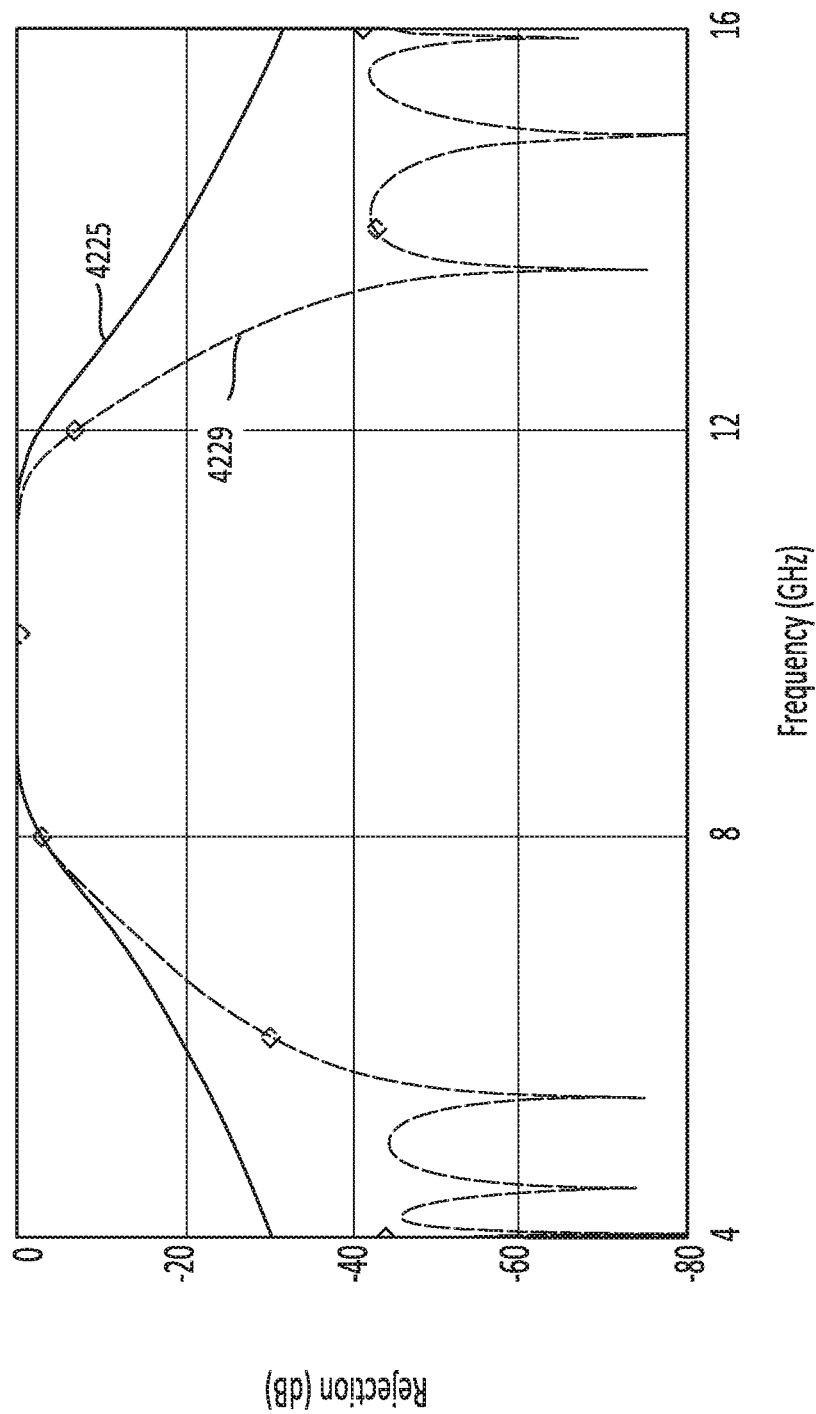
FIG. 42 is a comparison of the 3-section quarter-wave bandpass filter shown in FIG. 34 and a 3-section quarter-wave bandpass filter configured with three inductors $L_1$, $L_2$, and $L_3$ and three capacitors $C_1$, $C_2$, and $C_3$ added to the 3-section quarter-wave resonators as shown in FIG. 40, according to at least one aspect of the present disclosure.

FIG. 42 is a comparison 4200 of the frequency responses of the 3-pole bandpass filter 3400 shown in FIG. 34 and the 3-pole bandpass filter 4000 configured with three inductors 4004a,b,c in series with three capacitors 4006a,b,c added to the quarter-wave resonators shown in FIG. 40, according to at least one aspect of the present disclosure. The frequency response of the 3-pole bandpass filter 3400 is depicted as curve 4225 and the frequency response of the 3-pole bandpass filter 4000 configured with three inductors 4004a,b,c in series with three capacitors 4006a,b,c is depicted in curve 4229. It may readily be observed that the bandpass region is well defined by the pair of triplet transmission zeros 4246a,b,c and 4244a,b,c. FIG. 42 thus compares frequency response of a 3-pole bandpass filter with and without induced transmission zeros. A significant improvement of passband rejection is noted on either side of the graph.

As described hereinabove, without introducing transmission zeros, a larger filter would be required to achieve near band rejection, which means the filter could otherwise be up to three times bigger and heavier (or more). With more sections, the larger filter could have had three times higher insertion loss (or more), which is not desirable. With conventional cross-coupling technique (interstages only), one can only obtain one transmission zero for a 3-section filter.

In contrast, in accordance with the filter techniques disclosed herein, up to six zeros (from 0 to 6 zeros) may be achieved to improve the filter performance with a far more effective and efficient design and realization compared to the current conventional technology. Cross-coupling techniques typically alter the characteristics of the resonator and require a more complex structure and calculation. In accordance with the filter techniques disclosed herein, the zeros introduced do not change the nature of the resonator significantly. It is much easier to realize and to model the effect of the transmission zeros.

Figures 43, 44:
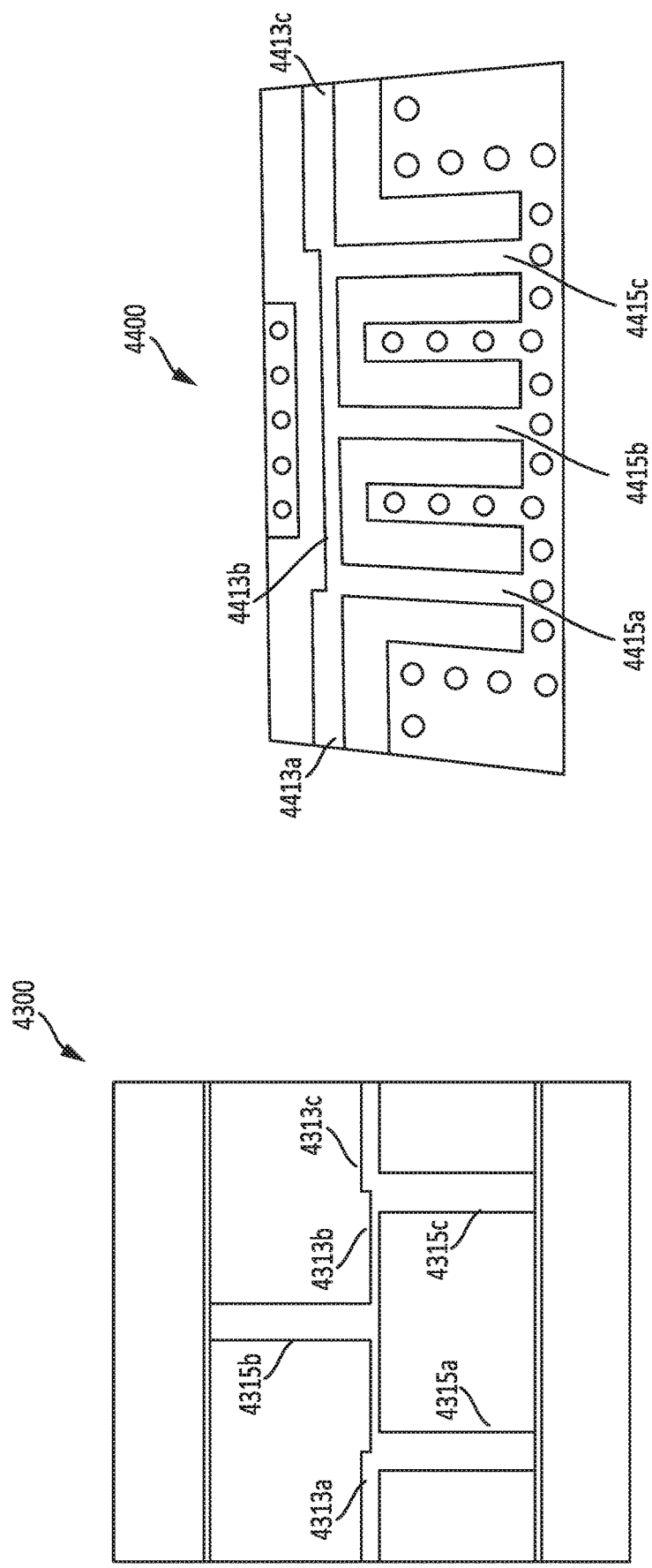
FIG. 43 illustrates a printed circuit 3-section microstrip bandpass filter.
FIG. 44 illustrates a printed circuit 3-section suspended stripline bandpass filter.

The following description provides techniques for adding inductance and capacitance to various types of filters including, for example, planar filters such as microstrip or suspended stripline filters and ceramic filters such as TEM ceramic resonators. Turning now to FIGS. 43 and 44, where FIG. 43 illustrates a printed circuit 3-section microstrip bandpass filter 4300 including three quarter-wave stubs 4315a,b,c inductively coupled to high-impedance transmission lines 4313a,b,c. FIG. 44 illustrates a printed circuit 3-section suspended stripline bandpass filter 4400 including three quarter-wave stubs 4415a,b,c inductively coupled to high-impedance transmission lines 4413a,b,c.

Figure 45:
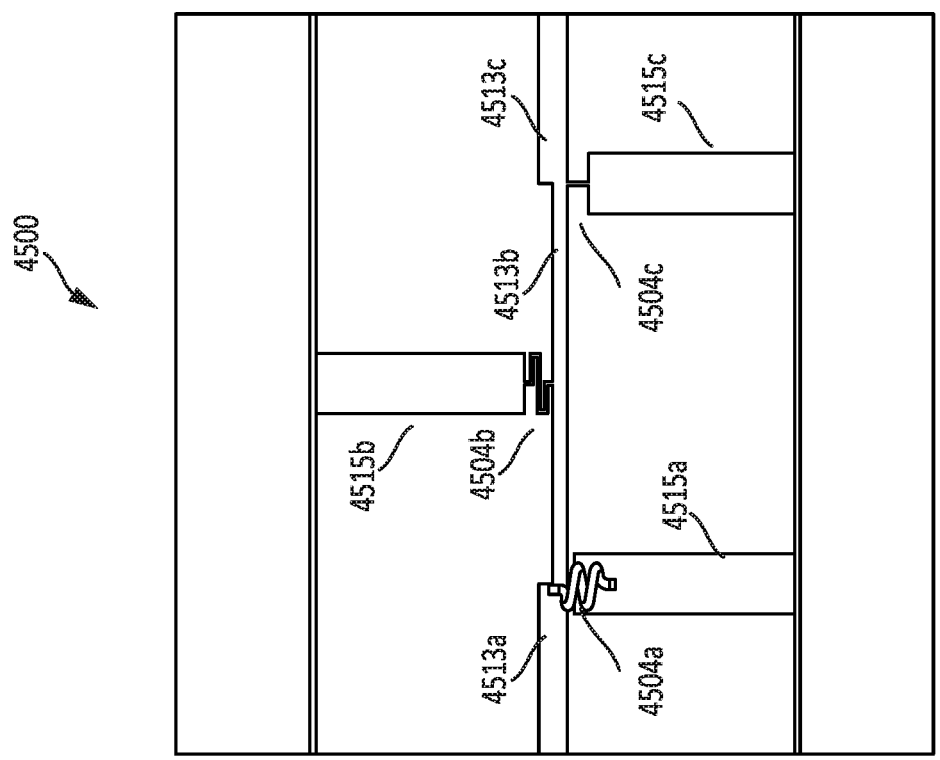
FIG. 45 illustrates a printed circuit 3-section microstrip bandpass filter with three added inductors to the three quarter-wave shunt short stubs, according to at least one aspect of the present disclosure.
Figure 45A:
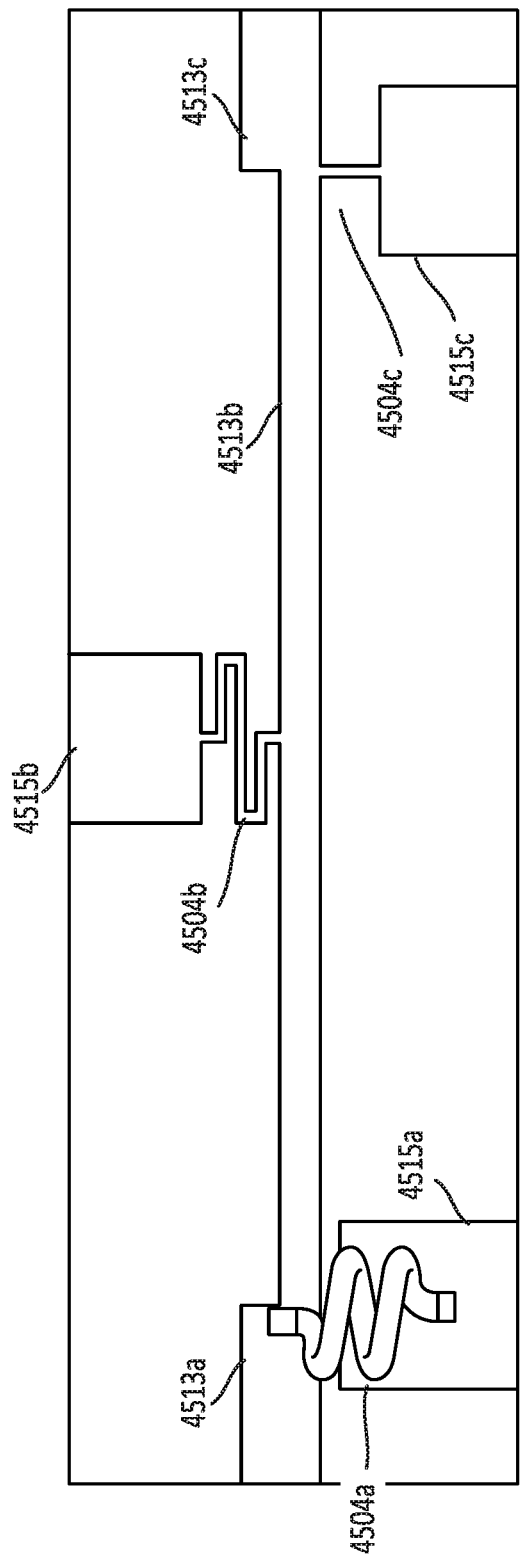
FIG. 45A is a detailed view of the three added inductors.

FIG. 45 illustrates a printed circuit 3-section microstrip bandpass filter 4500 with three inductors 4504a,b,c added to the three quarter-wave shunt short stubs 4515a,b,c, according to at least one aspect of the present disclosure. The shunt short stubs 4515a,b,c may be coupled by the inductors 4504a,b,c to the transmission lines 4513a,b,c. As shown in FIG. 45, inductance can be realized in various forms in a microstrip filter 4500. For example, inductance can be realized by adding a coil of wire 4504a across a small gap, printing a meander line 4504b, or printing a high impedance line 4504c, or combinations thereof. FIG. 45A is a detailed view of the three added inductors 4504a,b,c. Reference numbers in FIG. 45A correspond to those in FIG. 45.

Figure 46:
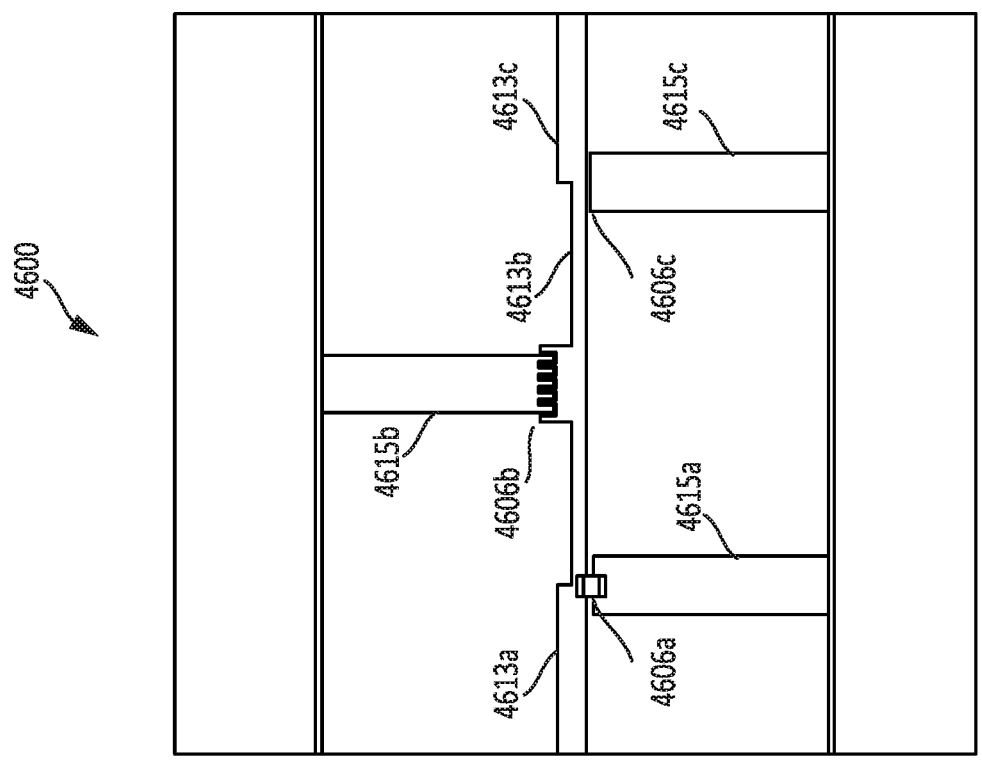
FIG. 46 illustrates a printed circuit 3-section microstrip bandpass filter with three added capacitors to the three quarter-wave shunt short stubs, according to at least one aspect of the present disclosure.
Figure 46A:
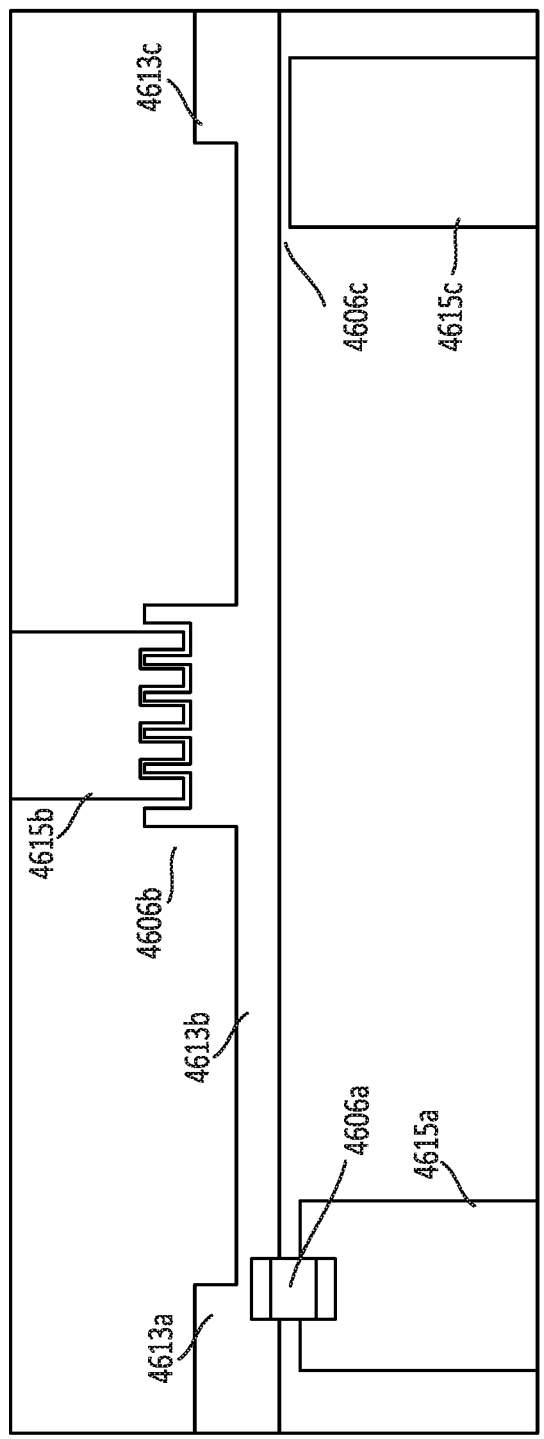
FIG. 46A is a detailed view of the three added capacitors.

FIG. 46 illustrates a printed circuit 3-section microstrip bandpass filter 4600 with three capacitors 4606a,b,c added to the three quarter-wave shunt short stubs 4615a,b,c, according to at least one aspect of the present disclosure. The shunt short stubs 4615a,b,c may be coupled by the capacitors 4606a,b,c to the transmission lines 4613a,b,c. As shown in FIG. 46, capacitance can be realized in various forms in a microstrip filter. For example, capacitance can be realized by adding a single or multi-layer surface mounted chip capacitor 4606a, printing an interdigital (fingers) capacitor 4606b, or using a gap capacitor 4606c, or combinations thereof. FIG. 46A is a detailed view of the three added capacitors. Reference numbers in FIG. 46A correspond to those in FIG. 46.

Figure 47:
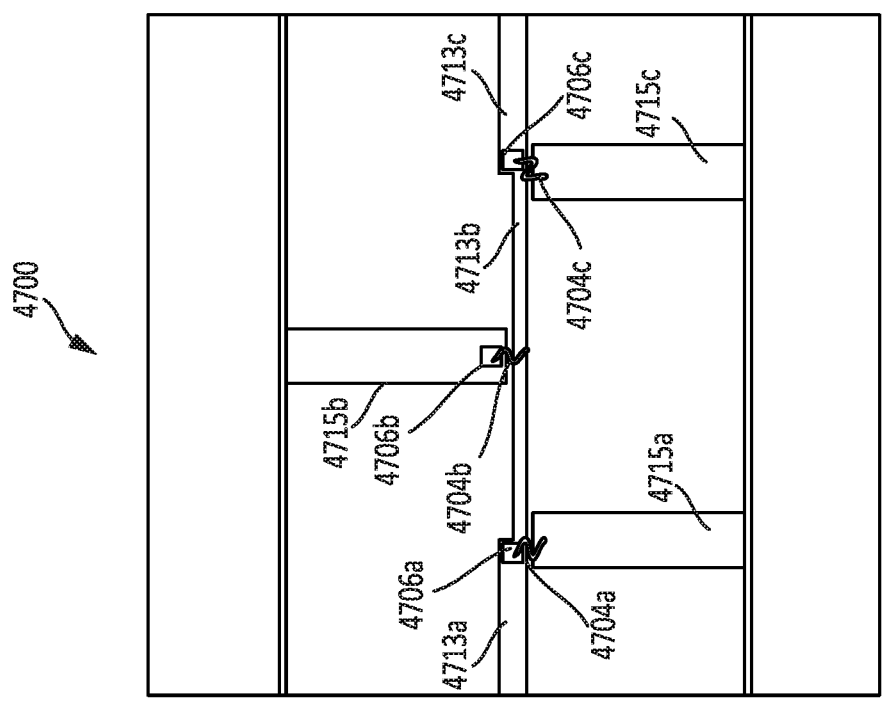
FIG. 47 illustrates a printed circuit 3-section microstrip bandpass filter with three added inductors and three added capacitors to the three quarter-wave shunt short stubs, according to at least one aspect of the present disclosure.
Figure 47A:
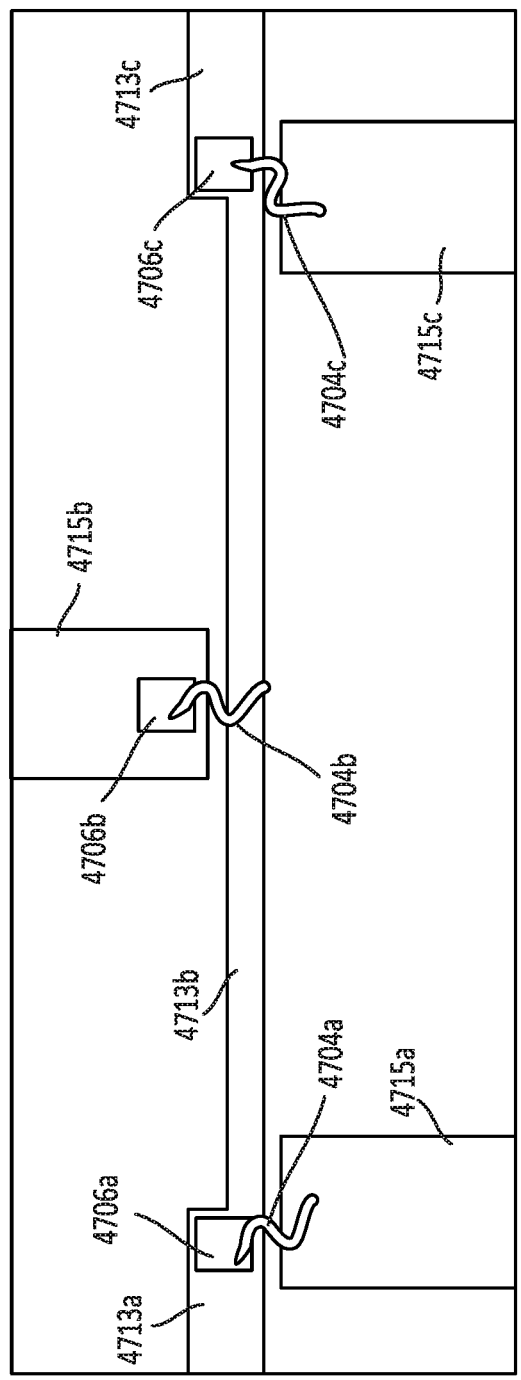
FIG. 47A is a detailed view of the added inductors and capacitors.

FIG. 47 illustrates a printed circuit 3-section microstrip bandpass filter 4700 with three inductors 4704a,b,c added in series to three added capacitors 4706a,b,c which are further coupled to the three quarter-wave shunt short stubs 4715a,b,c, according to at least one aspect of the present disclosure. The shunt short stubs 4715a,b,c may be coupled by the series connected inductors 4704a,b,c and capacitors 4706a,b,c to the transmission lines 4713a,b,c. As shown in FIG. 47, the three inductors 4704a,b,c are realized with three coils of wire and the three capacitors 4706a,b,c are realized with three singe layer chip capacitors. FIG. 47A is a detailed view of the added inductors and capacitors. Reference number in FIG. 47A correspond to those in FIG. 47.

Figure 48:
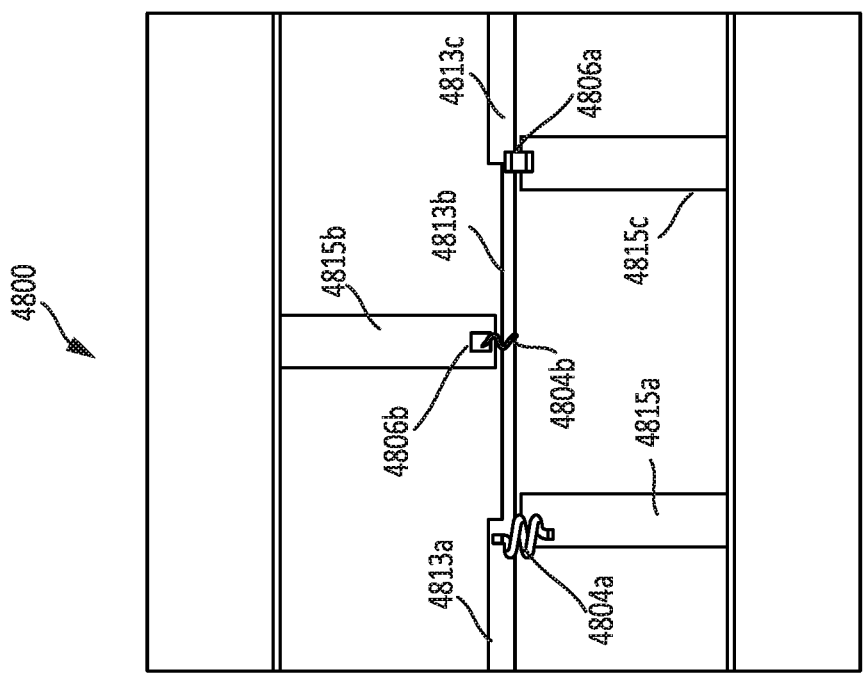
FIG. 48 illustrates a printed circuit 3-section microstrip bandpass filter with a combination of added inductors and capacitors to the three quarter-wave shunt short stubs, according to at least one aspect of the present disclosure.
Figure 48A:
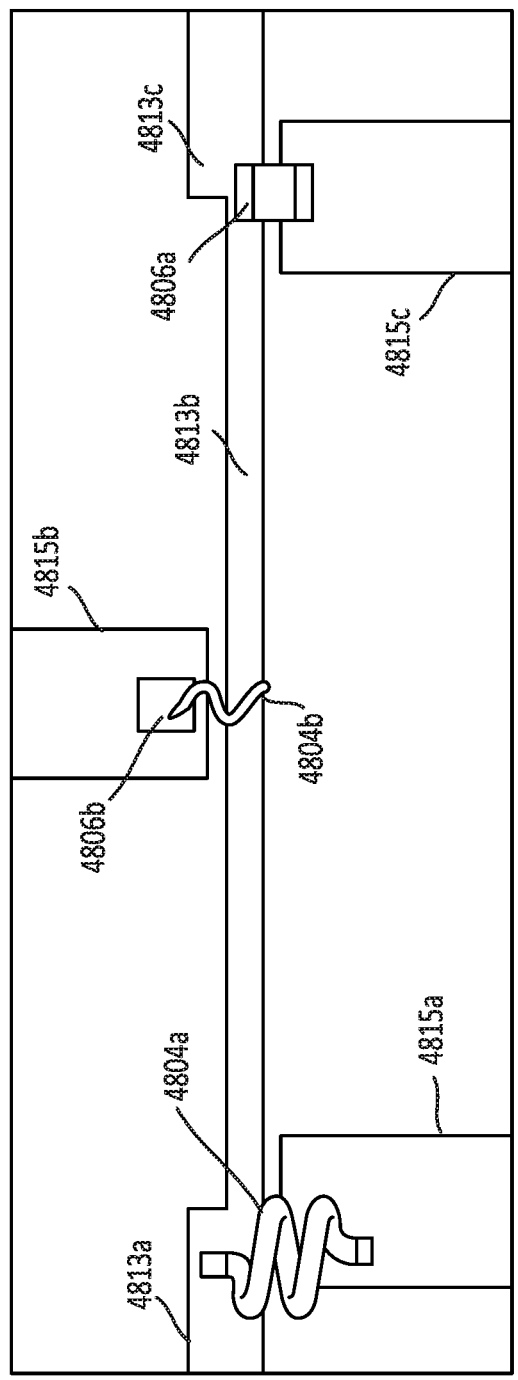
FIG. 48A is a detailed view of the added inductors and capacitors.

FIG. 48 illustrates a printed circuit 3-section microstrip bandpass filter 4800 with a combination of added inductors 4804a,b and capacitors 4806a,b to the three quarter-wave shunt short stubs 4815a,b,c, according to at least one aspect of the present disclosure. The microstrip filter can be configured with 0 to 6 assigned transmission zeros at the desired frequencies depending on the number and disposition of inductors and capacitors. As shown in FIG. 48, a single inductor 4804a is added to a first quarter-wave shunt short stub 4815a, an inductor 4804b in series with a capacitor 4806b are added in series with a second quarter-wave shunt short stub 4815b, and a capacitor 4806a is added to a third quarter-wave shunt short stub 4815c. Thus, shunt short stub 4815a may be coupled by inductor 4804a to the transmission line 4813a, shunt short stub 4815b may be coupled by series connected inductor 4804b and capacitor 4806b to the transmission line 4813b, and shunt short stub 4815c may be coupled by capacitor 4806a to the transmission line 4813c. FIG. 48A is a detailed view of the added inductors and capacitors. Reference numbers in FIG. 48A correspond to those in FIG. 48.

Figure 49:
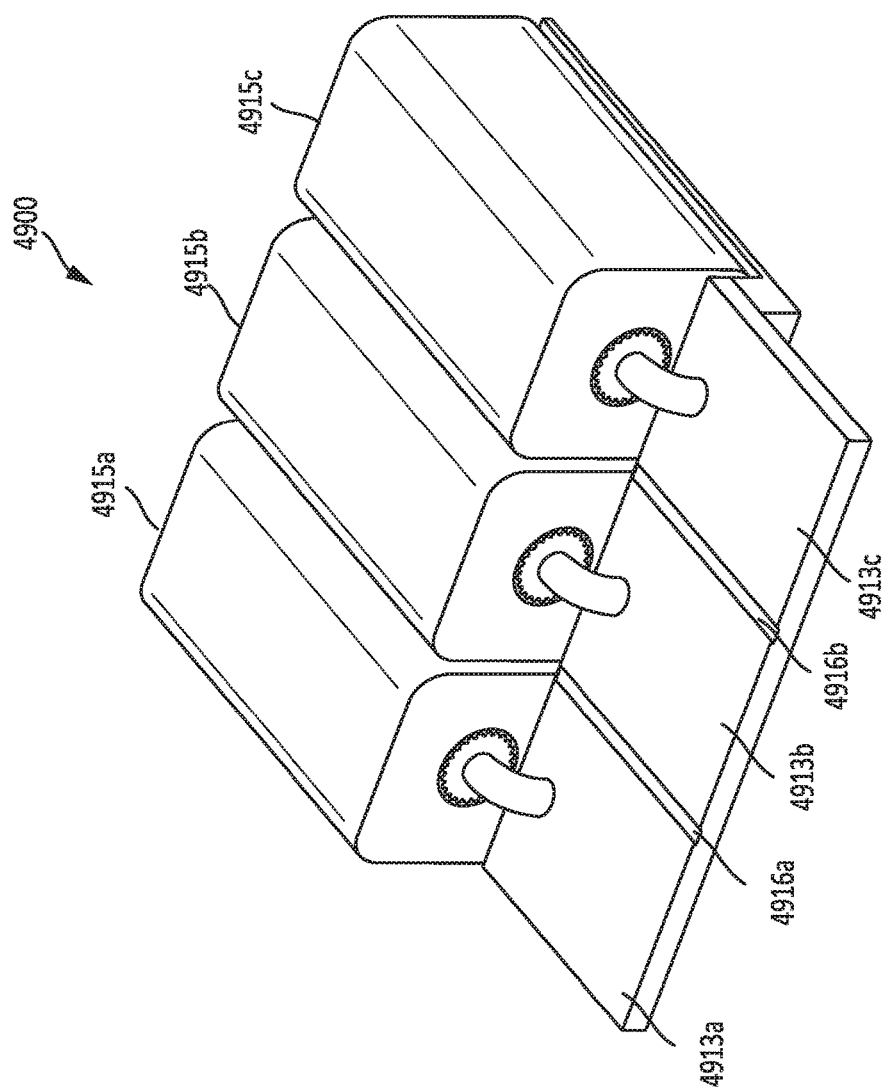
FIG. 49 illustrates a ceramic filter comprising three TEM resonators. The TEM resonators comprise quarter-wave TEM ceramic shunt short stubs and microstrip transmission lines.

FIG. 49 illustrates a ceramic filter 4900 comprising three TEM resonators 4915a,b,c. The TEM resonators 4915a,b,c comprise quarter-wave TEM ceramic shunt short stubs and microstrip transmission lines 4913a,b,c. Coupling between the transmission lines 4916a,b,c can be inductive or capacitive in various forms as discussed hereinbelow such as chips, printed, single-layer, multilayers, coils, suspended, etc. As shown in FIG. 49, coupling between the transmission lines 4913a,b,c may be capacitive, realized by the fringing field through the gaps 4916a,b between the respective microstrip transmission lines 4913a,b,c.

Figure 50:
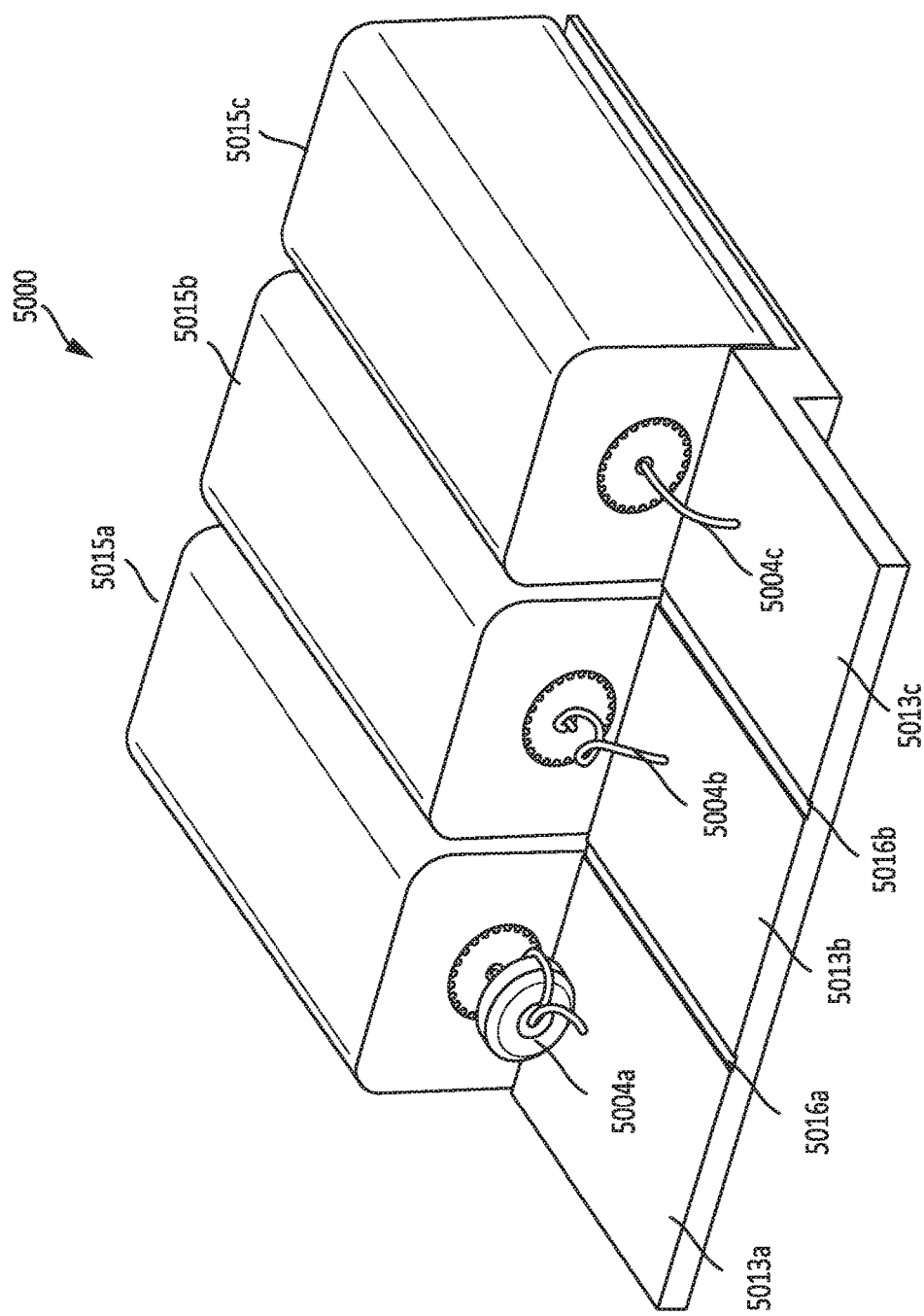
FIG. 50 illustrates a ceramic filter comprising three TEM resonators with three added inductors to the three quarter-wave TEM ceramic shunt short stubs, according to at least one aspect of the present disclosure.

FIG. 50 illustrates a ceramic filter 5000 comprising three TEM resonators 5015a,b,c with three added inductors 5004a,b,c to the three quarter-wave TEM ceramic shunt short stubs 5015a,b,c and microstrip transmission lines 5013a,b,c, according to at least one aspect of the present disclosure. As shown in FIG. 50, inductance can be realized in various forms in a ceramic filter 5000. For example, inductance can be realized by adding a toroid inductor 5004a, a coil of wire 5004b, or a high impedance wire 5004c as an inductor, or combinations thereof. Coupling between the transmission lines 5016a,b,c can be inductive or capacitive in various forms as discussed hereinbelow such as chips, printed, single-layer, multilayers, coils, suspended, etc. As shown in FIG. 50, coupling between the transmission lines 5013a,b,c may be capacitive, realized by the fringing field through the gaps 5016a,b between the respective microstrip transmission lines 5013a,b,c.

Figure 51:
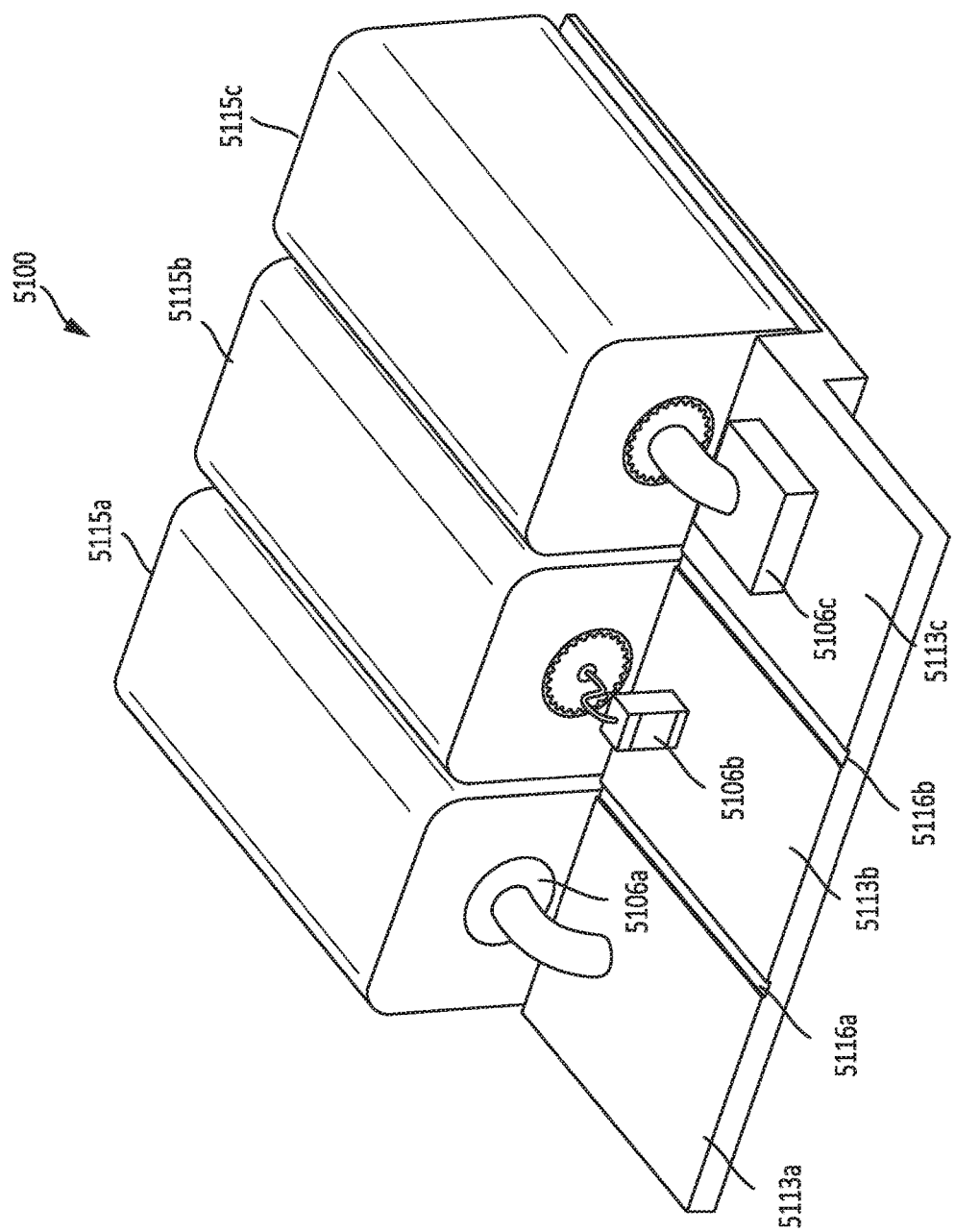
FIG. 51 illustrates a ceramic filter comprising three TEM resonators with three added capacitors to the three quarter-wave TEM ceramic shunt short stubs, according to at least one aspect of the present disclosure.

FIG. 51 illustrates a ceramic filter 5100 comprising three TEM resonators 5115a,b,c with three added capacitors 5106a,b,c to the three quarter-wave TEM ceramic shunt short stubs 5115a,b,c and microstrip transmission lines 5113a,b,c, according to at least one aspect of the present disclosure. As shown in FIG. 51, capacitance can be realized in various forms in a ceramic filter. For example, capacitance can be realized by adding a coaxial capacitor 5106a from the dielectric sleeve, a multi-layer chip capacitor 5106b, or a single layer chip capacitor 5106c, or combinations thereof. Coupling between the transmission lines 5116a,b,c can be inductive or capacitive in various forms as discussed hereinbelow such as chips, printed, single-layer, multilayers, coils, suspended, etc. As shown in FIG. 51, coupling between the transmission lines 5113a,b,c may be capacitive, realized by the fringing field through the gaps 5116a,b between the respective microstrip transmission lines 5113a,b,c.

Figure 52:
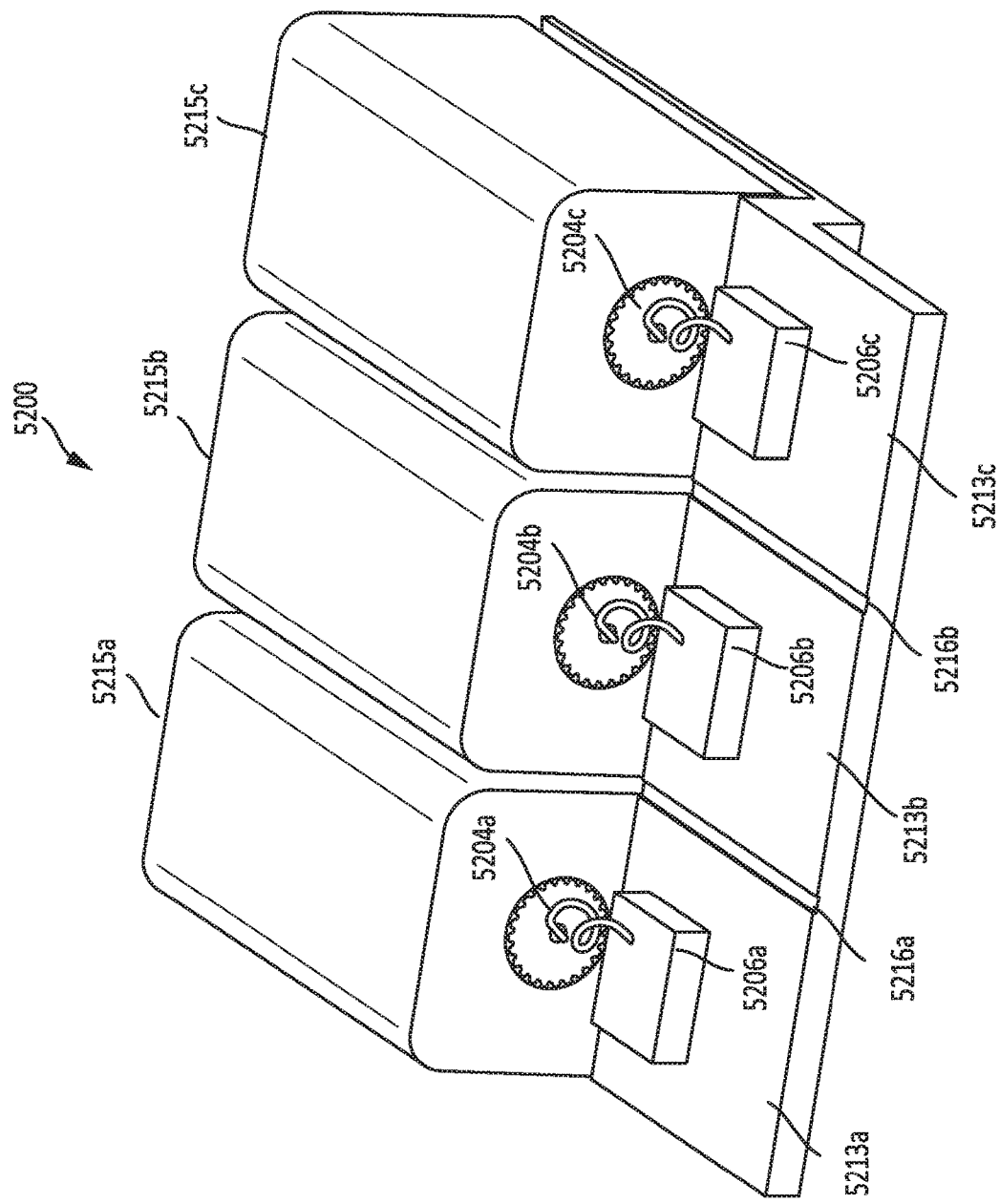
FIG. 52 illustrates a ceramic filter comprising three TEM resonators with three added inductors and three added capacitors to the three quarter-wave TEM ceramic shunt short stubs, according to at least one aspect of the present disclosure.

FIG. 52 illustrates a ceramic filter 5200 comprising three TEM resonators 5215a,b,c with three added inductors 5204a,b,c in series with three added capacitors 5206a,b,c and further in series with to the three quarter-wave TEM ceramic shunt short stubs 5215a,b,c, and microstrip transmission lines 5213a,b,c, according to at least one aspect of the present disclosure. As shown in FIG. 52, the three inductors 5204a,b,c are realized with three coils of wire or high impedance wire and the three capacitors 5206a,b,c are realized with single or multi-layer chip capacitors. In various aspects, any combination of L, C, and L+C can be easily incorporated as described hereinbelow. Coupling between the transmission lines 5216a,b,c can be inductive or capacitive in various forms as discussed hereinbelow such as chips, printed, single-layer, multilayers, coils, suspended, etc. As shown in FIG. 52, coupling between the transmission lines 5213a,b,c may be capacitive, realized by the fringing field through the gaps 5216a,b between the respective microstrip transmission lines 5213a,b,c.

Figure 53:
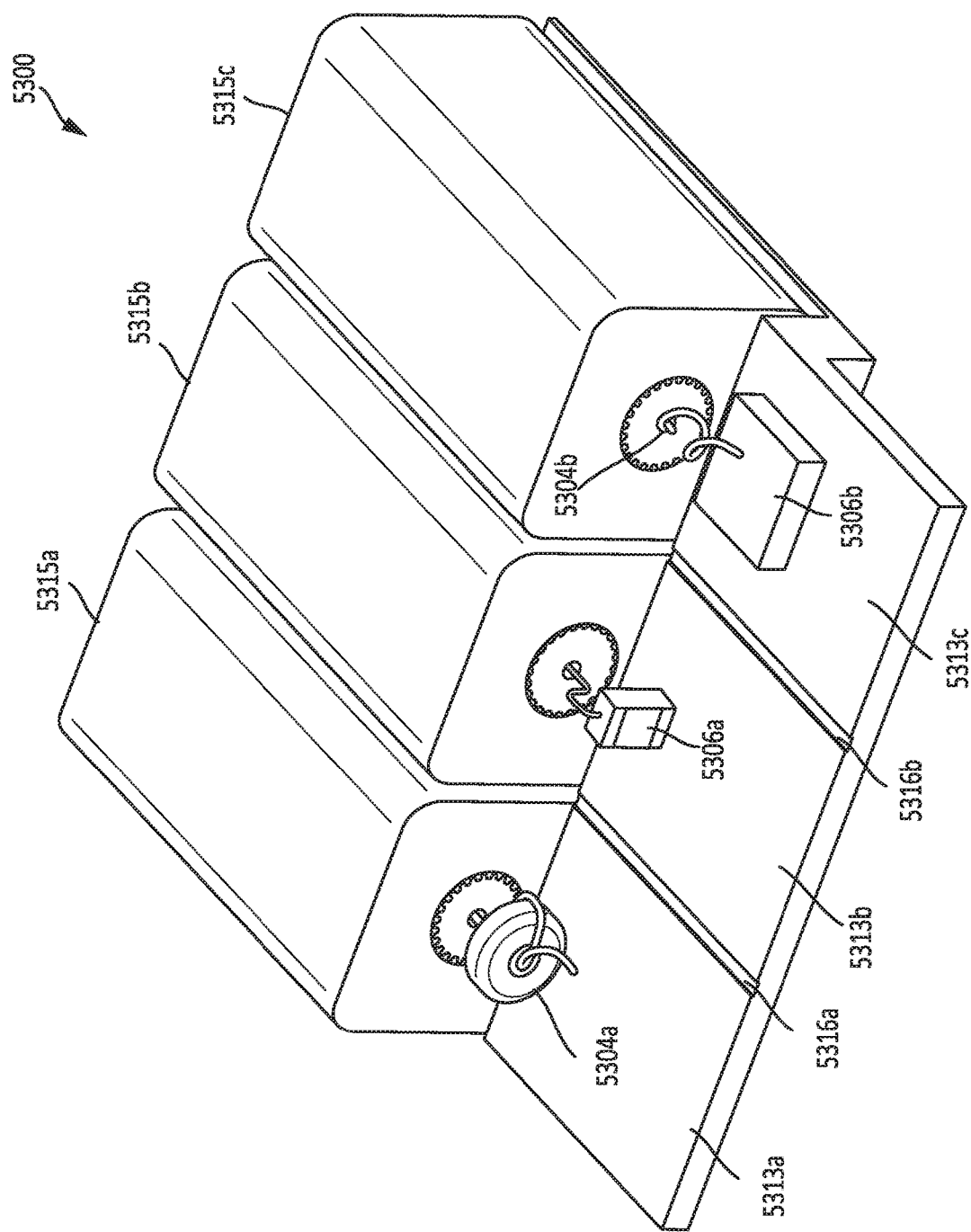
FIG. 53 illustrates a ceramic filter comprising three TEM resonators with a combination of added inductors and capacitors to the three quarter-wave TEM ceramic shunt short stubs, according to at least one aspect of the present disclosure.

FIG. 53 illustrates a ceramic filter 5300 comprising three TEM resonators 5315a,b,c with a combination of added inductors and capacitors to the three quarter-wave TEM ceramic shunt short stubs and microstrip transmission lines 5313a,b,c, according to at least one aspect of the present disclosure. The ceramic filter can be configured with 0 to 6 assigned transmission zeros at the desired frequencies. As shown in FIG. 53, one inductor 5304a is added to a first quarter-wave TEM ceramic shunt short stub 5315a, a capacitor 5306a is added to a second TEM ceramic shunt short stub 5315b, and an inductor 5304b and a capacitor 5306b are added to a third quarter-wave TEM ceramic shunt short stub 5315c. Coupling between the transmission lines 5316a,b,c can be inductive or capacitive in various forms as discussed hereinbelow such as chips, printed, single-layer, multilayers, coils, suspended, etc. As shown in FIG. 53, coupling between the transmission lines 5313a,b,c may be capacitive, realized by the fringing field through the gaps 5316a,b between the respective microstrip transmission lines 5313a,b,c.

Figure 54:
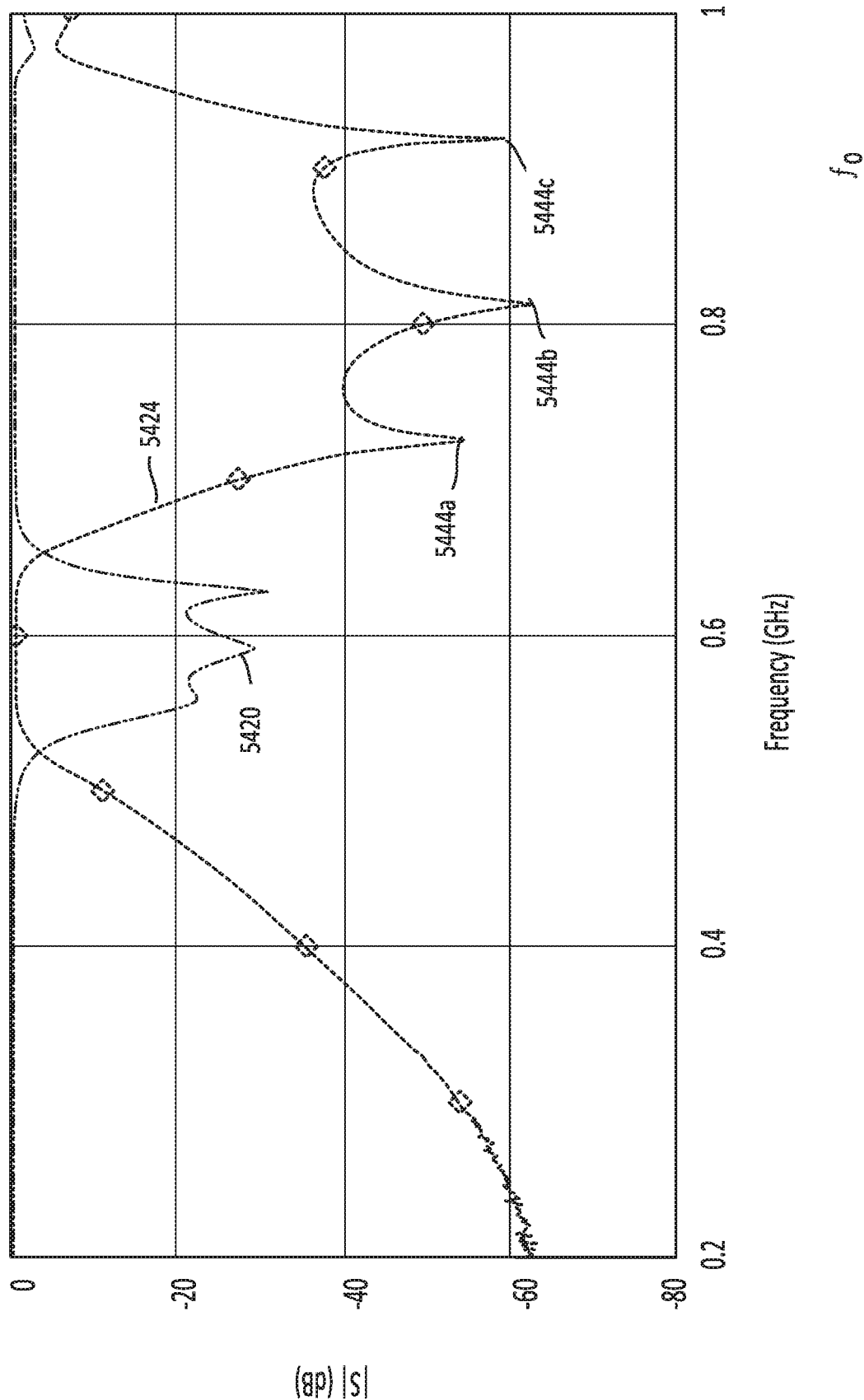
FIG. 54 illustrates a frequency response of the ceramic filter comprising three TEM resonators with three added inductors to the three quarter-wave TEM ceramic shunt short stubs as shown in FIG. 50, according to at least one aspect of the present disclosure.

The following description relates to performance data of the 3-section ceramic filter configured with three inductors, three capacitors, and three inductors and three capacitors, according to various aspects of the present disclosure. FIG. 54 illustrates a frequency response of the ceramic filter 5000 comprising three TEM resonators 5015a,b,c with three added inductors 5004a,b,c to the three quarter-wave TEM ceramic shunt short stubs 5015a,b,c as shown in FIG. 50, according to at least one aspect of the present disclosure. The S(1,1) input port voltage reflection coefficient is depicted as curve 5420 and the S(2,1) forward voltage gain is depicted as curve 5424. As depicted in FIG. 54, three transmission zeros 5444a,b,c above the passband are illustrated.

Figure 55:
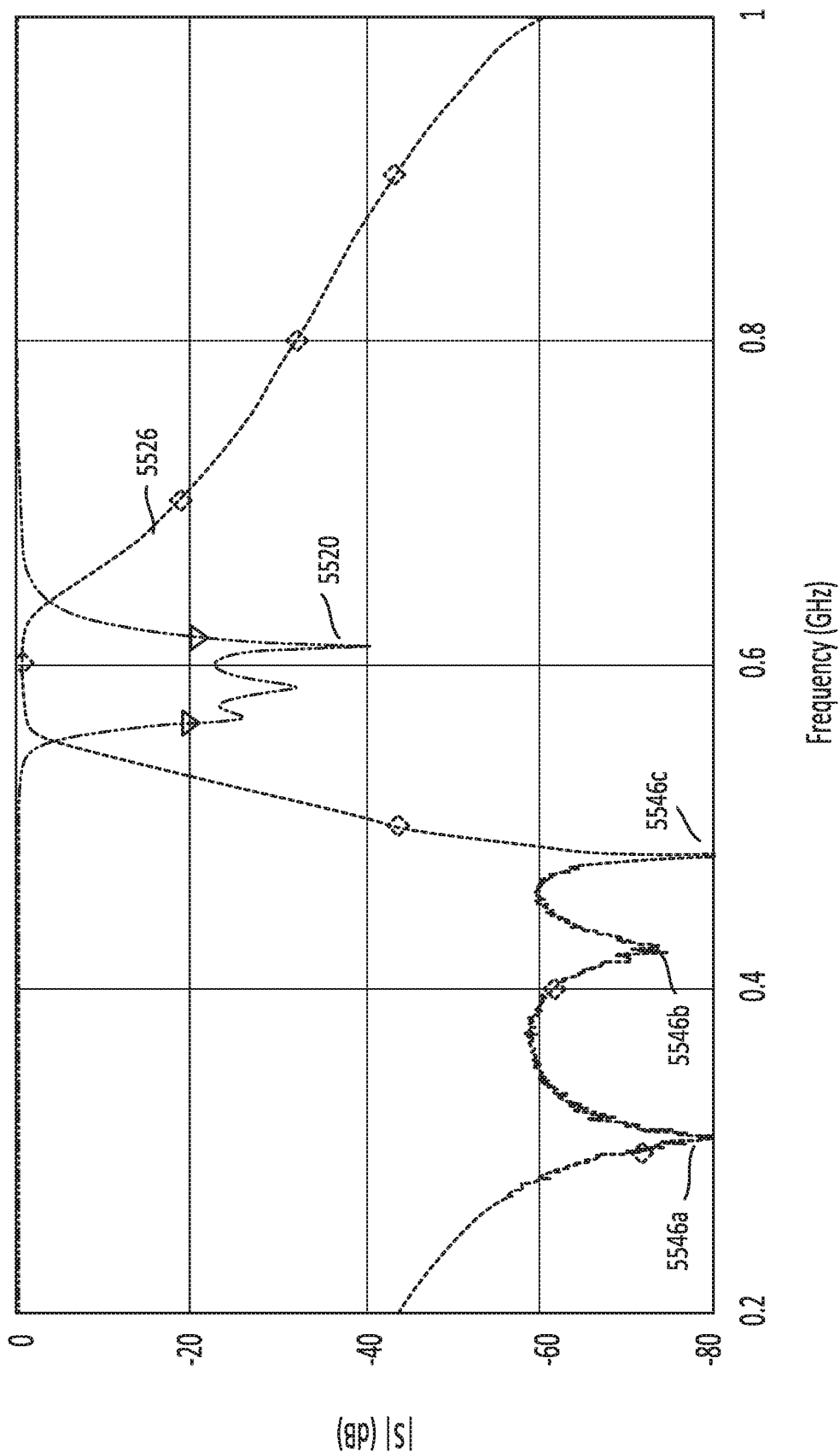
FIG. 55 illustrates a frequency response of the ceramic filter comprising three TEM resonators with three added capacitors to the three quarter-wave TEM ceramic shunt short stubs as shown in FIG. 51, according to at least one aspect of the present disclosure.

FIG. 55 illustrates a frequency response of the ceramic filter 5100 comprising three TEM resonators 5115a,b,c with three added capacitors 5106a,b,c to the three quarter-wave TEM ceramic shunt short stubs 5115a,b,c as shown in FIG. 51, according to at least one aspect of the present disclosure. The S(1,1) input port voltage reflection coefficient is depicted as curve 5520 and the S(2,1) forward voltage gain is depicted as curve 5526. As depicted in FIG. 55, three transmission zeros 5546a,b,c below the passband are illustrated.

Figure 56:
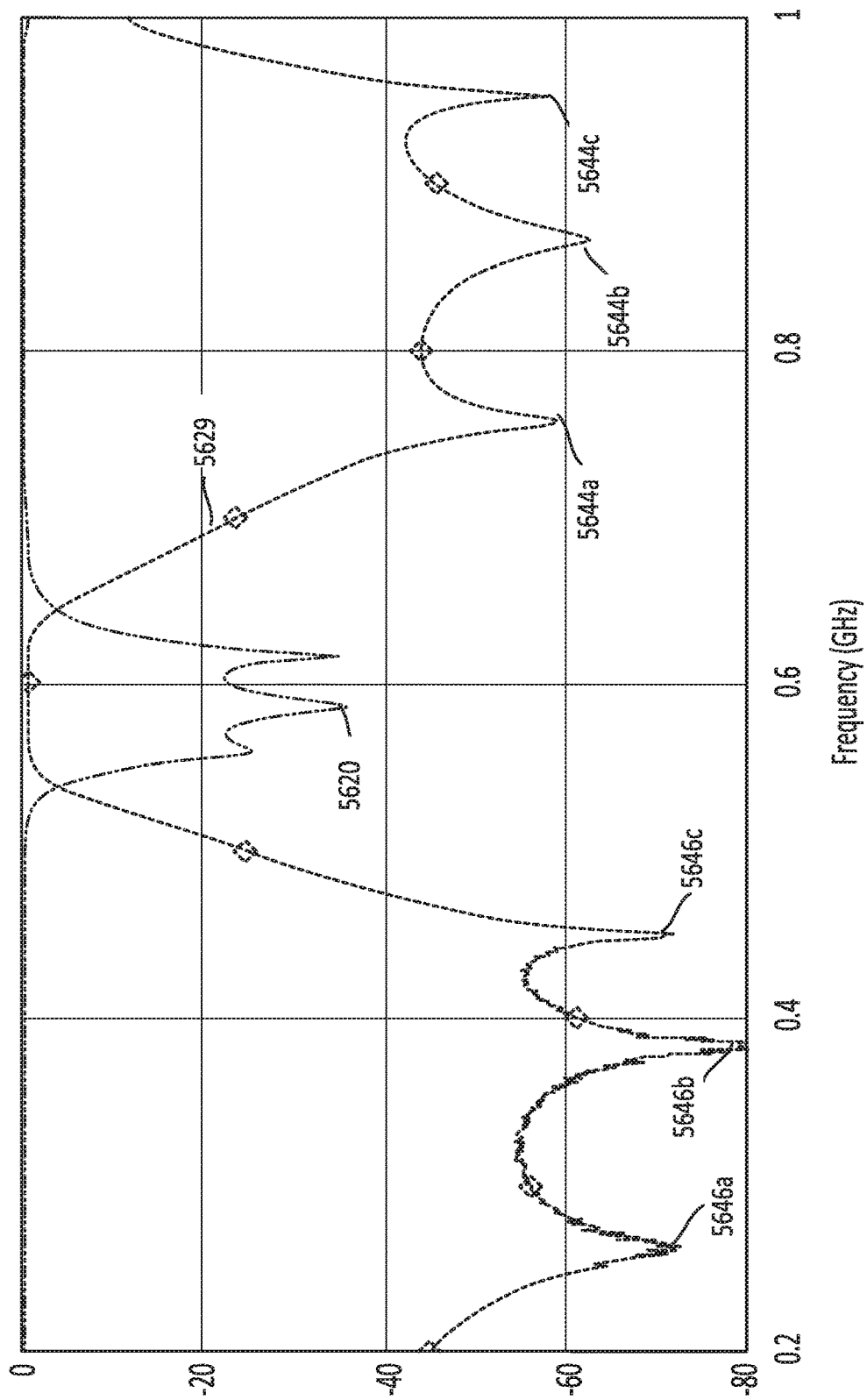
FIG. 56 illustrates a frequency response of the ceramic filter comprising three TEM resonators with three added inductors and three added capacitors to the three quarter-wave TEM ceramic shunt short stubs as shown in FIG. 52, according to at least one aspect of the present disclosure.

FIG. 56 illustrates a frequency response of the ceramic filter 5200 comprising three TEM resonators 5215a,b,c with three added inductors 5204a,b,c each in series with one of three added capacitors 5206a,b,c to the three quarter-wave TEM ceramic shunt short stubs 5215a,b,c as shown in FIG. 52, according to at least one aspect of the present disclosure. The S(1,1) input port voltage reflection coefficient is depicted as curve 5620 and the S(2,1) forward voltage gain is depicted as curve 5629. As depicted in FIG. 56, three transmission zeros 5644a,b,c above the passband are due to the inductors 5204a,b,c and three transmission zeros 5646a,b,c below the passband due to the capacitors are illustrated.

A novel design concept has been disclosed that demonstrated for significant improvement in filter performance. By adding inductor and/or capacitor to a quarter-wave resonator, each resonator can produce two transmission zeros near the passband; one above and one below the band center. Type of filters benefited are the bandpass filters based on quarter-wave resonator design, including ceramic resonators (TEM), and printed (microstrip or suspended stripline) interdigital filters. The novel design out-performs all known current similar technologies: smaller size, fewer resonators needed (lower cost and shorter schedule), lighter in weight, lower insertion loss, higher rejection near the passband, and the simplicity of the design process.

While several forms have been illustrated and described, it is not the intention of the applicant to restrict or limit the scope of the appended claims to such detail. Numerous modifications, variations, changes, substitutions, combinations, and equivalents to those forms may be implemented and will occur to those skilled in the art without departing from the scope of the present disclosure. Moreover, the structure of each element associated with the described forms can be alternatively described as a means for providing the function performed by the element.

Also, where materials are disclosed for certain components, other materials may be used. It is therefore to be understood that the foregoing description and the appended claims are intended to cover all such modifications, combinations, and variations as falling within the scope of the disclosed forms. The appended claims are intended to cover all such modifications, variations, changes, substitutions, modifications, and equivalents.

Those skilled in the art will recognize that, in general, terms used herein, and especially in the appended claims (e.g., bodies of the appended claims), are generally intended as "open" terms (e.g., the term "including" should be interpreted as "including, but not limited to"; the term "having" should be interpreted as "having at least"; the term "includes" should be interpreted as "includes, but is not limited to"). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations or two or more recitations). Furthermore, in those instances where a convention analogous to "at least one of A, B, and C, etc." is used, in general, such a construction is intended in the sense that one having skill in the art would understand the convention (e.g., "a system having at least one of A, B, and C" would include, but not be limited to, systems that have A alone, B alone, C alone, A and B together, A and C together, B and C together, and/or A, B, and C together). In those instances where a convention analogous to "at least one of A, B, or C, etc." is used, in general, such a construction is intended in the sense that one having skill in the art would understand the convention (e.g., "a system having at least one of A, B, or C" would include, but not be limited to, systems that have A alone, B alone, C alone, A and B together, A and C together, B and C together, and/or A, B, and C together). It will be further understood by those within the art that typically a disjunctive word and/or phrase presenting two or more alternative terms, whether in the description, claims, or drawings, should be understood to contemplate the possibilities of including one of the terms, either of the terms, or both terms, unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flow diagrams are presented in a sequence(s), it should be understood that the various operations may be performed in other orders than those which are illustrated or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

It is worthy to note that any reference to "one aspect," "an aspect," "an exemplification," "one exemplification," and the like means that a particular feature, structure, or characteristic described in connection with the aspect is included in at least one aspect. Thus, appearances of the phrases "in one aspect," "in an aspect," "in an exemplification," and "in one exemplification" in various places throughout the specification are not necessarily all referring to the same aspect. Furthermore, the particular features, structures, or characteristics may be combined in any suitable manner in one or more aspects.

In summary, numerous benefits have been described which result from employing the concepts described herein. The foregoing description of the one or more forms has been presented for purposes of illustration and description. It is not intended to be exhaustive or limiting to the precise form disclosed. Modifications or variations are possible in light of the above teachings. The one or more forms were chosen and described in order to illustrate principles and practical application to thereby enable one of ordinary skill in the art to utilize the various forms and with various modifications as are suited to the particular use contemplated. It is intended that the claims submitted herewith define the overall scope.

The invention claimed is:

1. A filter circuit, comprising:
a transmission line having an input and an output;
a quarter wave resonator; and
at least one electrical component coupled in series with the quarter wave resonator at a first end and electrically coupled to the transmission line at a second end,
wherein the quarter wave resonator has an electrical length of 90° at a defined frequency $f_0$,
wherein the at least one electrical component is defined by a frequency dependent impedance, and
wherein the at least one electrical component comprises a capacitor and an inductor coupled in series.

2. The filter circuit of claim 1, wherein the filter circuit comprises a microstrip filter.

3. The filter circuit of claim 1, wherein the inductor comprises one of a toroid, a coil of wire across a small trace gap, a meander line, or a high impedance line.

4. The filter circuit of claim 1, wherein the filter circuit comprises a stripline filter.

5. The filter circuit of claim 1, wherein the capacitor comprises one of a single-layer surface mounted chip capacitor, a multi-layer surface mounted chip capacitor, a printed interdigital capacitor, or a printed trace gap capacitor.

6. The filter circuit of claim 1, wherein the quarter wave resonator comprises a quarter-wave shunt short stub or a quarter wave ceramic TEM resonator.

7. A filter circuit, comprising:
a transmission line having an input and an output; and
a plurality of shunt branches, wherein each of the plurality of shunt branches comprises:
 a quarter wave resonator; and
 at least one electrical component coupled in series with the quarter wave resonator at a first end and electrically coupled to the transmission line at a second end,
wherein the plurality of shunt branches are coupled to the transmission line in a mutually parallel topology,
wherein the quarter wave resonator of each of the plurality of shunt branches has an electrical length of 90° at a defined frequency $f_0$, and
the at least one electrical component of each of the plurality of shunt branches comprises a capacitor and an inductor coupled in series.

8. The filter circuit of claim 7, wherein the plurality of shunt branches comprises N shunt branches, wherein N is a finite integer greater than 1, and the filter circuit is defined by a forward voltage gain having at most 2N transmission zeros within a frequency range that at least comprises $f_0$.

9. A filter circuit, comprising:
a transmission line having an input and an output;
a first quarter wave resonator and a second quarter wave resonator; and
at least a first electrical component coupled in series with the first quarter wave resonator at a first end and electrically coupled to the transmission line at a second end and at least a second electrical component coupled in series with the second quarter wave resonator at a first end and electrically coupled to the transmission line at a second end,
wherein the at least first electrical component is coupled to the transmission line in parallel to the at least second electrical component,
wherein the first quarter wave resonator has an electrical length of 90° at a defined frequency $f_0$, and the second quarter wave resonator has an electrical length of 90° at the defined frequency $f_0$,
wherein the at least first electrical component is defined by a first frequency dependent impedance and the at least second electrical component is defined by a second frequency dependent impedance, and
wherein the at least first electrical component comprises a first inductor coupled in series to a first capacitor and the at least second electrical component comprises a second inductor coupled in series to a second capacitor.

10. The filter circuit of claim 9, wherein the at least first electrical component differs from the at least second electrical component.

11. The filter circuit of claim 9, wherein the first capacitor has a first capacitance and the second capacitor has a second capacitance, and the first capacitance differs from the second capacitance.

12. The filter circuit of claim 9, wherein the first inductor has a first inductance and the second inductor has a second inductance, and the first inductance equals the second inductance.

13. The filter circuit of claim 9, wherein the first inductor has a first inductance and the second inductor has a second inductance, and the first inductance differs from the second inductance.

14. The filter circuit of claim 9, wherein the first capacitor has a first capacitance and the second capacitor has a second capacitance, and the first capacitance equals the second capacitance.

\* \* \* \* \*